US012586986B2

(12) United States Patent
Hayashi et al.

(10) Patent No.: US 12,586,986 B2
(45) Date of Patent: Mar. 24, 2026

(54) LIGHT-EMITTING DEVICE

(71) Applicant: SONY GROUP CORPORATION, Tokyo (JP)

(72) Inventors: Kentaro Hayashi, Tokyo (JP); Tatsushi Hamaguchi, Tokyo (JP); Masamichi Ito, Kumamoto (JP); Rintaro Koda, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 599 days.

(21) Appl. No.: 18/001,726

(22) PCT Filed: Jun. 3, 2021

(86) PCT No.: PCT/JP2021/021278
§ 371 (c)(1),
(2) Date: Dec. 14, 2022

(87) PCT Pub. No.: WO2021/261207
PCT Pub. Date: Dec. 30, 2021

(65) Prior Publication Data
US 2023/0335974 A1     Oct. 19, 2023

(30) Foreign Application Priority Data
Jun. 25, 2020    (JP) ................................. 2020-109749

(51) Int. Cl.
*H01S 5/183*          (2006.01)
*H01S 5/42*           (2006.01)
(52) U.S. Cl.
CPC ...... *H01S 5/18361* (2013.01); *H01S 5/18388* (2013.01); *H01S 5/423* (2013.01)
(58) Field of Classification Search
CPC ............. H01S 5/18361; H01S 5/18386; H01S 5/18388; H01S 5/423
See application file for complete search history.

(56) References Cited

U.S. PATENT DOCUMENTS

2005/0169336 A1*   8/2005  Ishii ..................... H01S 5/18313
                                                      372/50.1
2011/0304682 A1*  12/2011  Irinoda ............... H01S 5/04254
                                                      372/44.01
(Continued)

FOREIGN PATENT DOCUMENTS

EP          3633807 A1    12/2021
JP          H0575207 A     3/1993
(Continued)

OTHER PUBLICATIONS

Translation of JP 2000-114656 A.*
(Continued)

*Primary Examiner* — James A Menefee
(74) *Attorney, Agent, or Firm* — CHIP LAW GROUP

(57) ABSTRACT

A light-emitting device includes: a light-emitting element array including a plurality of light-emitting elements arranged; and a dummy concave mirror section surrounding the light-emitting element array, and the light-emitting elements each include a stacked structure including a stack of a first compound semiconductor layer, an active layer, and a second compound semiconductor layer, a first light reflection layer formed on a base part surface, and a second light reflection layer. A first convex part is formed in a portion of the base part surface in which the first light reflection layer functioning as a concave mirror is formed, with respect to a second surface of the first compound semiconductor layer, and a second convex part is formed in a portion of an extending part of the base part surface in which the dummy concave mirror section is formed, with respect to the second surface of the first compound semiconductor layer.

15 Claims, 36 Drawing Sheets

(56) References Cited

U.S. PATENT DOCUMENTS

| 2013/0251408 A1* | 9/2013 | Hanaoka | H01S 5/423 |
| | | | 399/221 |
| 2019/0089128 A1* | 3/2019 | Lin | H01S 5/18369 |
| 2019/0267774 A1* | 8/2019 | Sato | H01S 5/34333 |
| 2020/0067278 A1* | 2/2020 | Han | H01S 5/18311 |
| 2023/0130341 A1* | 4/2023 | Kang | H01S 5/02345 |
| | | | 372/44.01 |

FOREIGN PATENT DOCUMENTS

| JP | 2000114656 A | * | 4/2000 | H01S 5/04256 |
| JP | 2002-237653 A | | 8/2002 | |
| JP | 2005303080 A | | 10/2005 | |
| JP | 2007-059673 A | | 3/2007 | |
| JP | 3965801 B2 | | 8/2007 | |
| JP | 2016-127175 A | | 7/2016 | |
| WO | 2018/083877 A1 | | 5/2018 | |
| WO | WO-2020075428 A1 | | 4/2020 | |

OTHER PUBLICATIONS

High power and good beam quality of two-dimensional VCSEL array with integrated GaAs microlens array References and links, IEEE J. Quantum Electron. IEEE J. Sel. Top. Quantum Electron. Appl. Opt. Microelectron. Eng. Opt. Express Appl. Phys. Lett. J.Electron. Mater. IEEE Photon. Technol. Lett. Opt. Rev, Jan. 1, 1988 (Jan. 1, 1988), pp. 1845-1855, XP055692305.
International Search Report and Written Opinion of PCT Application No. PCT/JP2021/021278, issued on Jul. 27, 2021, 09 pages of ISRWO.

* cited by examiner

[FIG. 1]
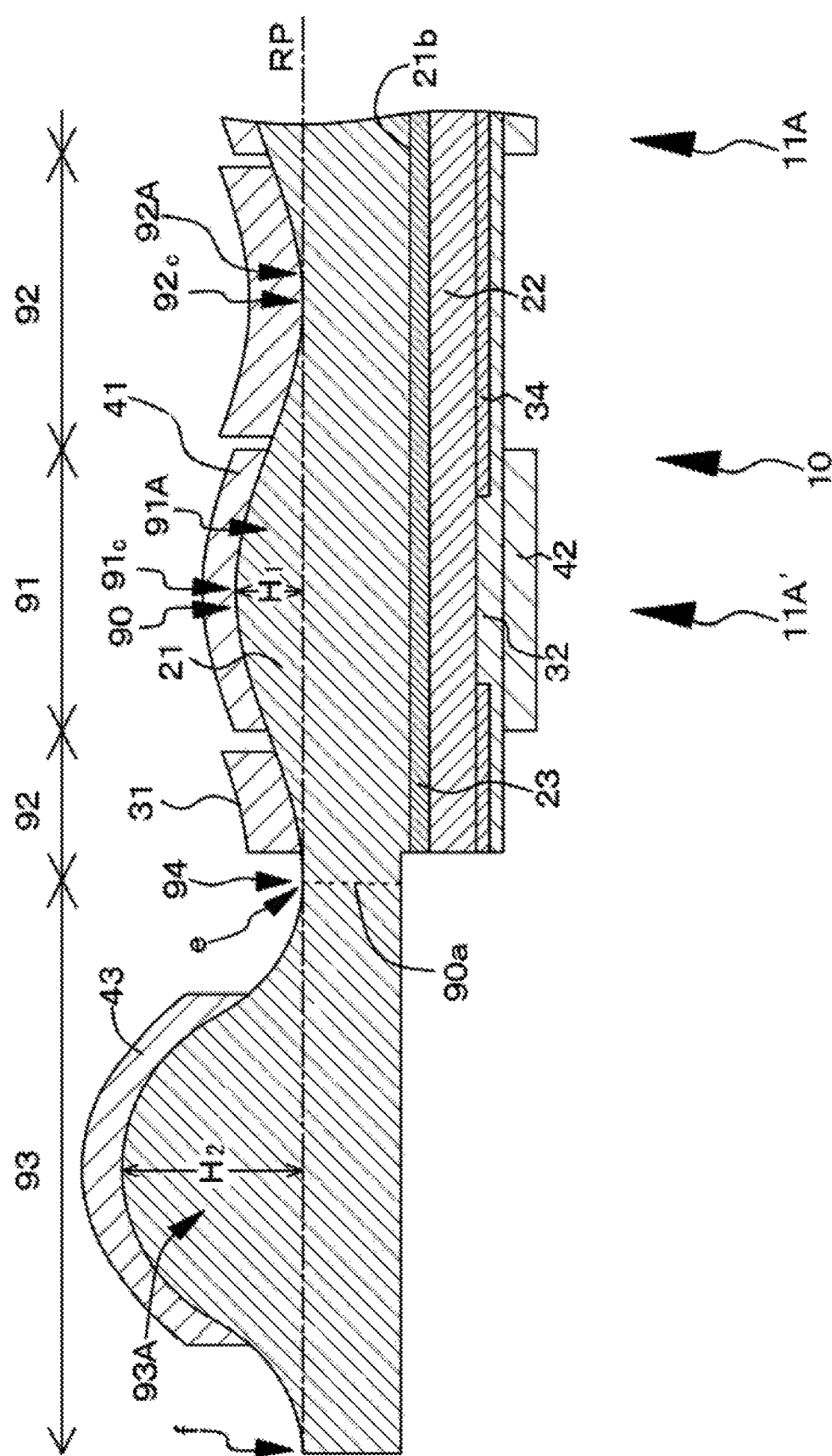

[FIG. 2]
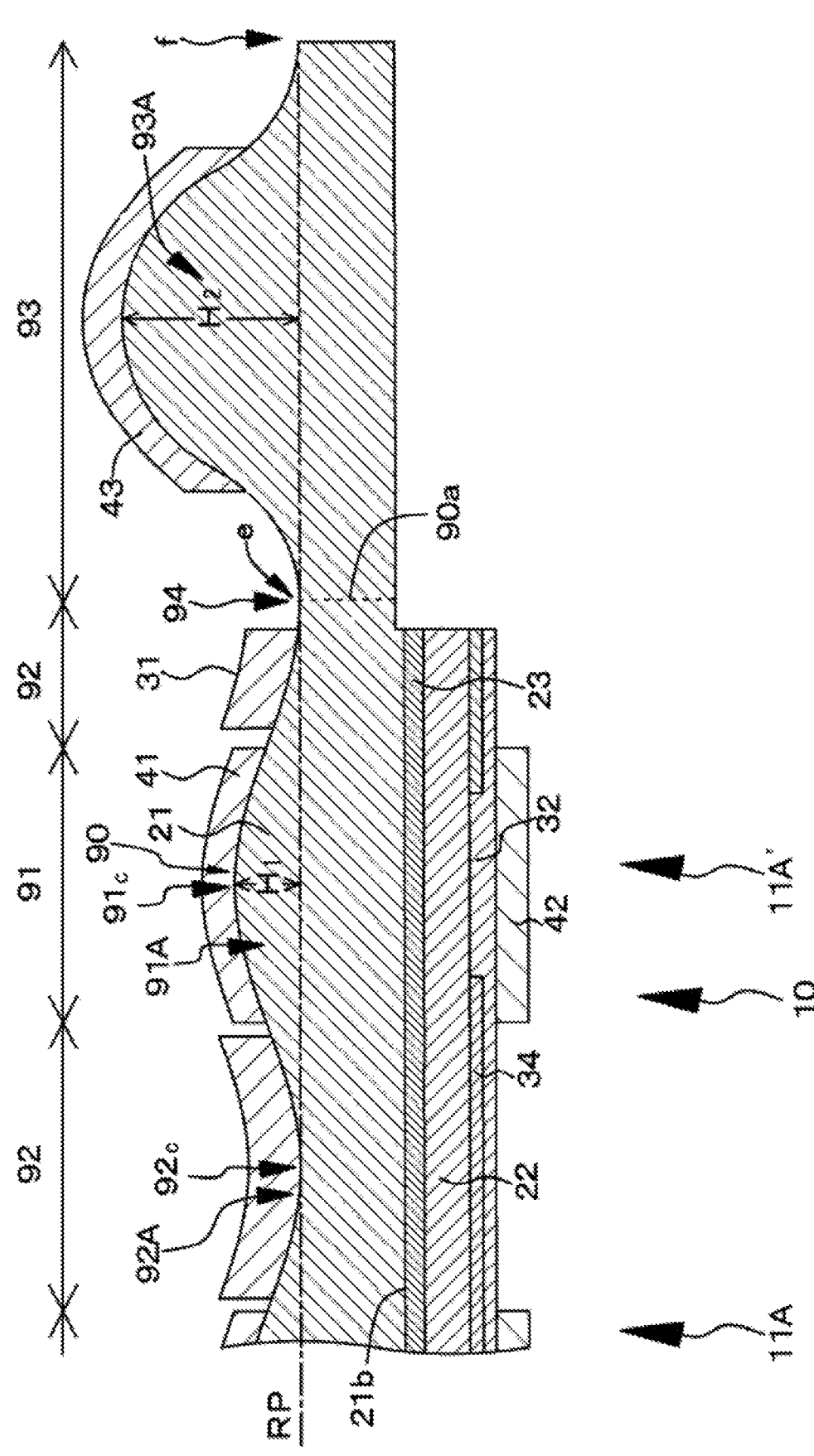

[FIG. 3]
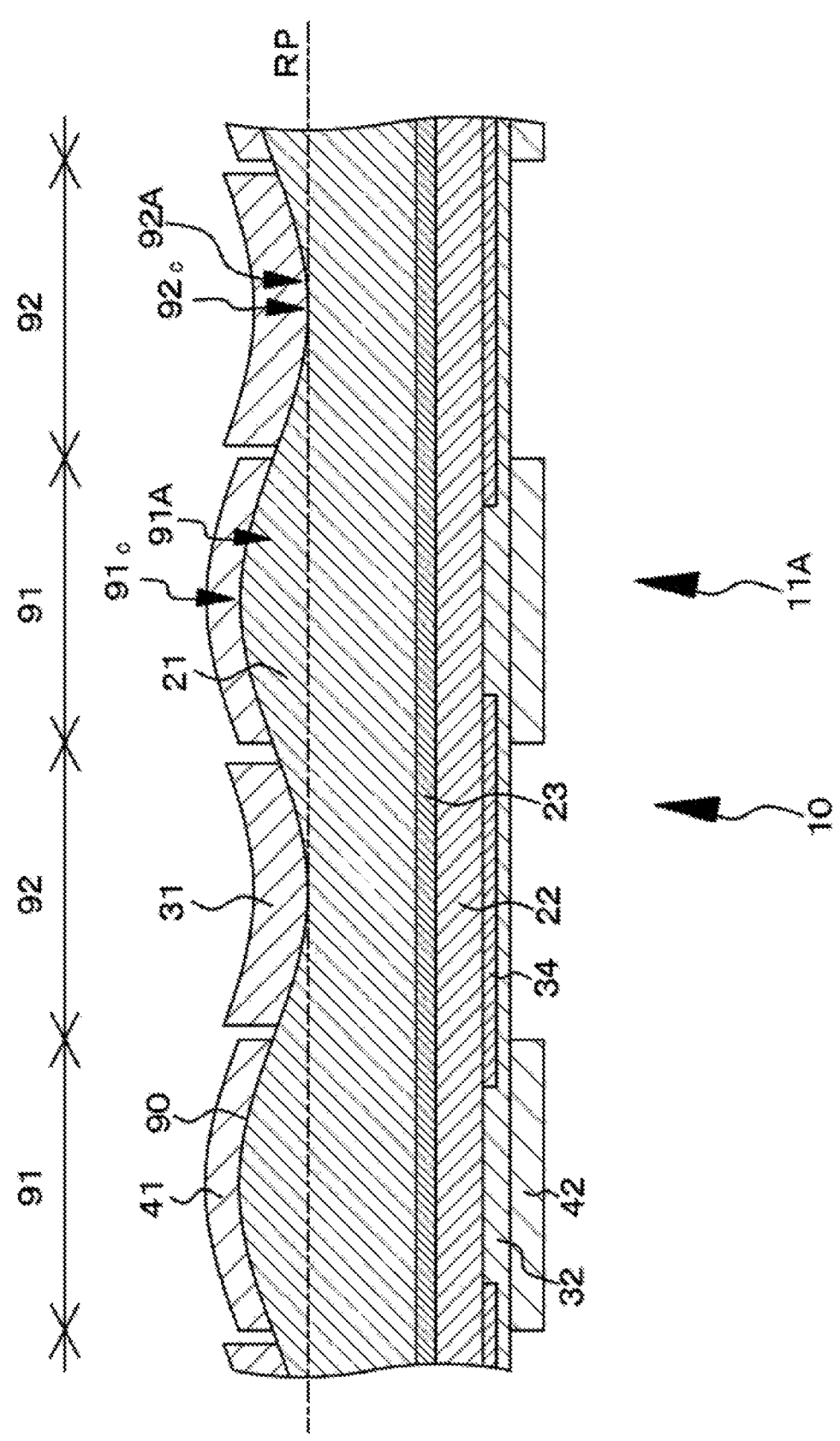

[FIG. 4]
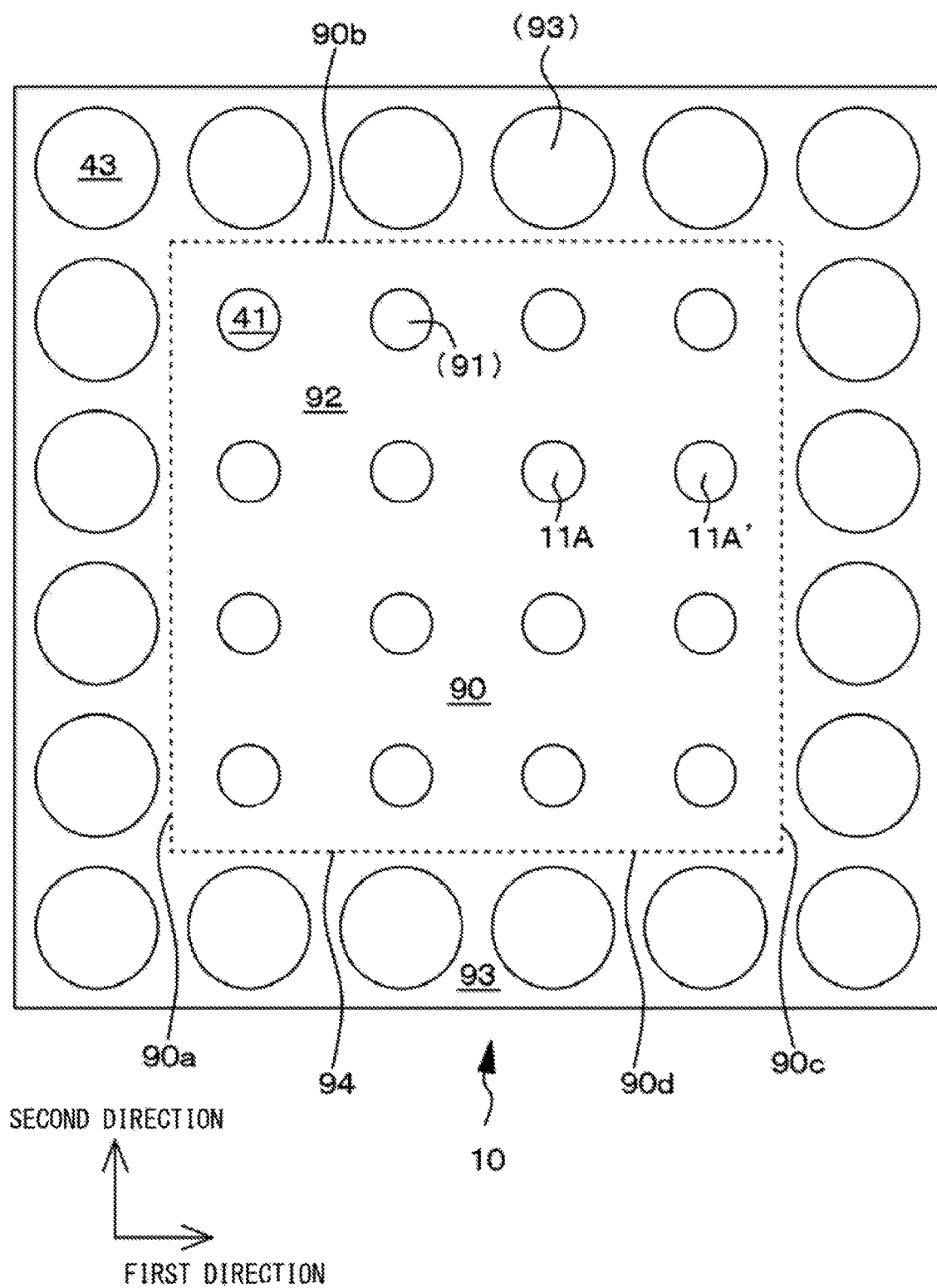

[FIG. 5]
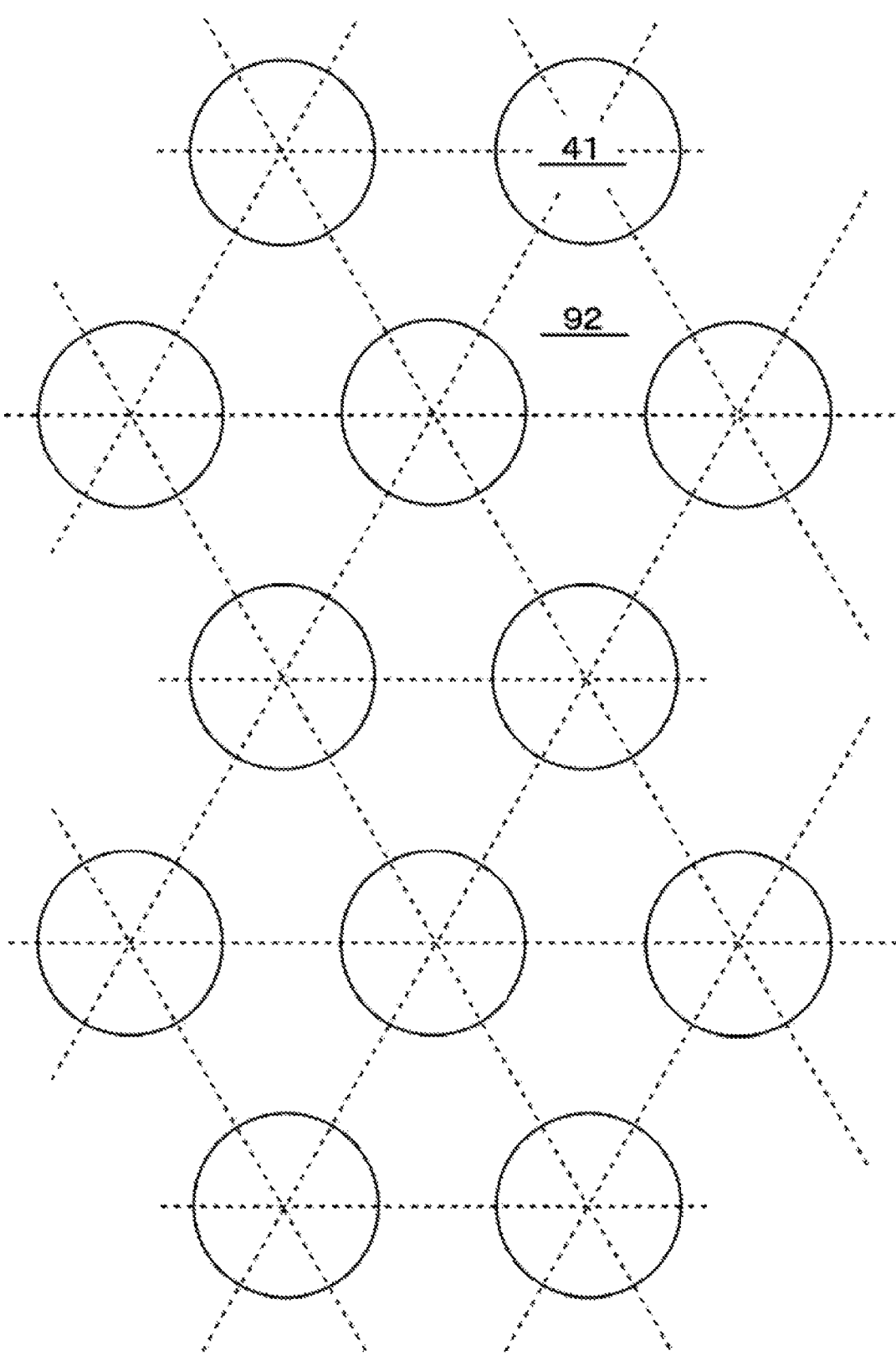

[FIG. 6]
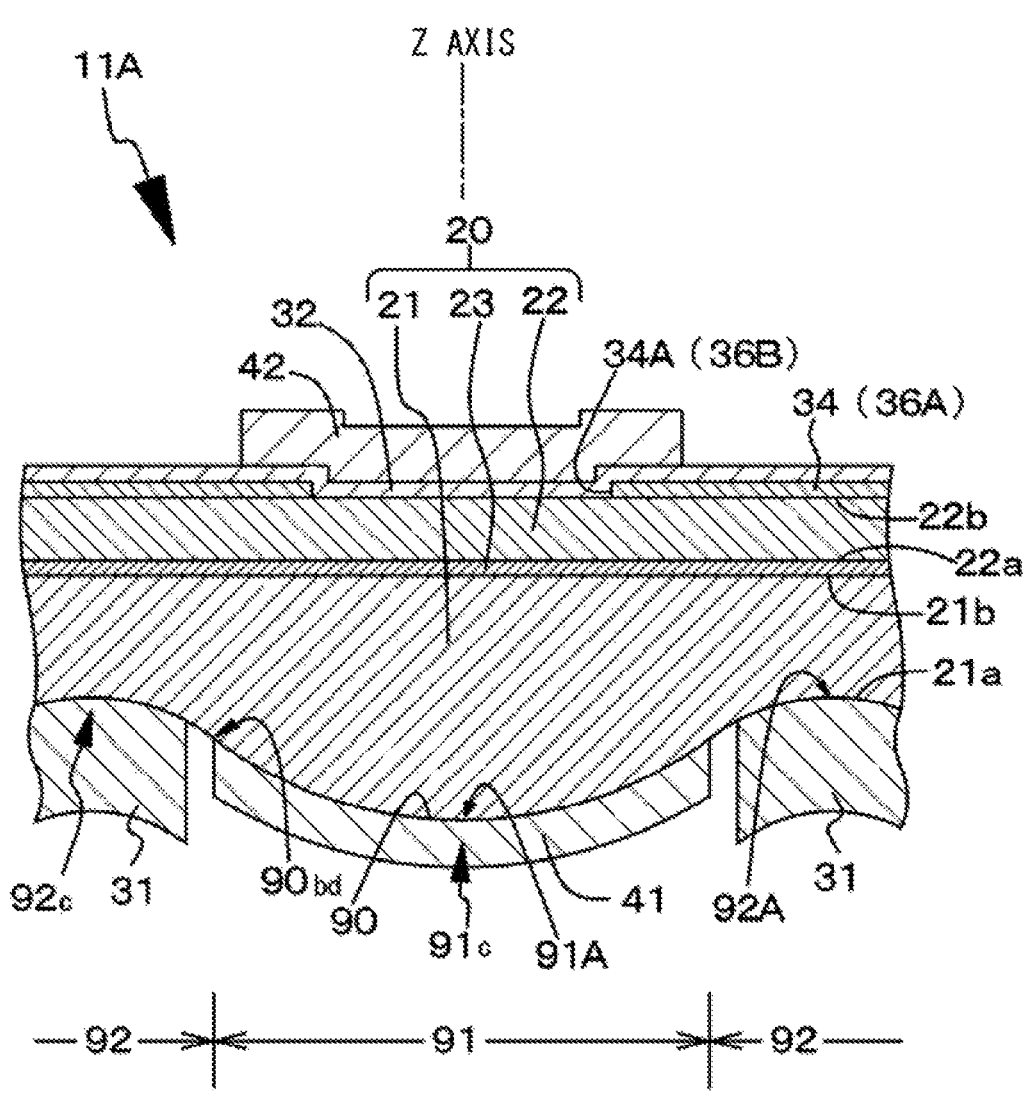

[FIG. 7]
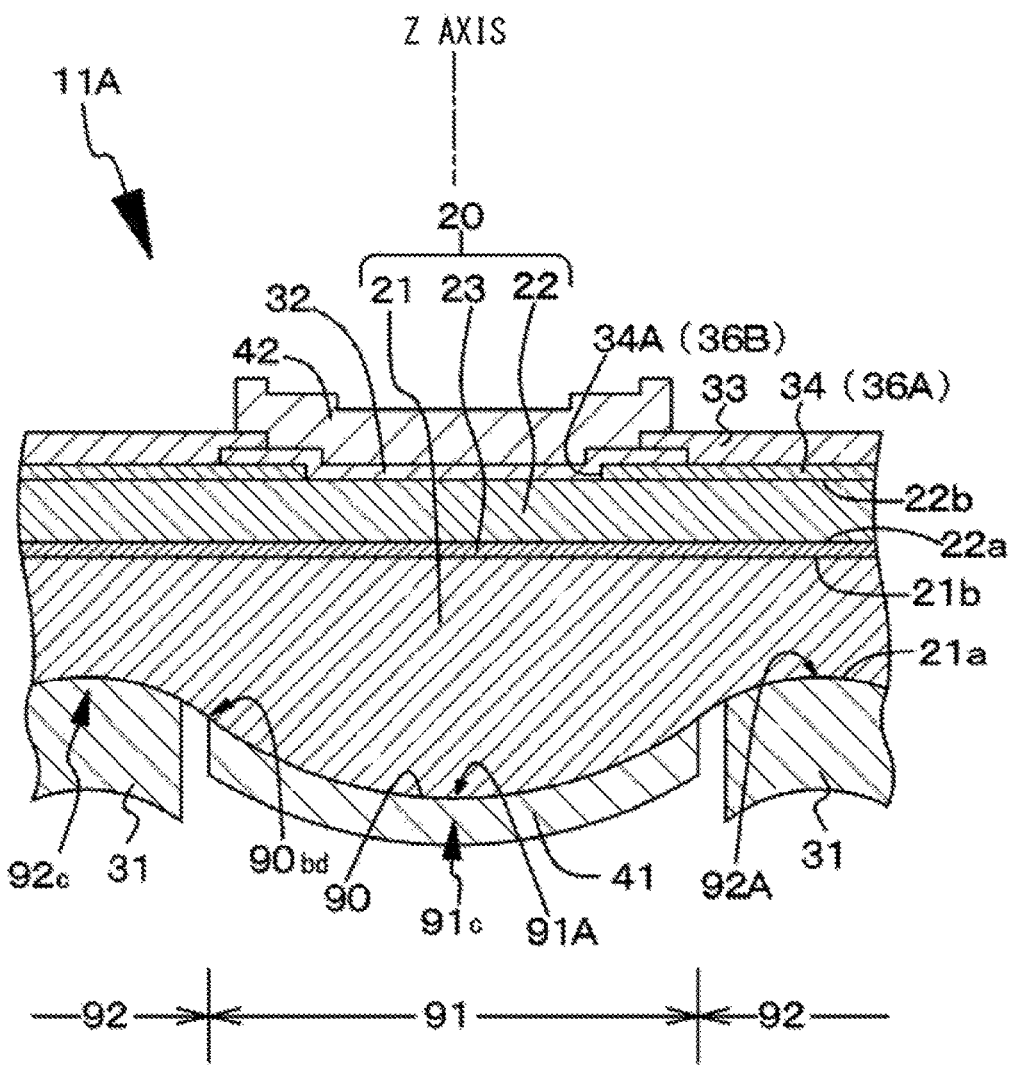

[FIG. 8]
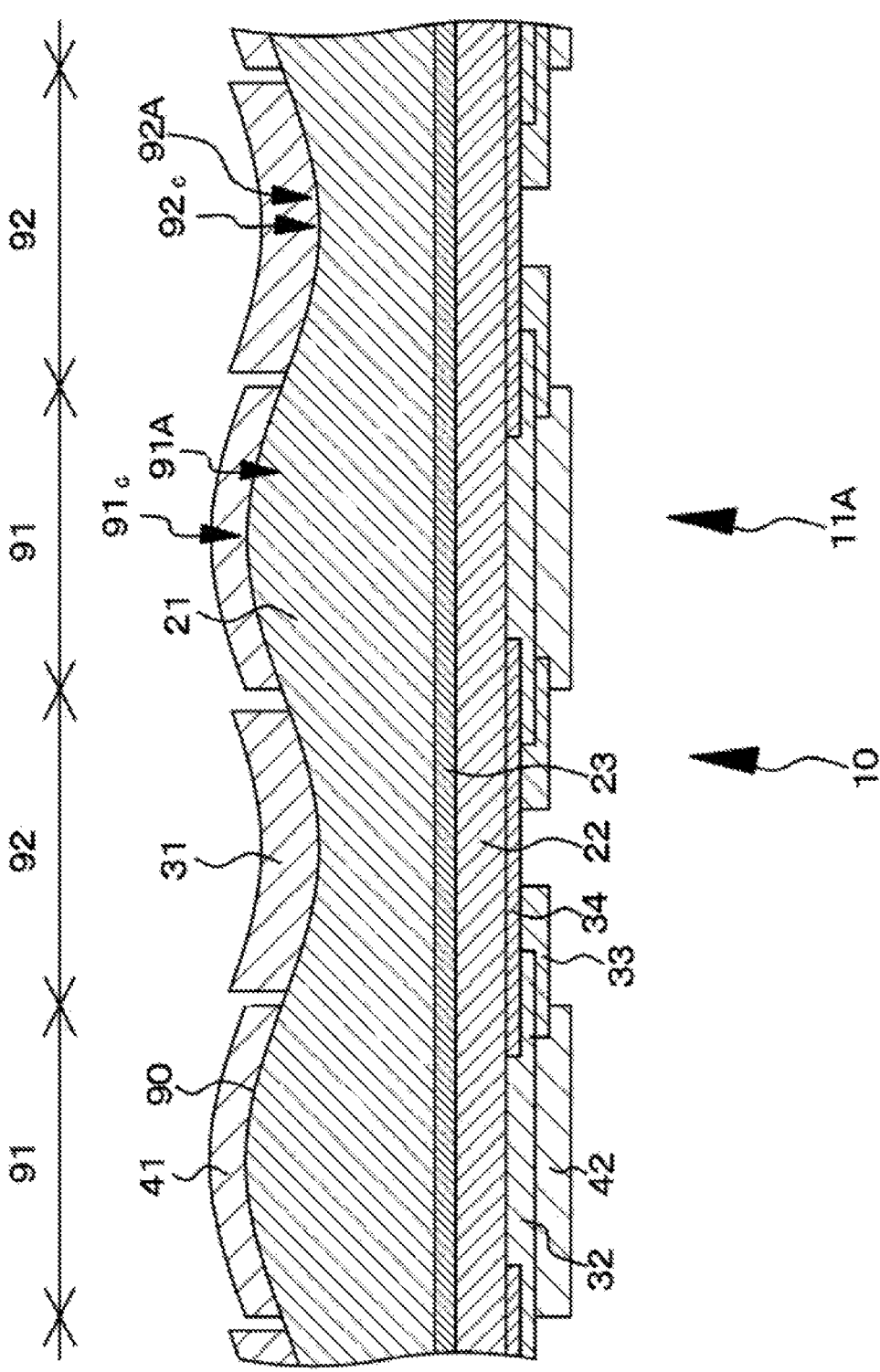

[FIG. 9]
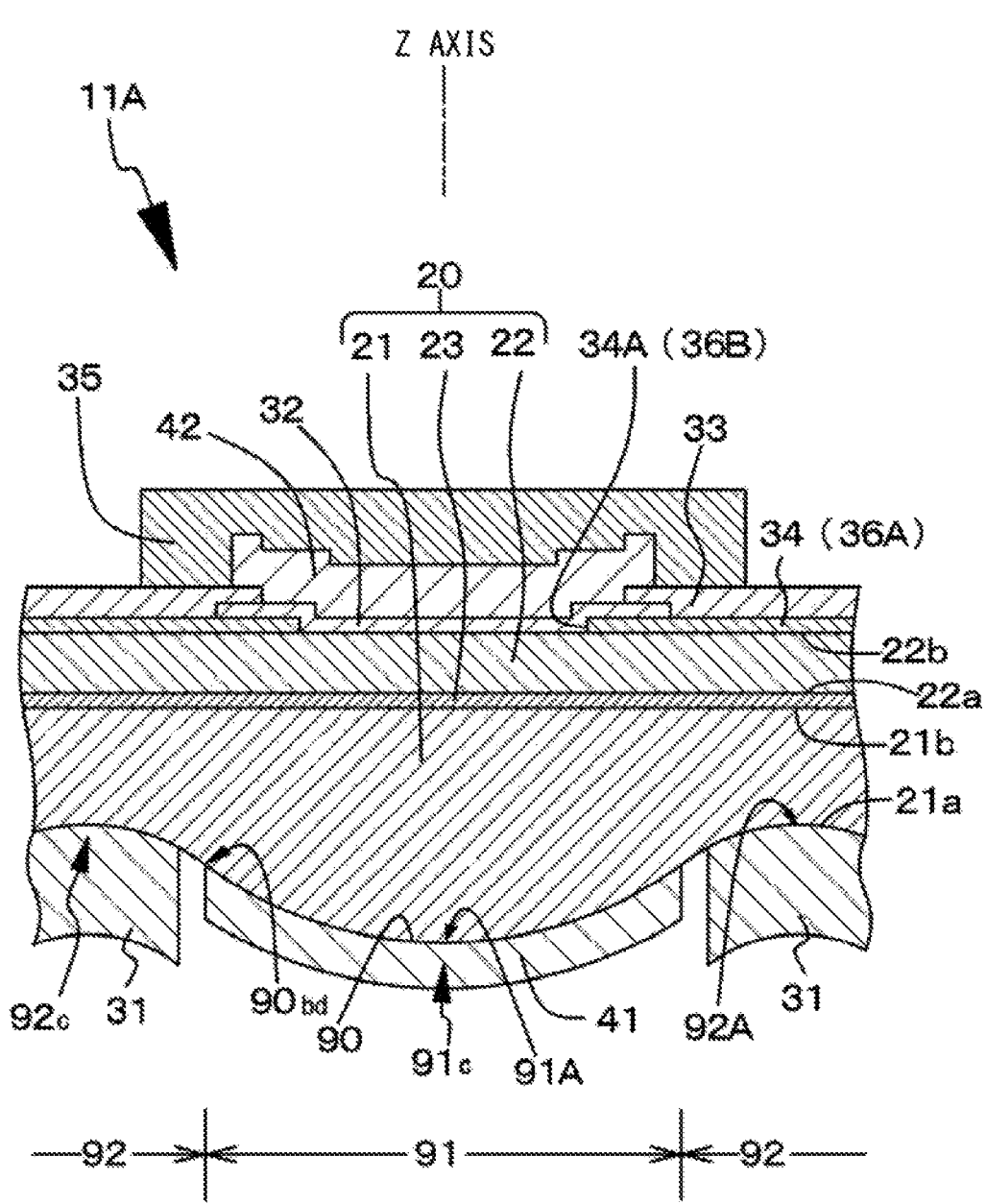

[FIG. 10]
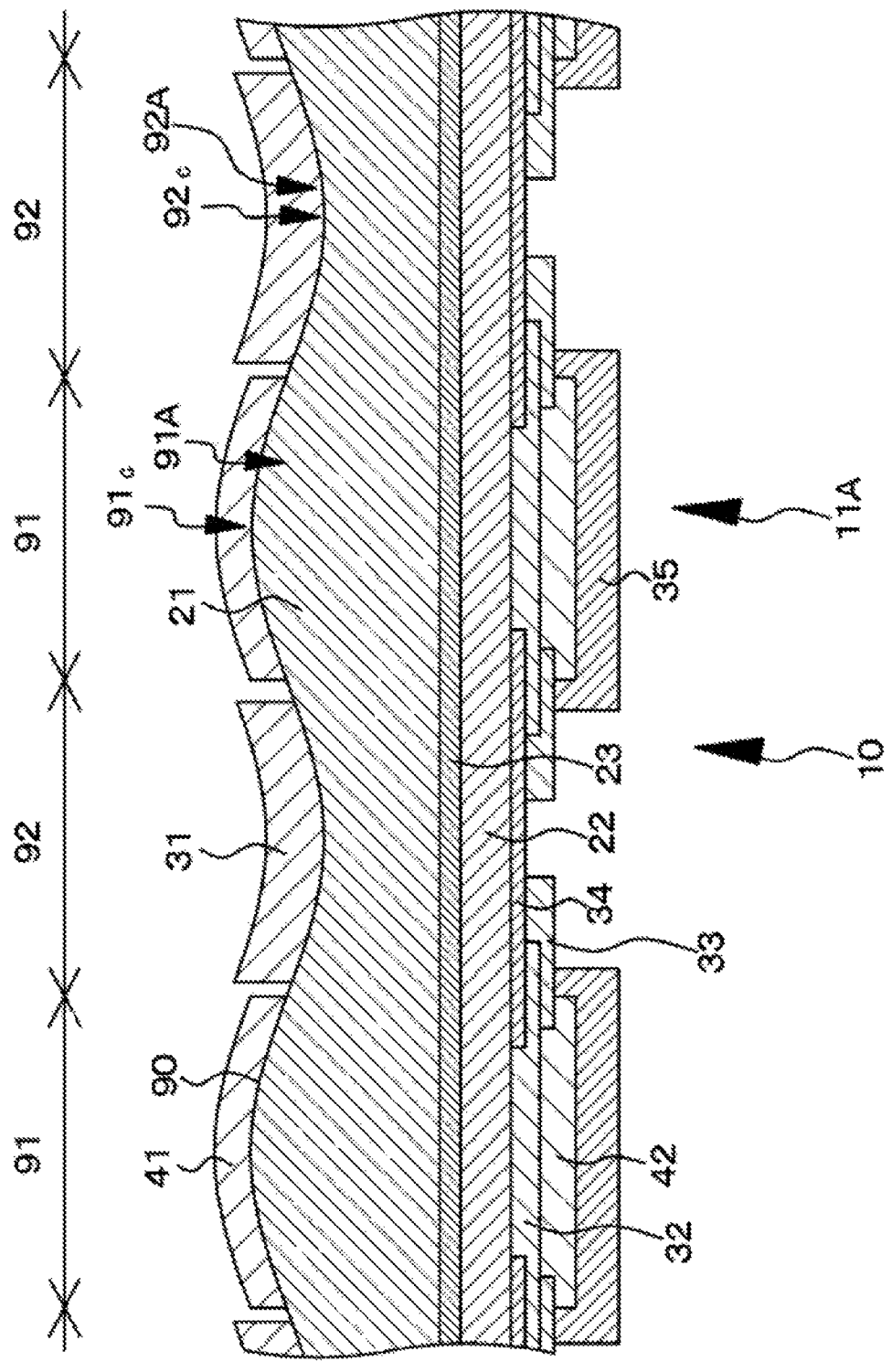

[FIG. 11A]
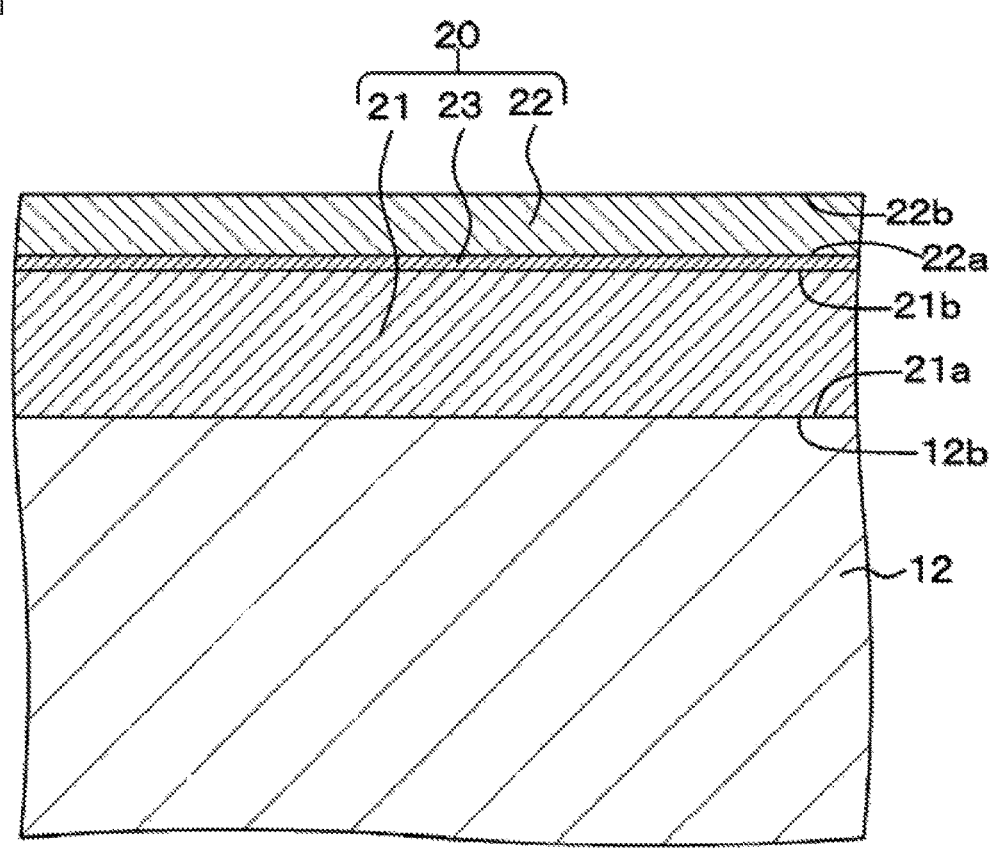
[FIG. 11B]
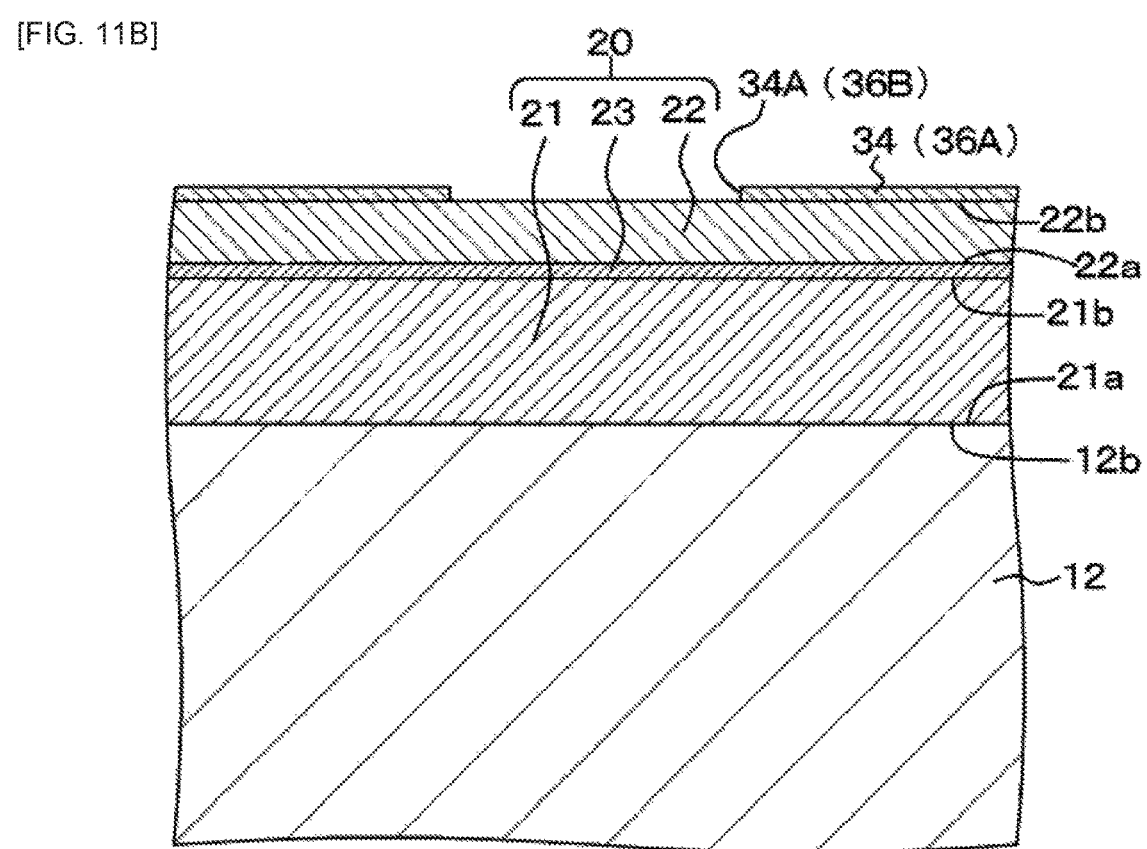

[FIG. 12]
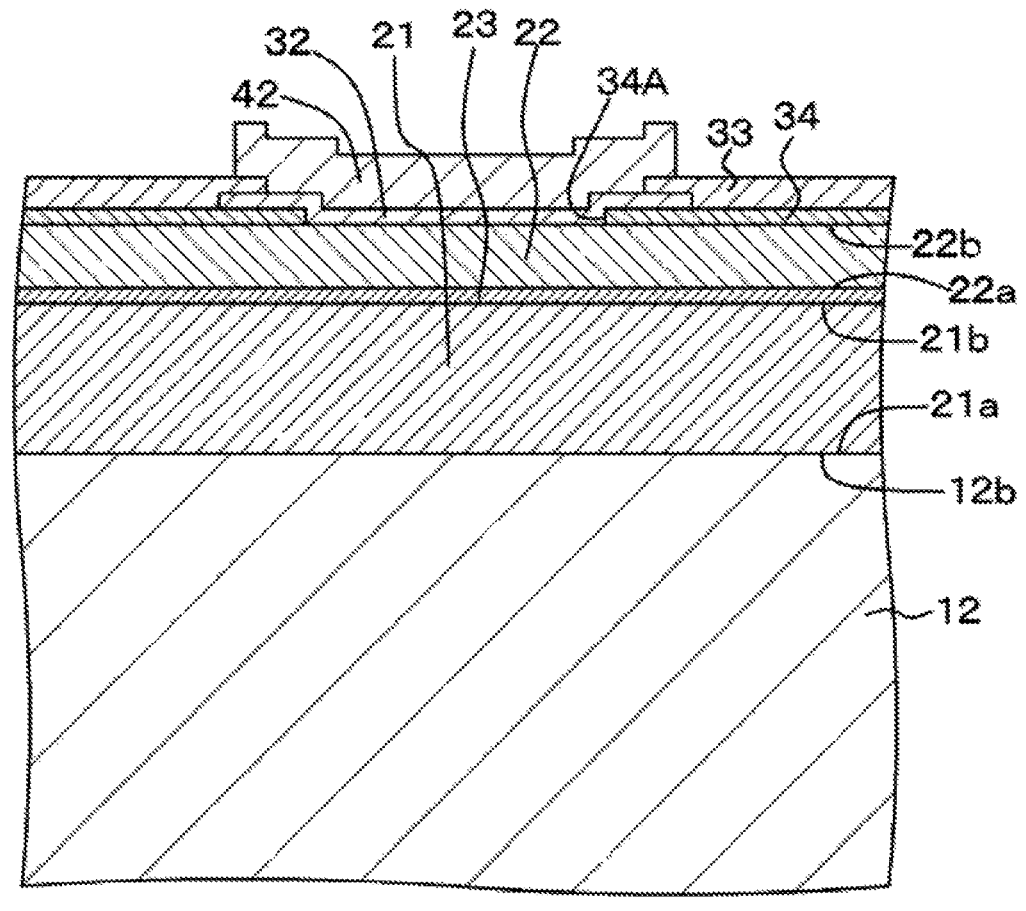

[FIG. 13]
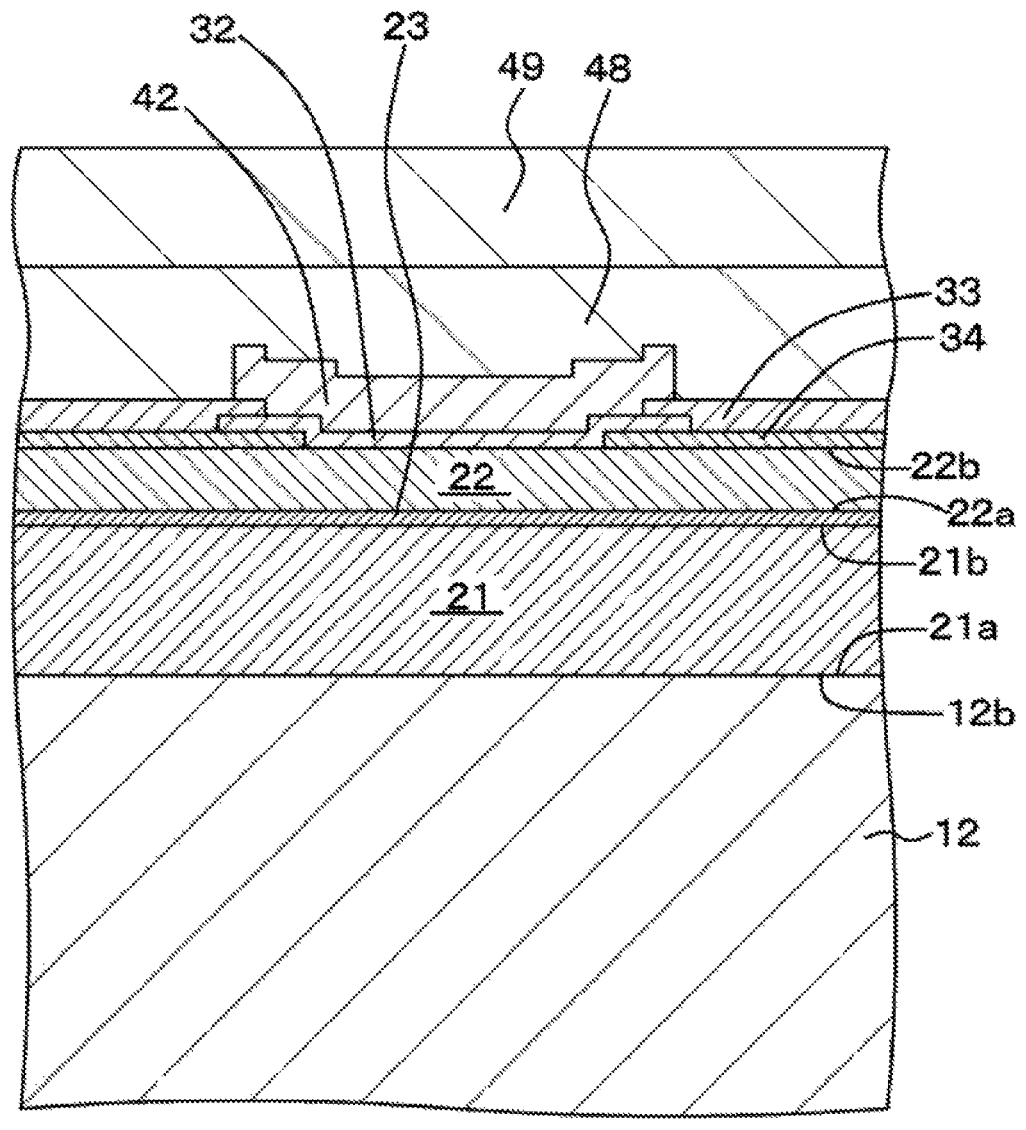

[FIG. 14A]
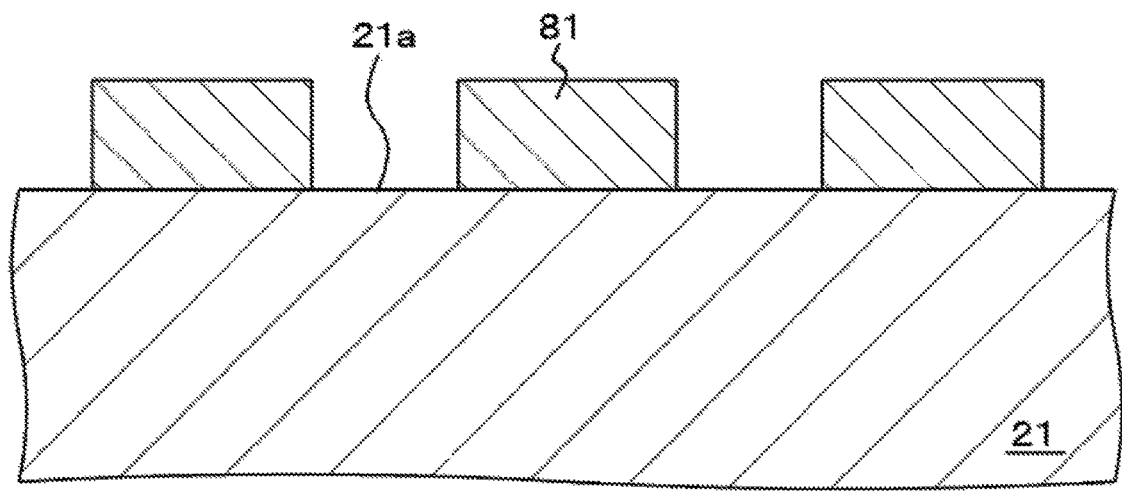
[FIG. 14B]
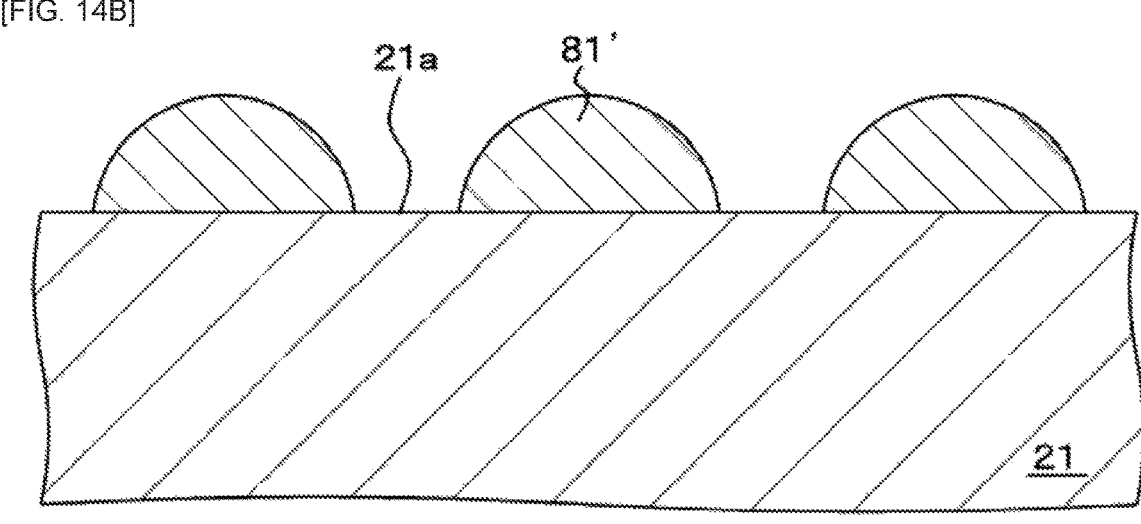

[FIG. 15A]
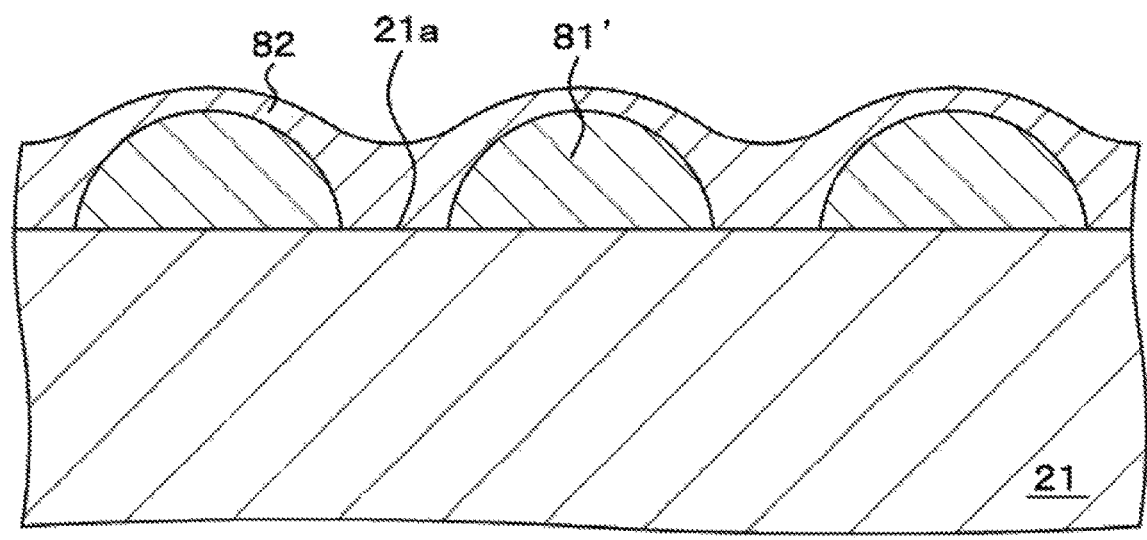
[FIG. 15B]
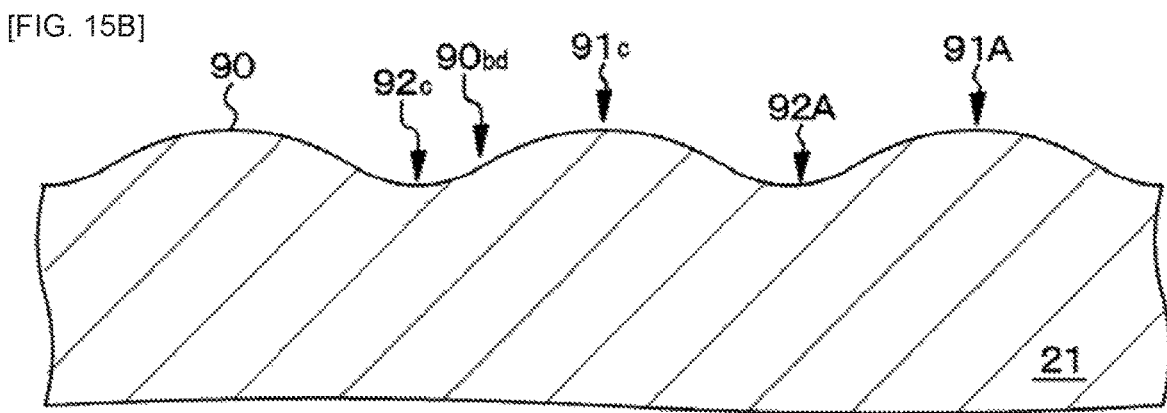
[FIG. 15C]
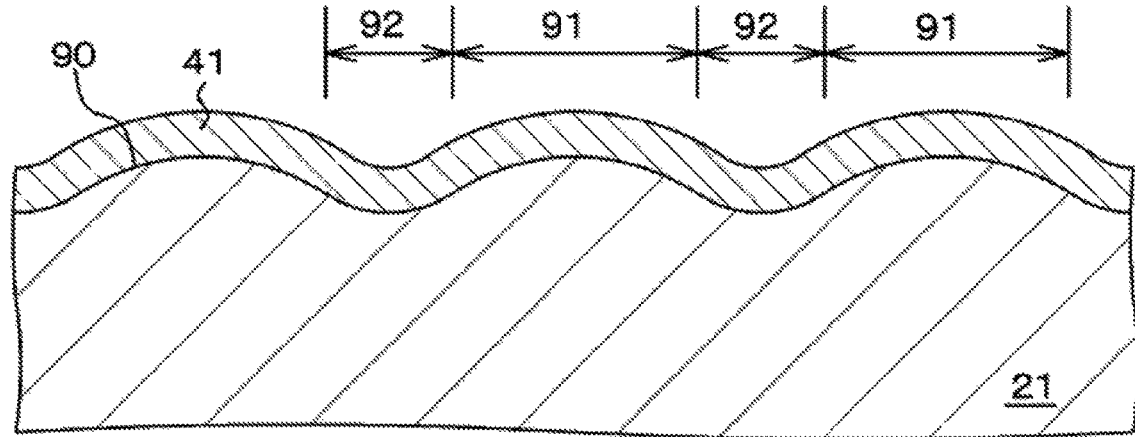

[FIG. 16A]
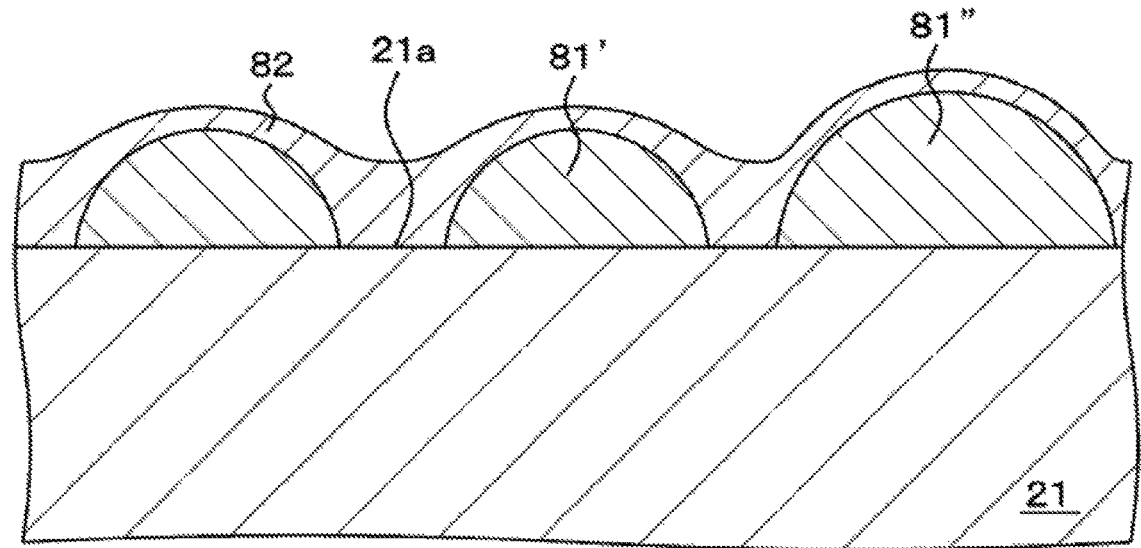
[FIG. 16B]
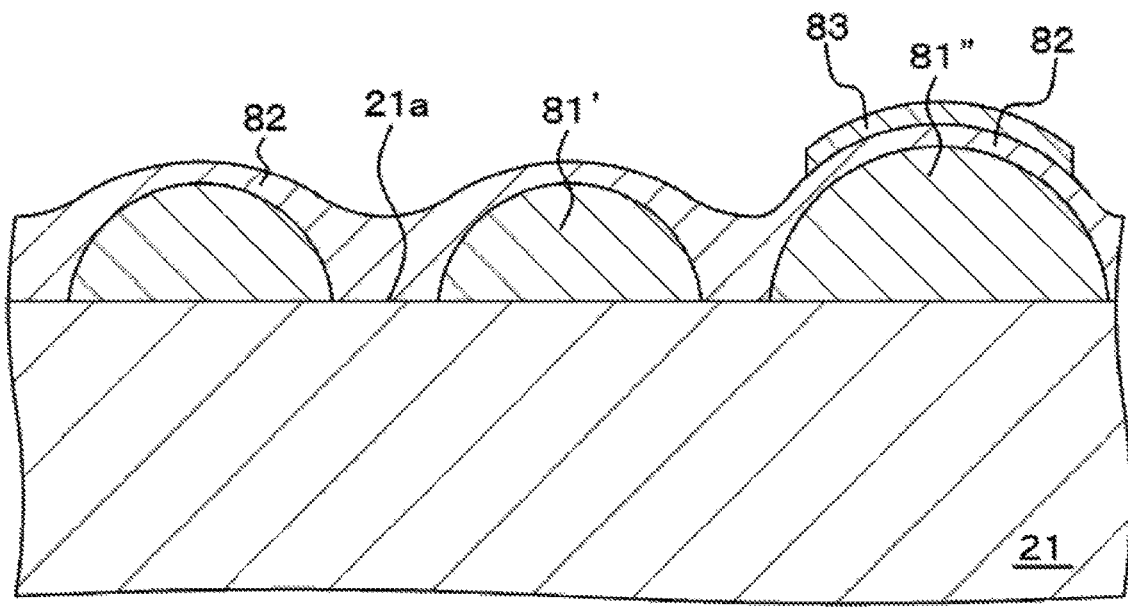

[FIG. 17]
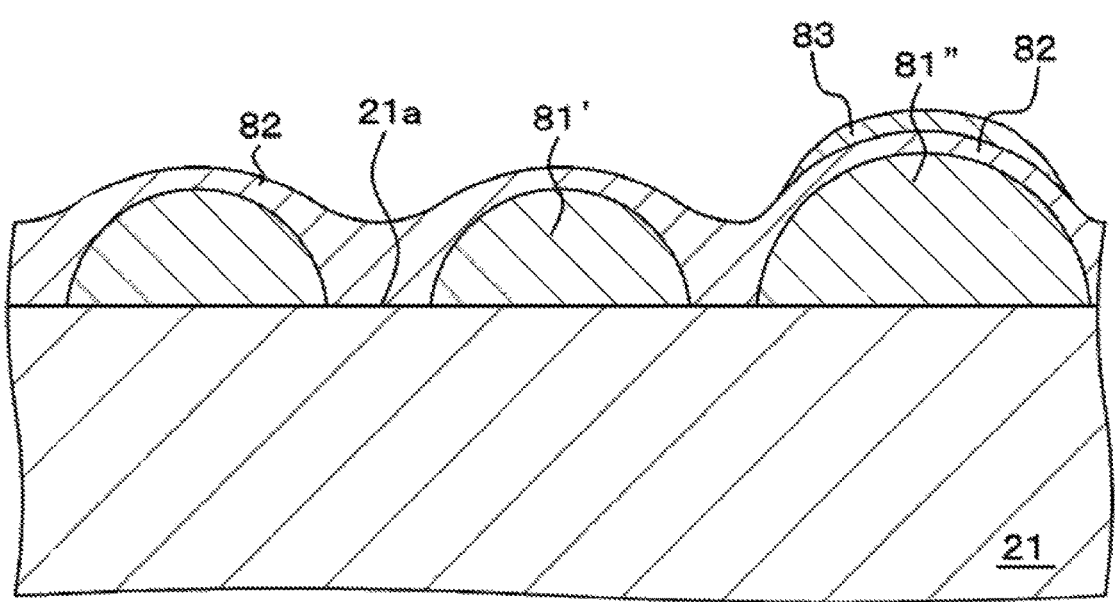

[FIG. 18A]
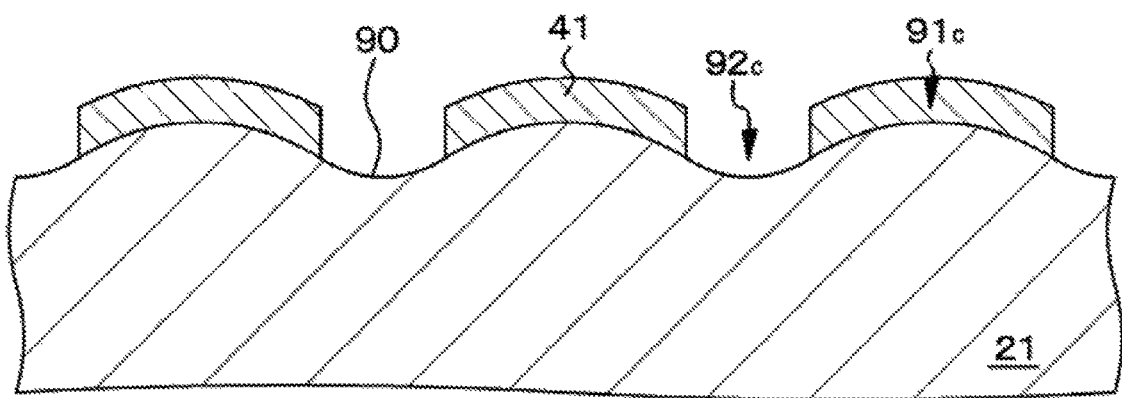
[FIG. 18B]
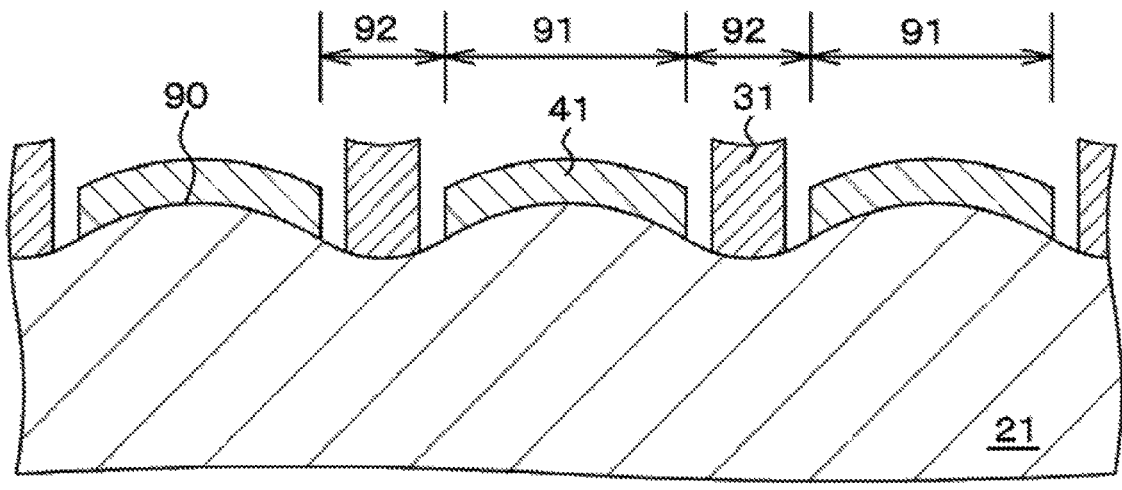

[FIG. 19]
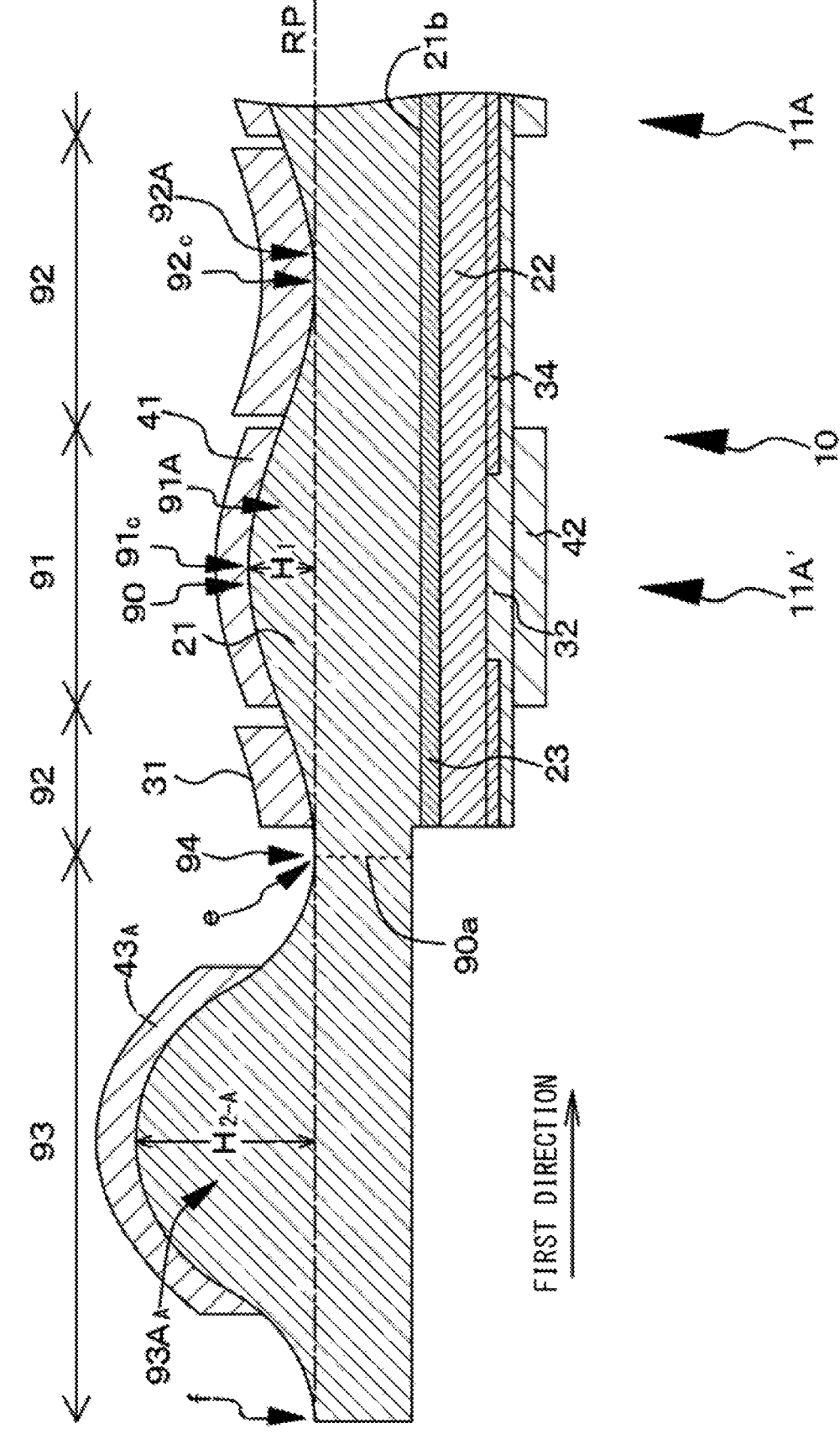

[FIG. 20]
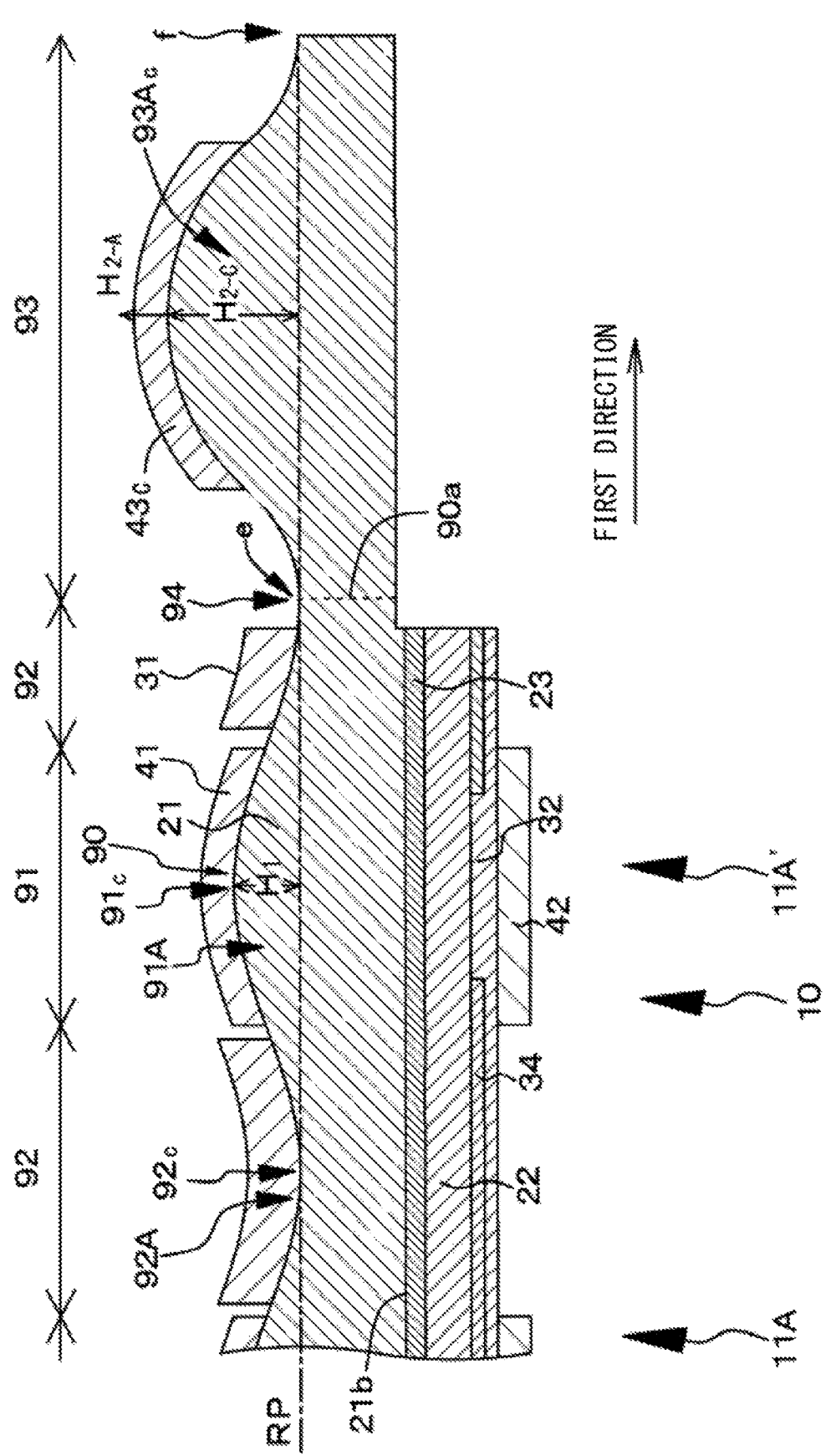

[FIG. 21]
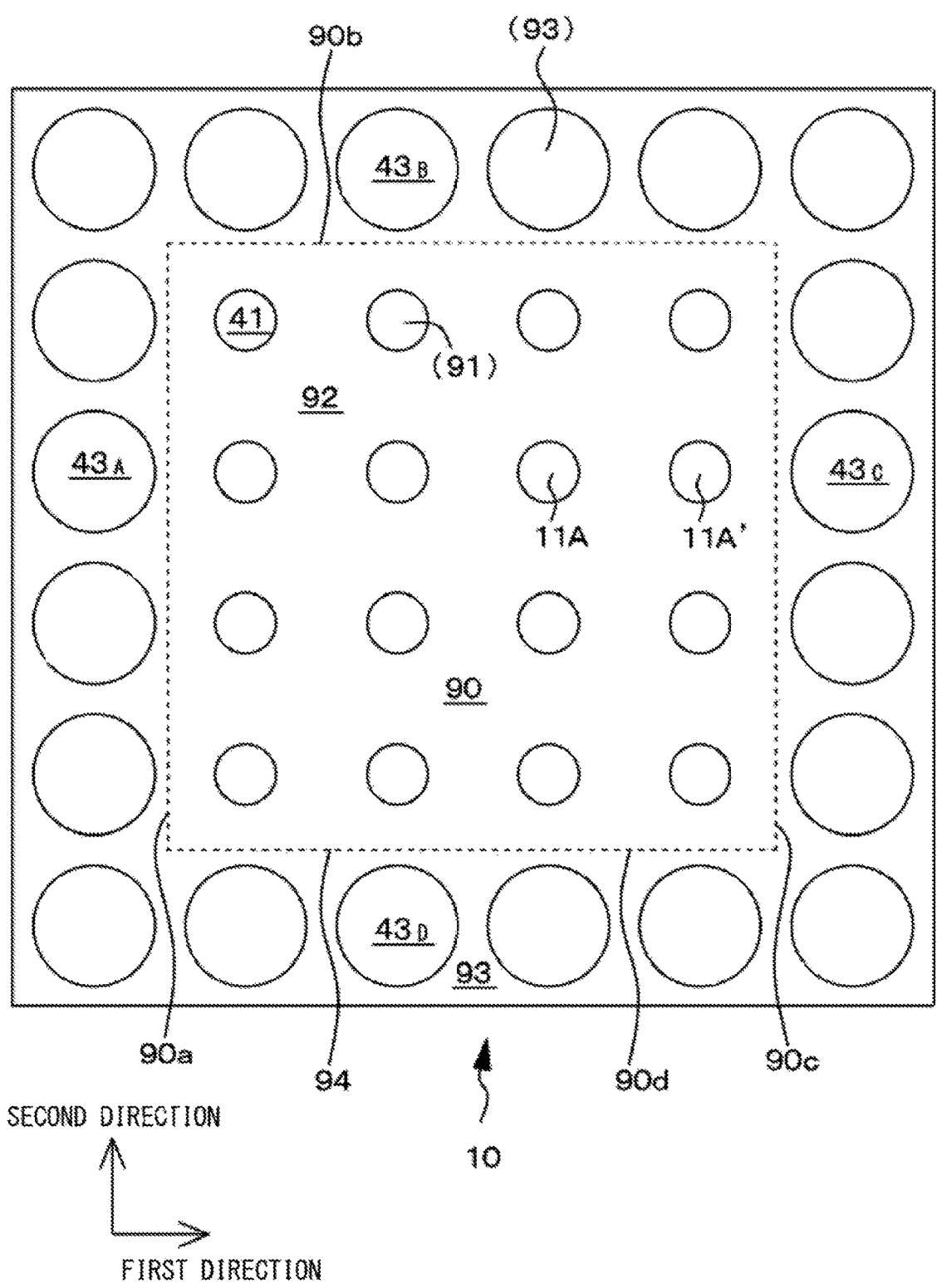

[FIG. 22]
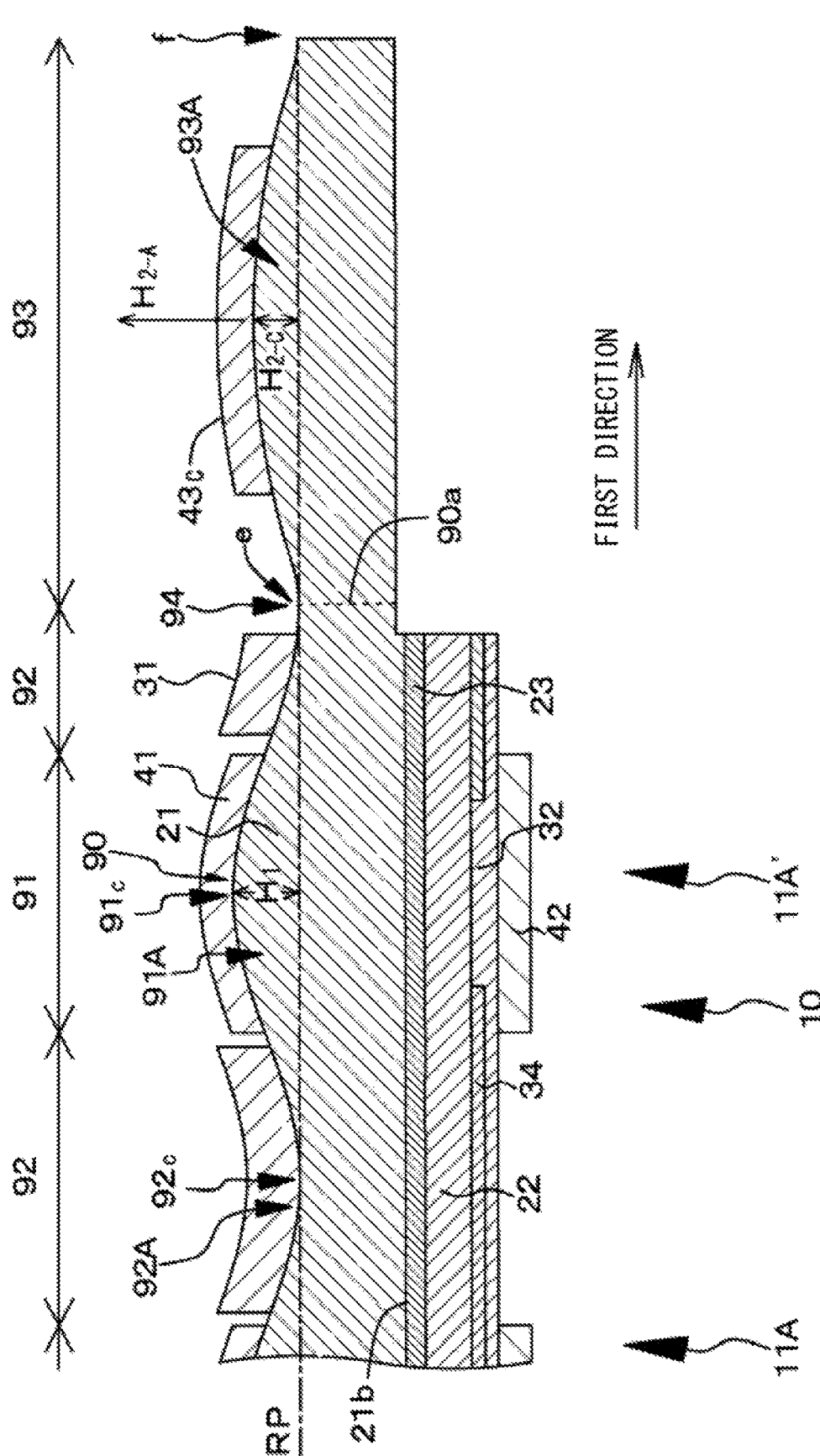

[FIG. 23]
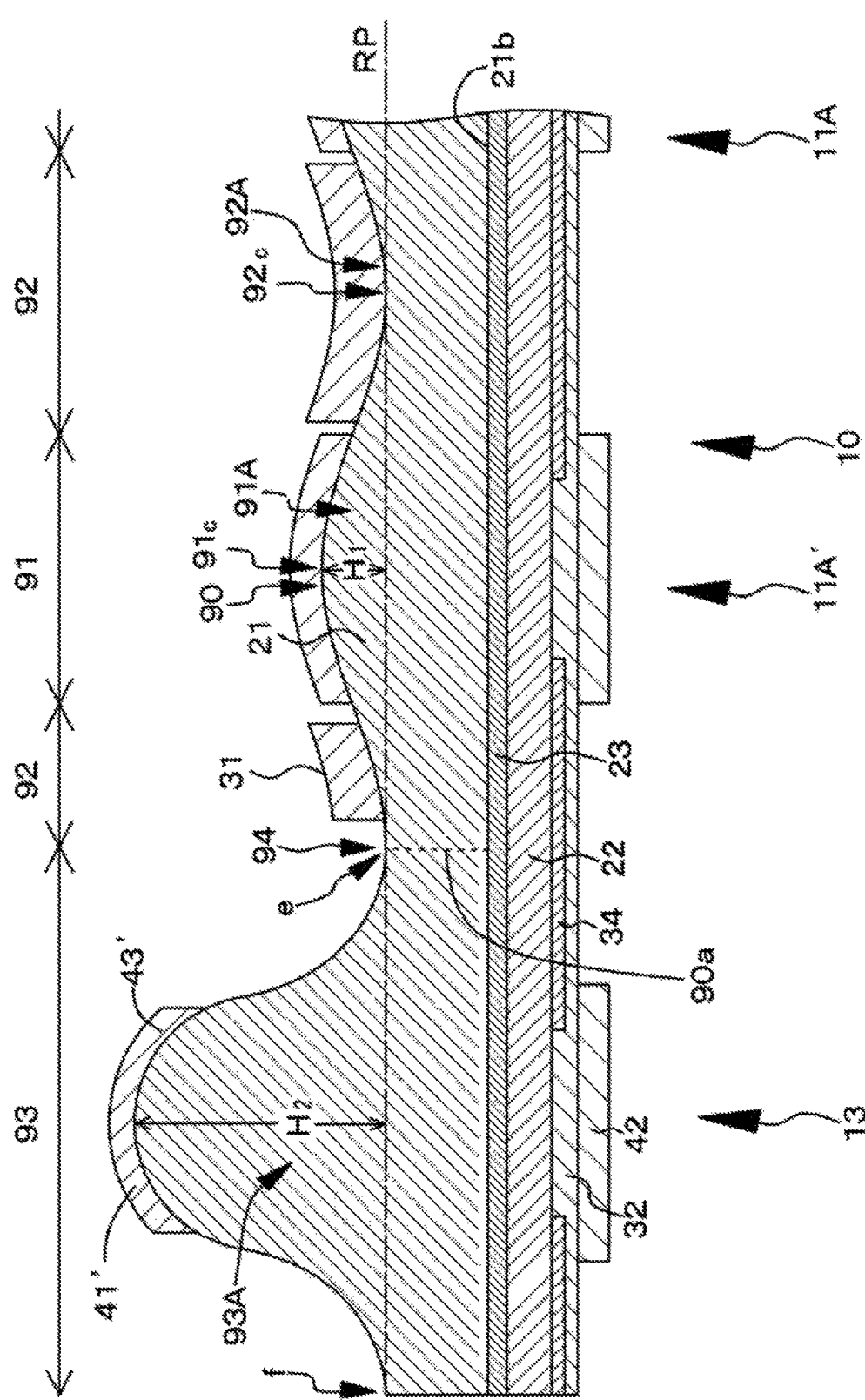

[FIG. 24]
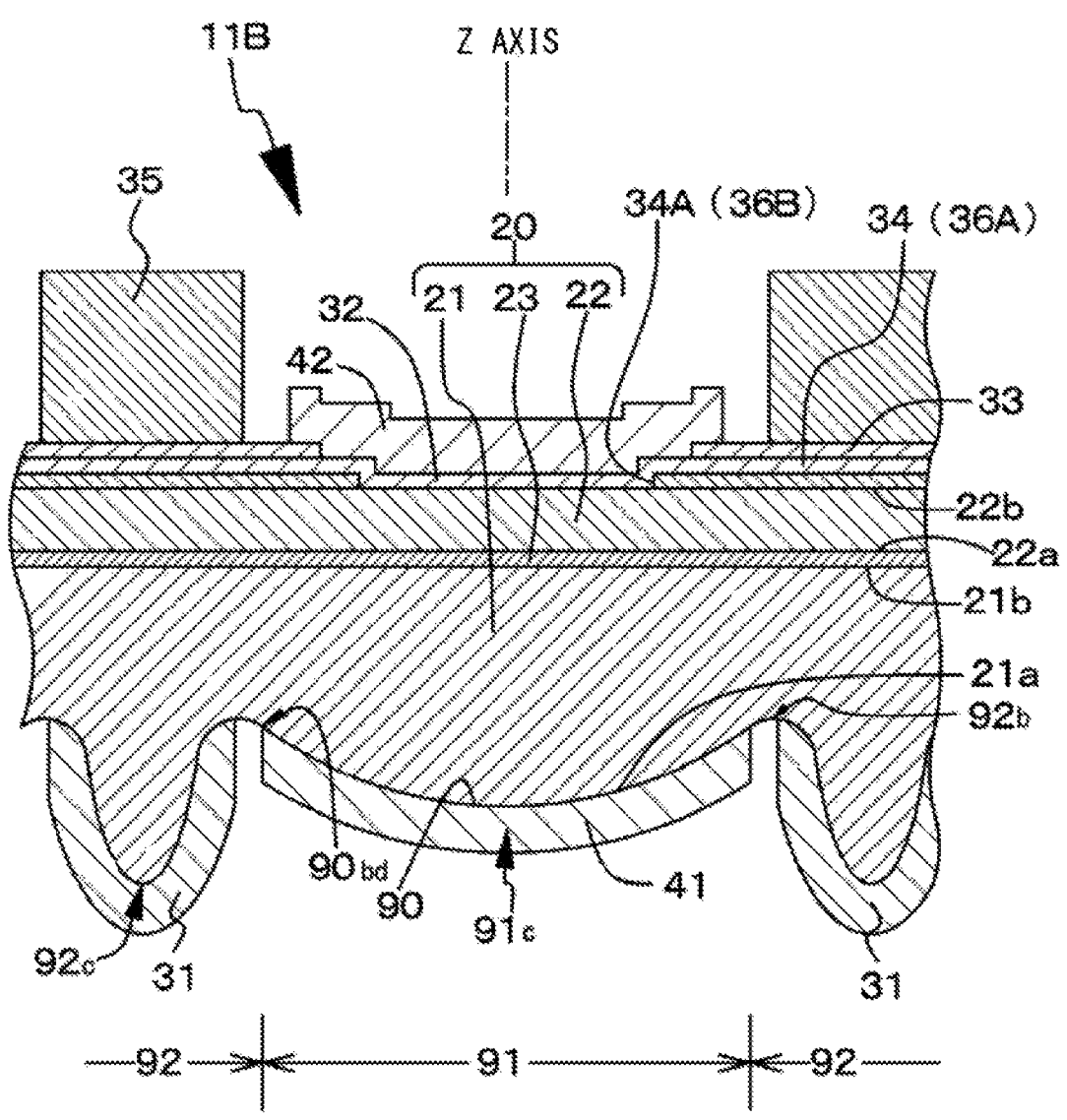

[FIG. 25]
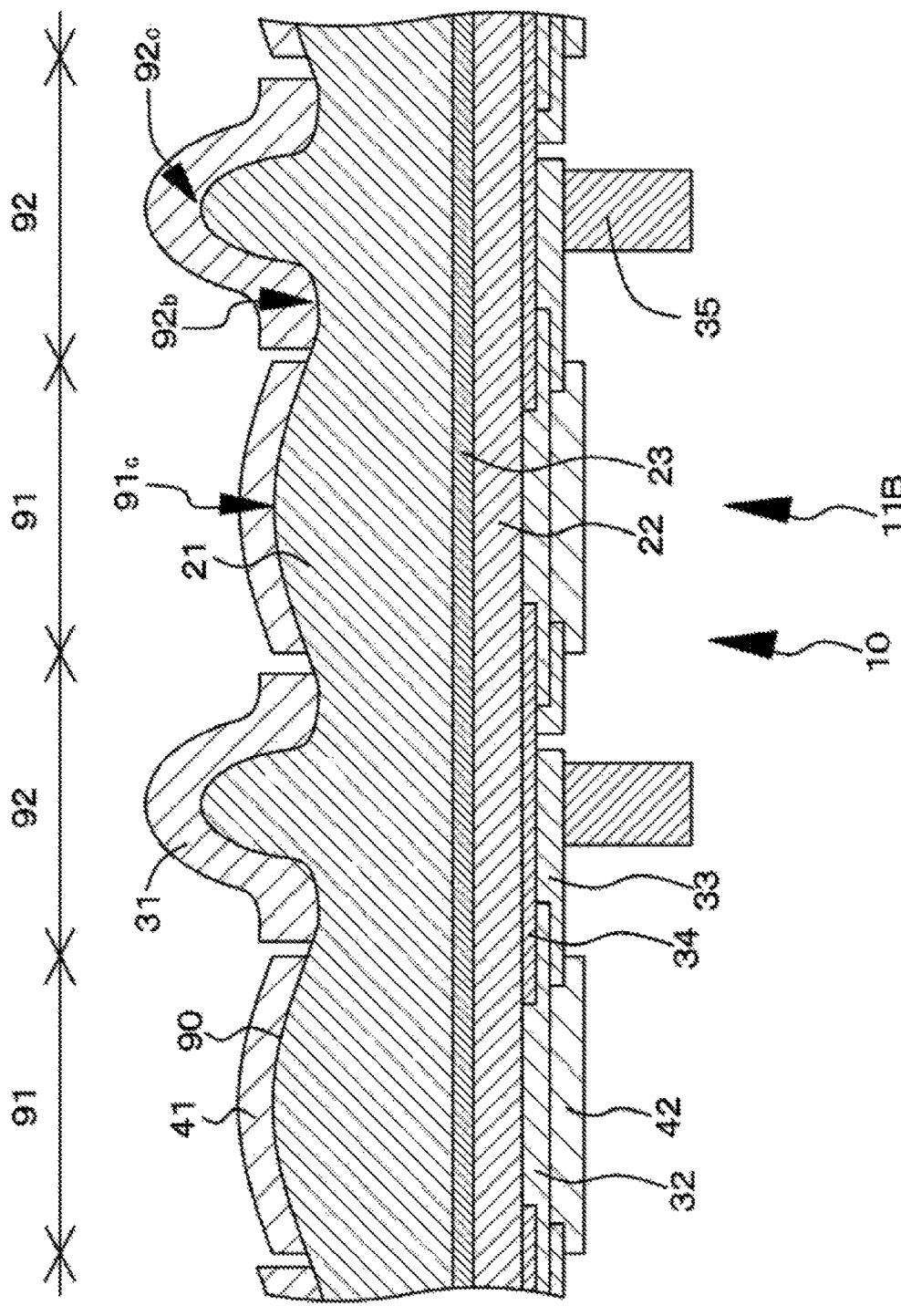

[FIG. 26]
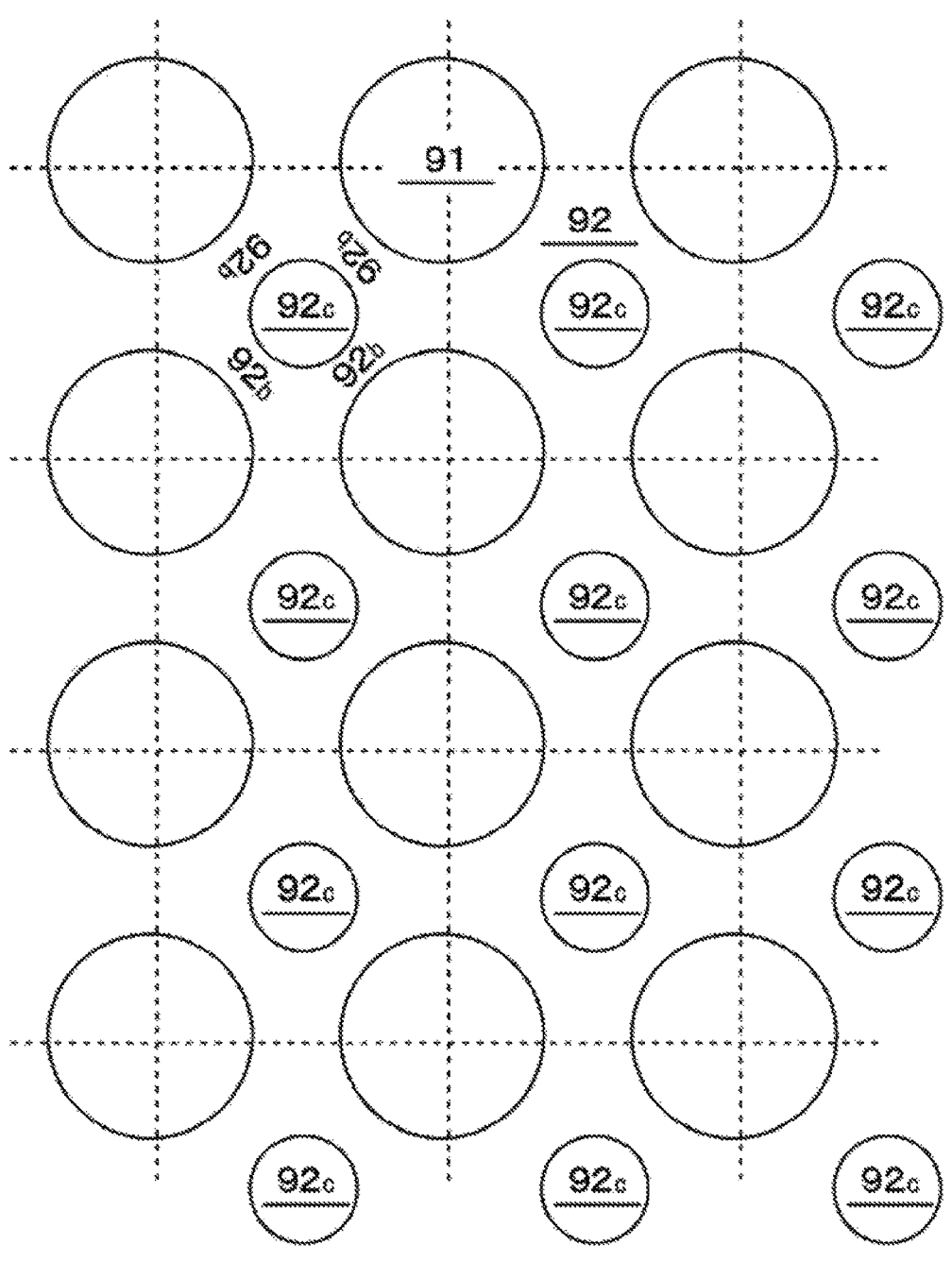

[FIG. 27]
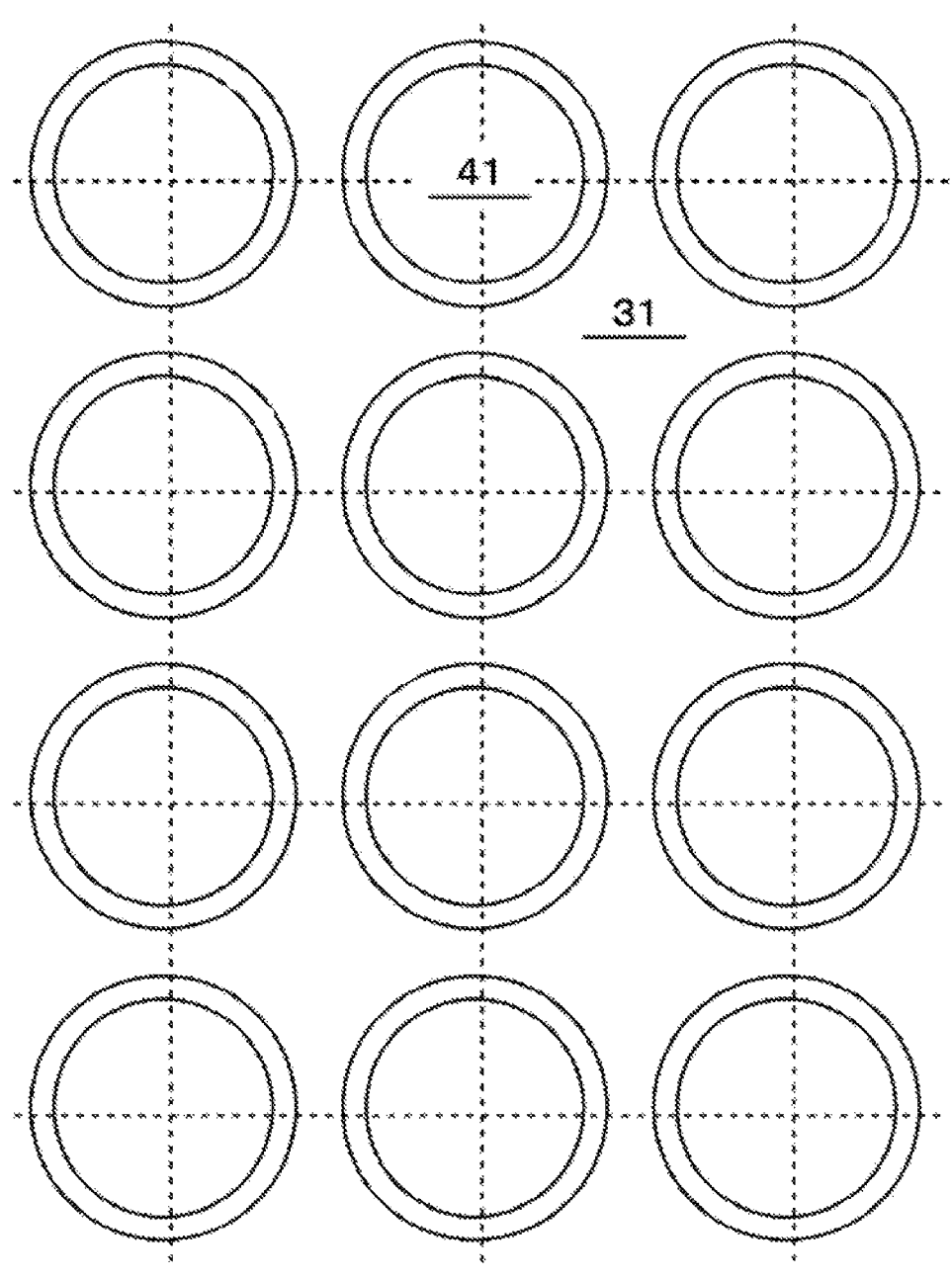

[FIG. 28]
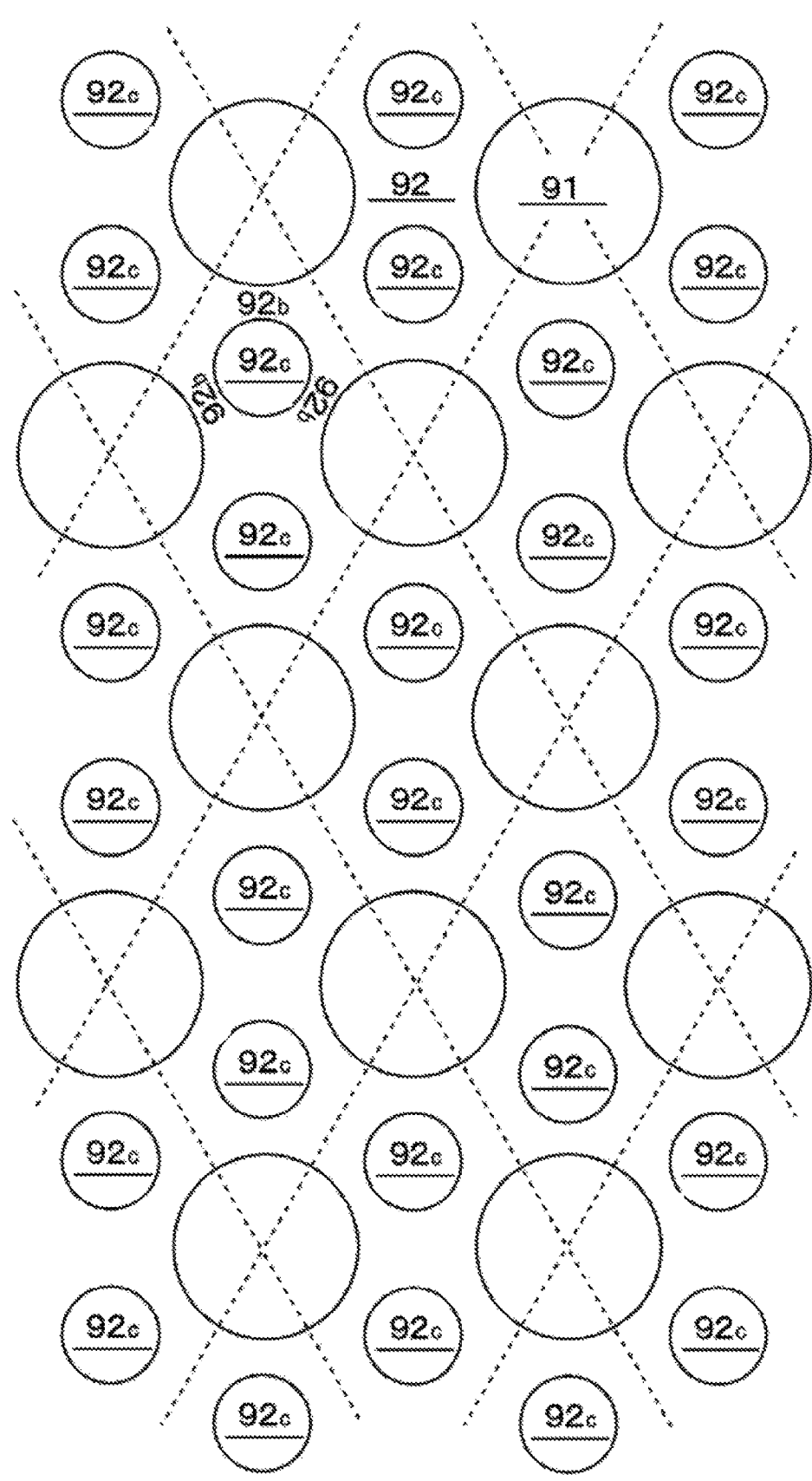

[FIG. 29]
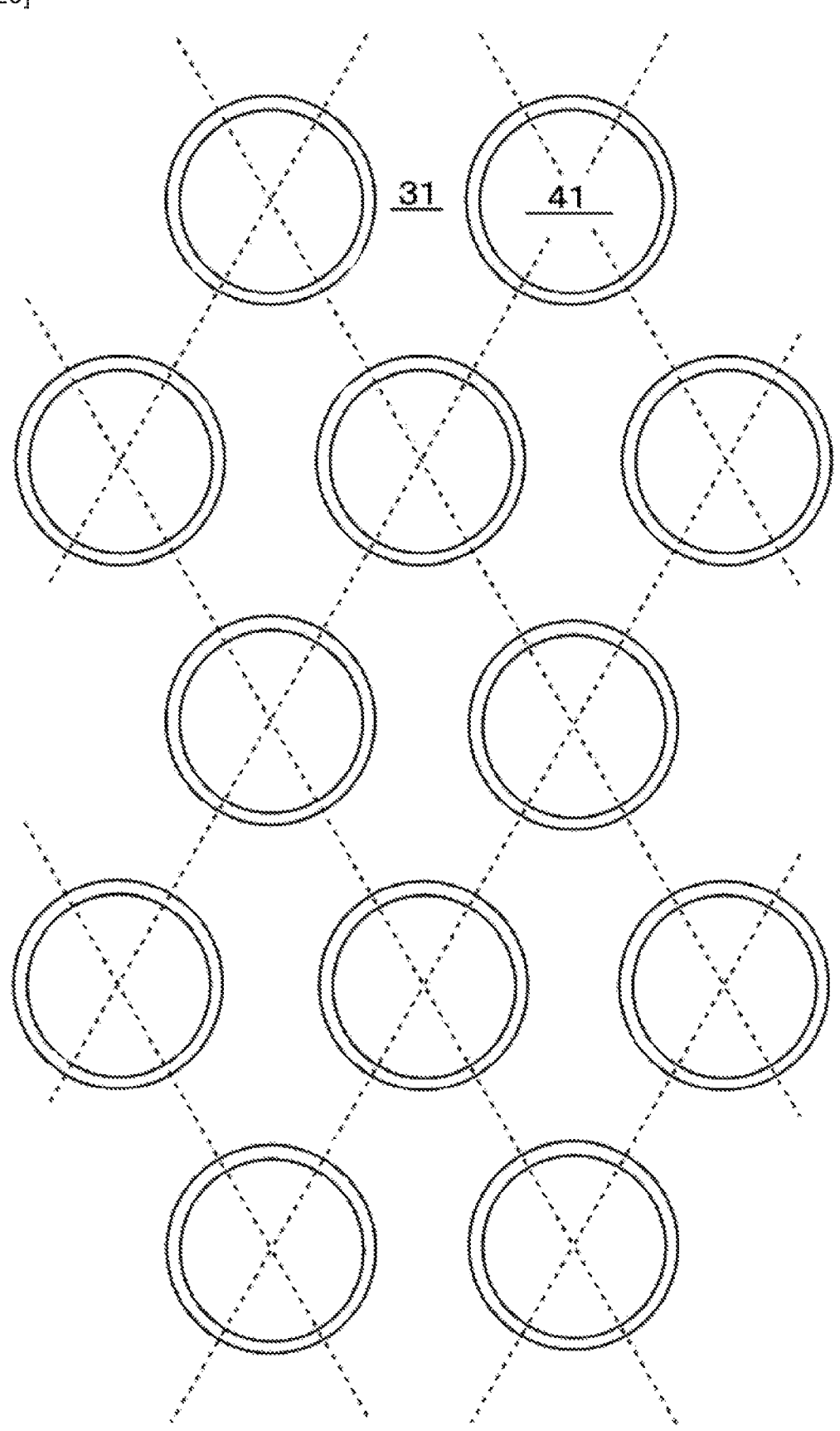

[FIG. 30A]
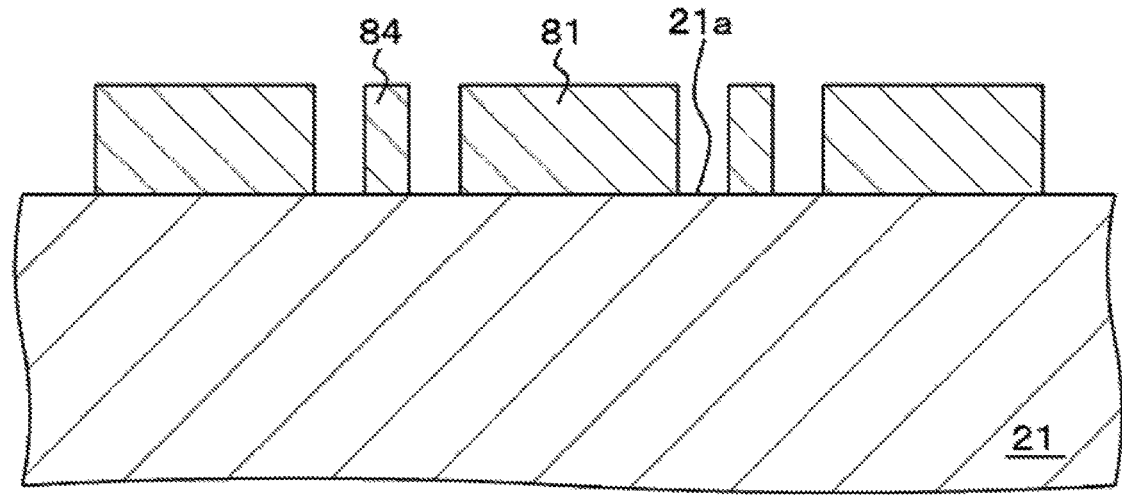
[FIG. 30B]
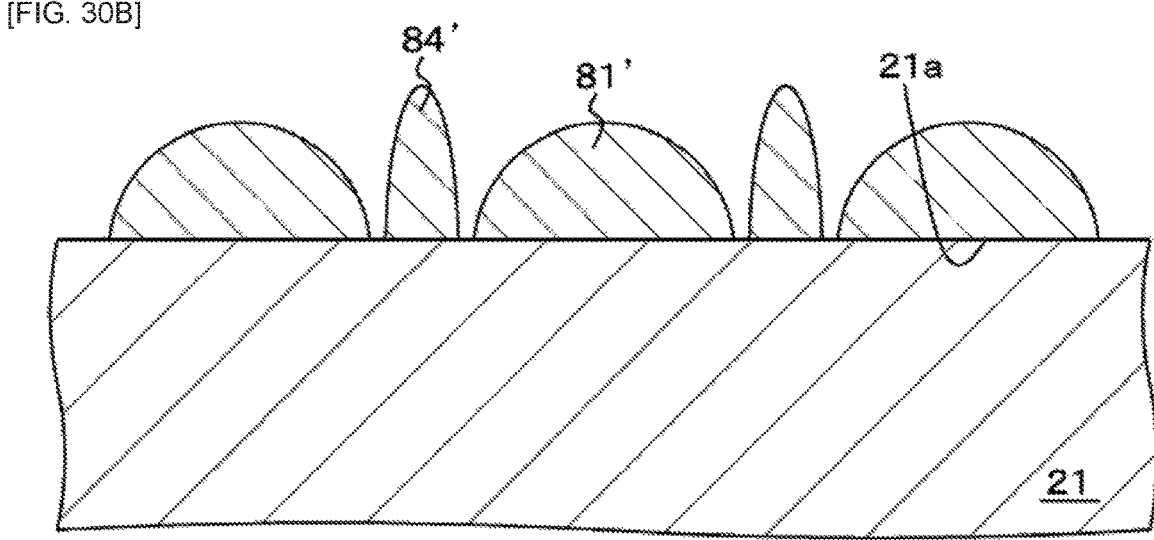

[FIG. 31A]
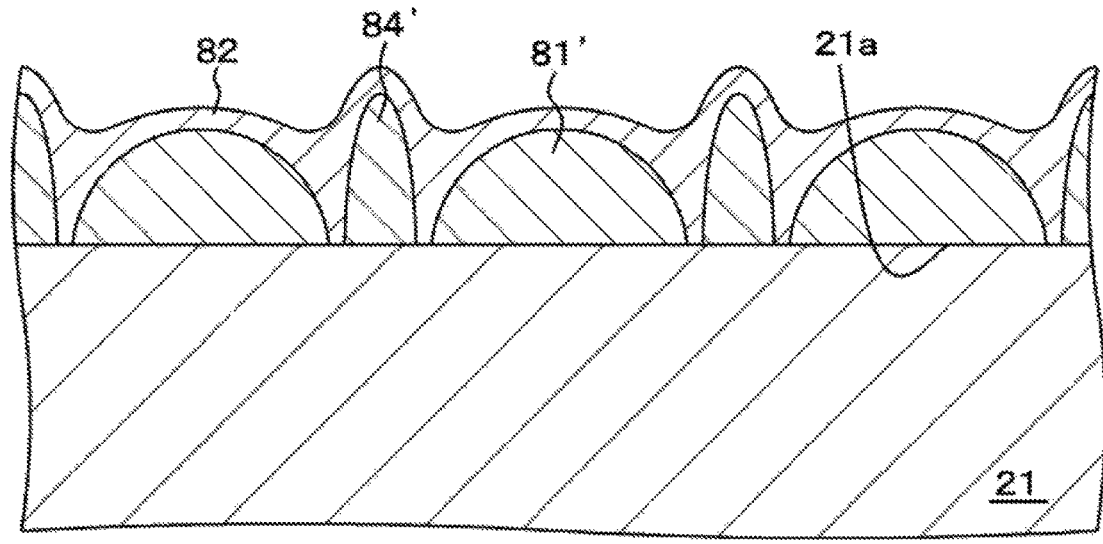
[FIG. 31B]
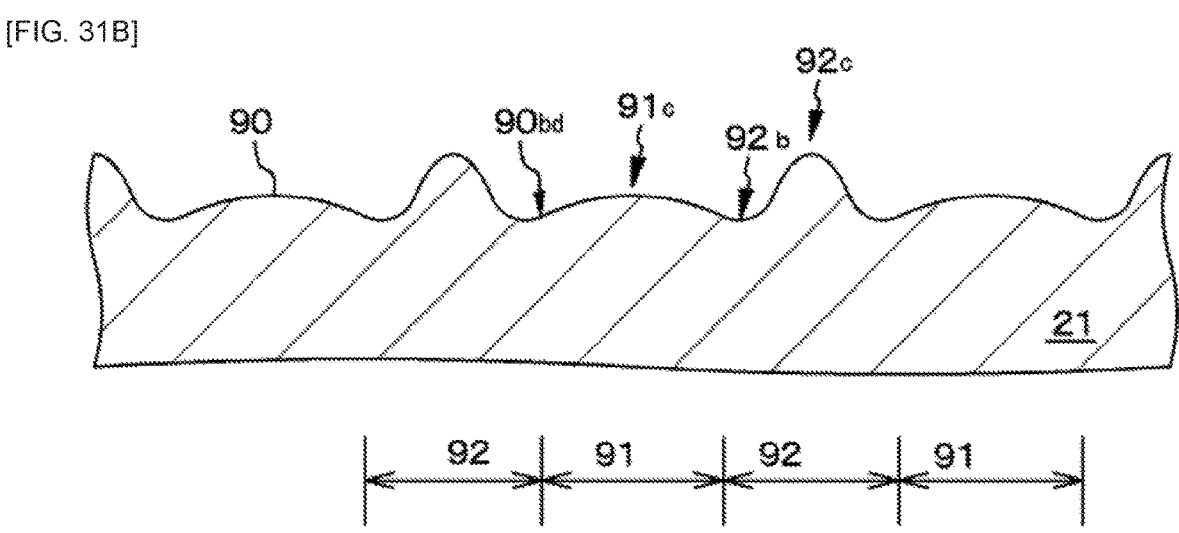

[FIG. 32A]
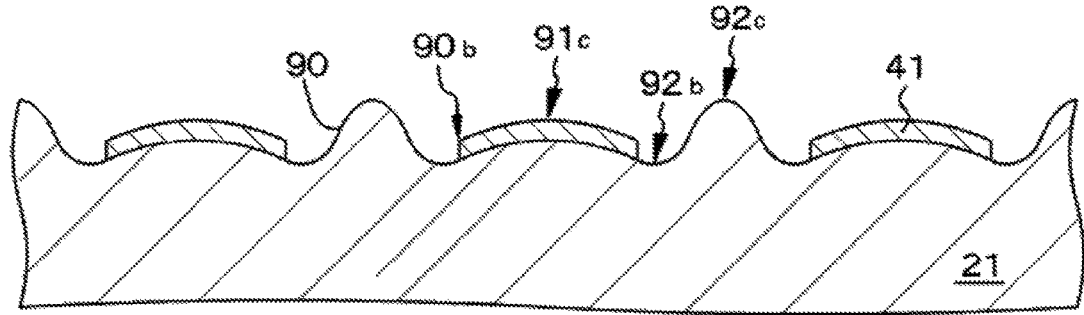
[FIG. 32B]
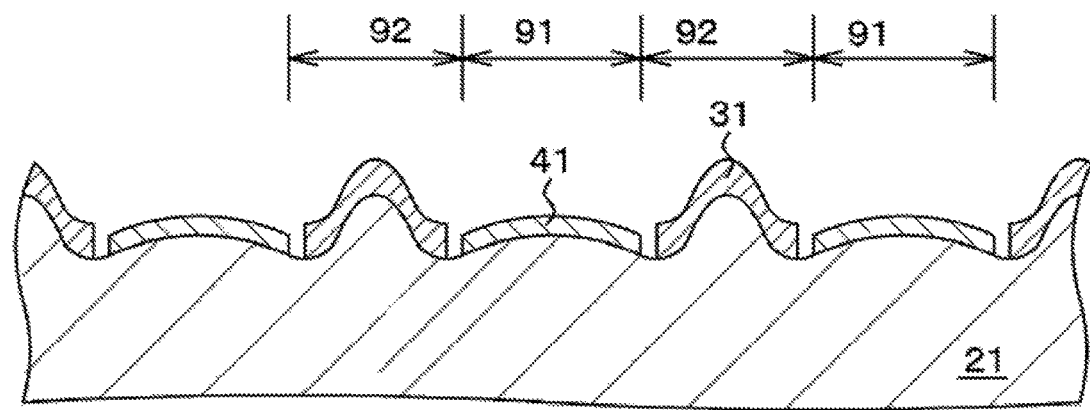

[FIG. 33]
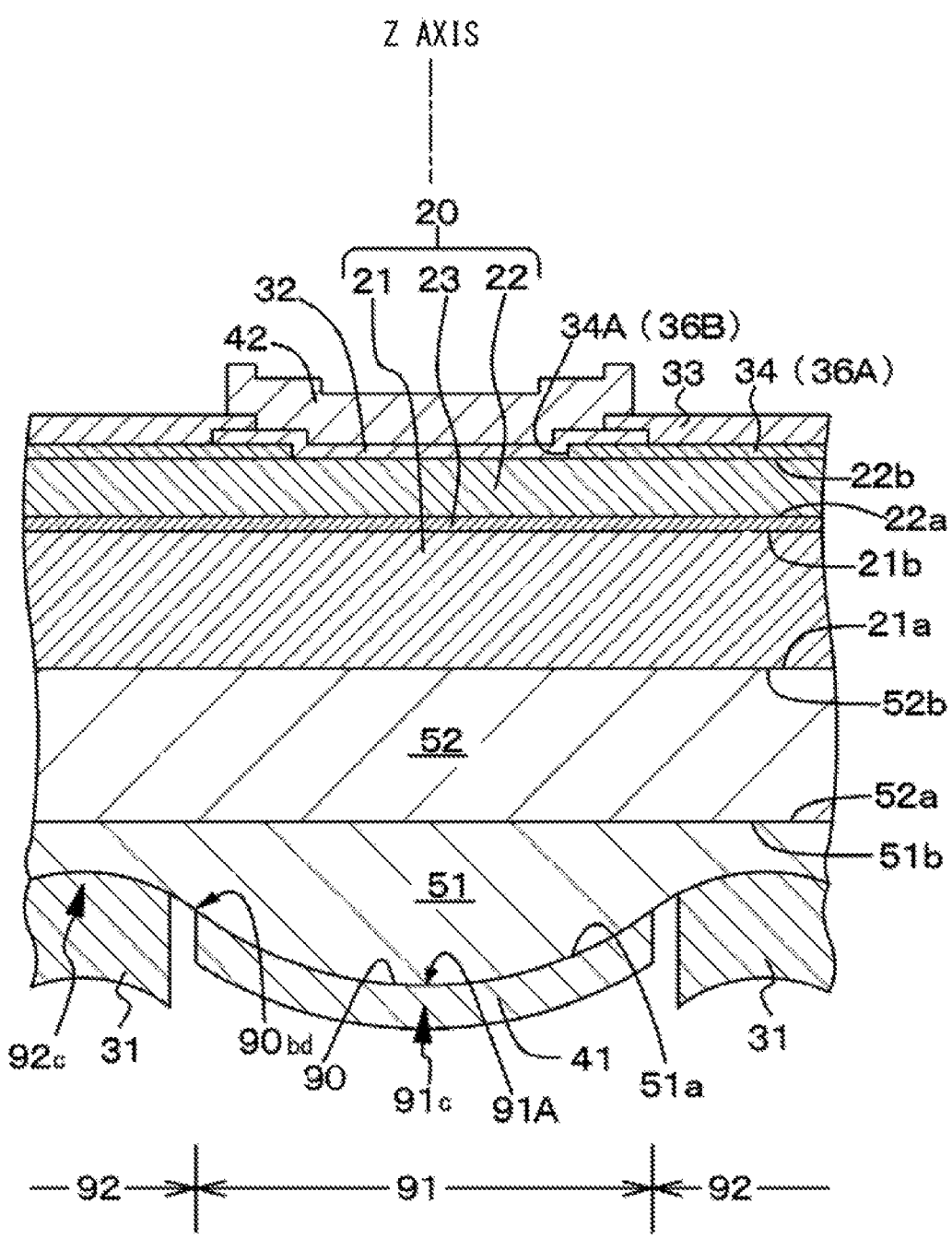

[FIG. 34]
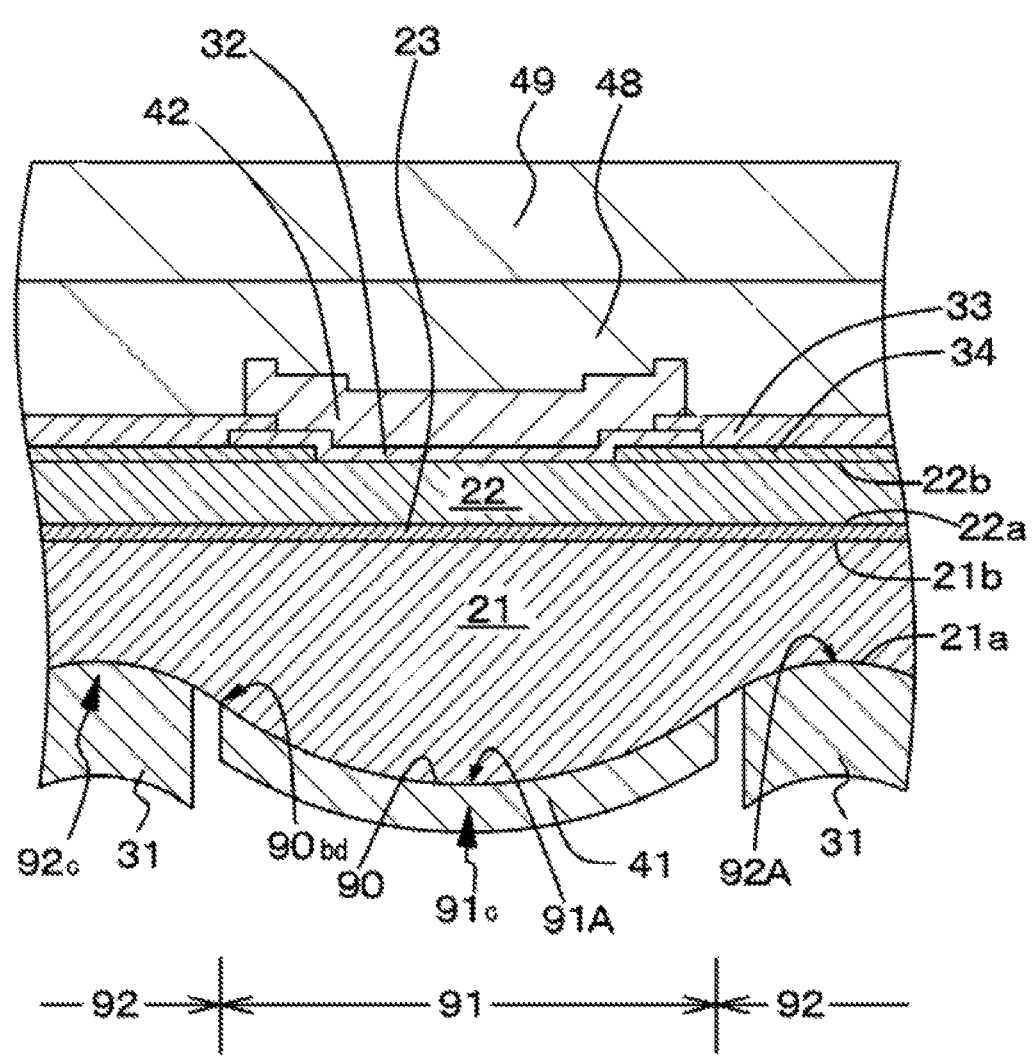

[FIG. 35A]
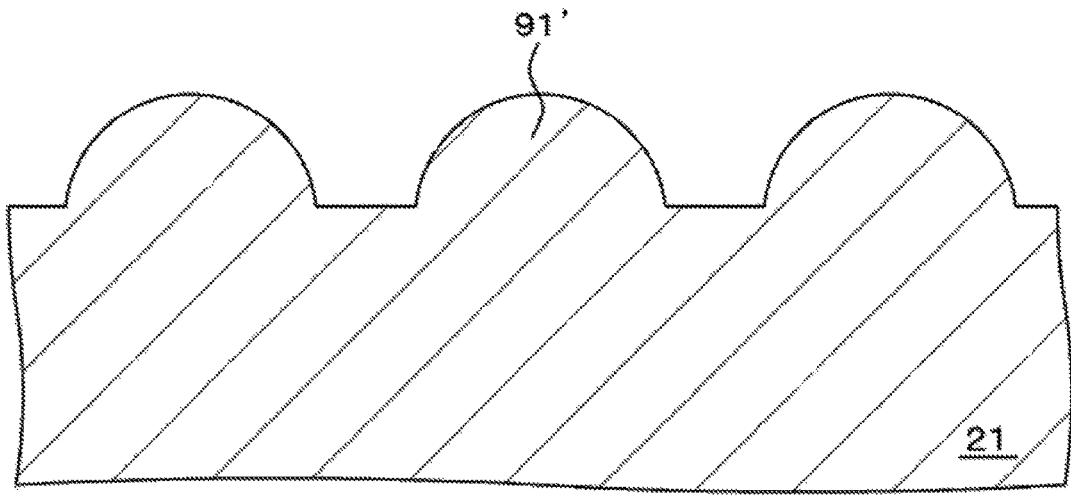
[FIG. 35B]
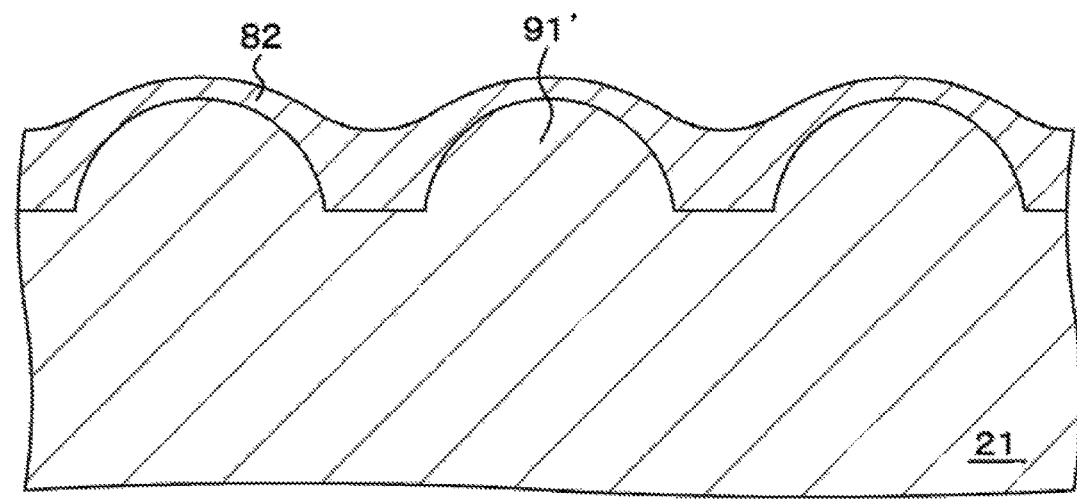
[FIG. 35C]
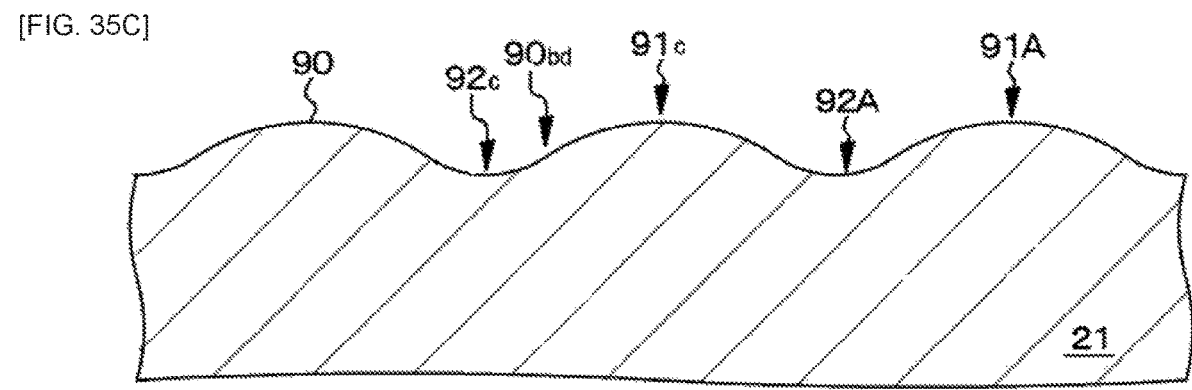

[FIG. 36A]
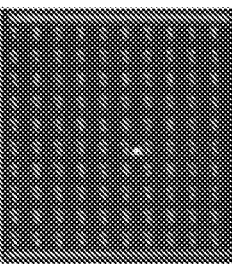
[FIG. 36B]
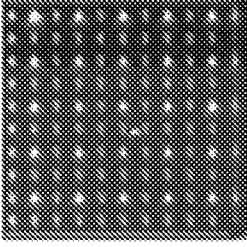
[FIG. 36C]
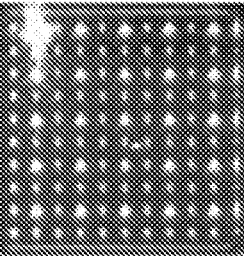
[FIG. 36D]
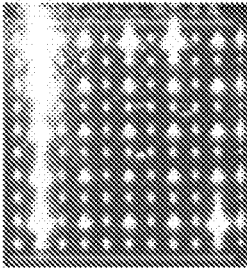

LIGHT-EMITTING DEVICE

CROSS REFERENCE TO RELATED APPLICATIONS

This application is a U.S. National Phase of International Patent Application No. PCT/JP2021/021278 filed on Jun. 3, 2021, which claims priority benefit of Japanese Patent Application No. JP 2020-109749 filed in the Japan Patent Office on Jun. 25, 2020. Each of the above-referenced applications is hereby incorporated herein by reference in its entirety.

TECHNICAL FIELD

The present disclosure relates to a light-emitting device.

BACKGROUND ART

In a light-emitting element including a surface emitting laser element (VCSEL), typically, laser light is resonated between two light reflection layers (Distributed Bragg Reflector layers, DBR layers) to thereby generate laser oscillation. In addition, in a surface emitting laser element having a stacked structure in which an n-type compound semiconductor layer (a first compound semiconductor layer), an active layer (a light-emitting layer) including a compound semiconductor, and a p-type compound semiconductor layer (a second compound semiconductor layer) are stacked, typically, a second electrode including a transparent electrically-conductive material is formed on the p-type compound semiconductor layer, and a second light reflection layer including a stacked structure of an insulating material is formed on the second electrode. In addition, a first light reflection layer including a stacked structure of an insulating material, and a first electrode are formed on the n-type compound semiconductor layer (in a case where the n-type compound semiconductor layer is formed on an electrically-conductive substrate, on an exposed surface of the sub-strate).

A structure in which the first light reflection layer also functions as a concave mirror is disclosed in, for example, WO2018/083877A1. Here, in the technique disclosed in this International Publication, for example, an n-type compound semiconductor layer is provided with a convex part with respect to an active layer, and a first light reflection layer is formed on the convex part.

CITATION LIST

Patent Literature

PTL 1: WO2018/083877A1

SUMMARY OF THE INVENTION

Incidentally, in manufacturing of a light-emitting element array including a plurality of light-emitting elements arranged, for example, when an n-type compound semiconductor layer is etched to form a convex part in the n-type compound semiconductor layer, the n-type compound semiconductor layer located in an outermost peripheral part of the light-emitting element array is more easily etched than the light-emitting elements located in a middle part, which may cause an issue that the shape of a first light reflection layer differs between the light-emitting elements located in the outermost peripheral part and the light-emitting elements located in the middle part of the light-emitting element array. In addition, in a light-emitting element array in which a plurality of light-emitting elements each including a surface emitting laser element is arranged in a two-dimensional matrix pattern, when the plurality of light-emitting elements is driven simultaneously under the same driving condition, in some cases, light intensity of the light-emitting elements located in the outermost peripheral part is higher than light intensity of the light-emitting elements located in another region. Further, in a case where these phenomena occur, uniformity of light intensity as the entire light-emitting element array deteriorates.

Accordingly, it is a first object of the present disclosure to provide a light-emitting device having a configuration or structure that makes it possible to secure uniformity of processing as an entire light-emitting element array. In addition, it is a second object of the present disclosure to provide a light-emitting device having a configuration or structure that makes it possible to secure uniformity of light intensity as an entire light-emitting element array.

A light-emitting device according to a first aspect of the present disclosure for achieving the above first object includes:

a light-emitting element array including a plurality of
    light-emitting elements arranged; and
a dummy concave mirror section surrounding the light-
    emitting element array,
the light-emitting element each including
a stacked structure including a stack of
    a first compound semiconductor layer having a first
      surface and a second surface opposed to the first
      surface,
    an active layer facing the second surface of the first
      compound semiconductor layer, and
    a second compound semiconductor layer having a first
      surface facing the active layer and a second surface
      opposed to the first surface,
a first light reflection layer formed on a base part surface
    located on side of the first surface of the first compound
    semiconductor layer, and
a second light reflection layer formed on side of the
    second surface of the second compound semiconductor
    layer and having a flat shape, in which
a first convex part is formed in a portion of the base part
    surface in which the first light reflection layer func-
    tioning as a concave mirror is formed, with respect to
    the second surface of the first compound semiconductor
    layer, and
a second convex part is formed in a portion of an
    extending part of the base part surface in which the
    dummy concave mirror section is formed, with respect
    to the second surface of the first compound semicon-
    ductor layer.

A light-emitting device according to a second aspect of the present disclosure for achieving the above second object includes:

a light-emitting element array including a plurality of
    light-emitting elements arranged; and
a dummy light-emitting element surrounding the light-
    emitting element array,
the light-emitting elements and the dummy light-emitting
    element each including
a stacked structure including a stack of
    a first compound semiconductor layer having a first
      surface and a second surface opposed to the first
      surface, an active layer facing the second surface of the first compound semiconductor layer, and a second compound semiconductor layer having a first surface facing the active layer and a second surface opposed to the first surface, the light-emitting elements each further including a first light reflection layer formed on a base part surface located on side of the first surface of the first compound semiconductor layer, and a second light reflection layer formed on side of the second surface of the second compound semiconductor layer and having a flat shape, a first convex part being formed in a portion of the base part surface in which the first light reflection layer functioning as a concave mirror is formed, with respect to the second surface of the first compound semiconductor layer, the dummy light-emitting element further including a dummy first light reflection layer including a dummy concave mirror section formed on an extending part of the base part surface located on side of the first surface of the first compound semiconductor layer, and a second light reflection layer formed on side of the second surface of the second compound semiconductor layer and having a flat shape, a second convex part being formed in a portion of the extending part of the base part surface in which the dummy first light reflection layer is formed, with respect to the second surface of the first compound semiconductor layer, and the dummy light-emitting element not emitting light even though a current flows through the stacked structure.

BRIEF DESCRIPTION OF DRAWINGS

FIG. 1 is a schematic partial end view of a region including one outer peripheral part of a light-emitting element array in a light-emitting device of Example 1.

FIG. 2 is a schematic partial end view of a region including another outer peripheral part of the light-emitting element array in the light-emitting device of Example 1.

FIG. 3 is a schematic partial end view of a middle part of the light-emitting element array in the light-emitting device of Example 1.

FIG. 4 is a diagram schematically illustrating a layout of a first light reflection layer and a dummy concave mirror section in the light-emitting device of Example 1.

FIG. 5 is a diagram schematically illustrating a layout of a first light reflection layer in a modification example of the light-emitting device of Example 1.

FIG. 6 is a schematic partial end view of a light-emitting element included in the light-emitting element array in the light-emitting device of Example 1.

FIG. 7 is a schematic partial end view of Modification Example-1 of the light-emitting element included in the light-emitting element array in the light-emitting device of Example 1.

FIG. 8 is a schematic partial end view of the middle part of the light-emitting element array in the light-emitting device of Example 1 corresponding to FIG. 7.

FIG. 9 is a schematic partial end view of Modification Example-2 of the light-emitting element included in the light-emitting element array in the light-emitting device of Example 1.

FIG. 10 is a schematic partial end view of the middle part of the light-emitting element array in the light-emitting device of Example 1 corresponding to FIG. 9.

FIGS. 11A and 11B each are a schematic partial end view of a stacked structure and the like for describing a method of manufacturing the light-emitting element of Example 1.

FIG. 12, subsequent to FIG. 11B, is a schematic partial end view of the stacked structure and the like for describing the method of manufacturing the light-emitting element of Example 1.

FIG. 13, subsequent to FIG. 12, is a schematic partial end view of the stacked structure and the like for describing the method of manufacturing the light-emitting element of Example 1.

FIGS. 14A and 14B, subsequent to FIG. 13, are schematic partial end views of a first compound semiconductor layer and the like for describing a method of manufacturing the light-emitting element array of Example 1.

FIGS. 15A, 15B, and 15C, subsequent to FIG. 14B, are schematic partial end views of the first compound semiconductor layer and the like for describing the method of manufacturing the light-emitting element array of Example 1.

FIGS. 16A and 16B, subsequent to FIG. 14B, are schematic partial end views of the first compound semiconductor layer and the like for describing the method of manufacturing the light-emitting element array of Example 1.

FIG. 17, subsequent to FIG. 16B, is a schematic partial end view of the first compound semiconductor layer and the like for describing the method of manufacturing the light-emitting element array of Example 1.

FIGS. 18A and 18B, subsequent to FIG. 15C, are schematic partial end views of the first compound semiconductor layer and the like for describing the method of manufacturing the light-emitting element array of Example 1.

FIG. 19 is a schematic partial end view of a region including one outer peripheral part of a light-emitting element array in a light-emitting device of each of Example 2 and Example 3.

FIG. 20 is a schematic partial end view of a region including another outer peripheral part of the light-emitting element array in the light-emitting device of Example 2.

FIG. 21 is a diagram schematically illustrating a layout of a first light reflection layer and a dummy first light reflection layer in the light-emitting device of Example 2.

FIG. 22 is a schematic partial end view of a region including another outer peripheral part of the light-emitting element array in the light-emitting device of Example 3, or a schematic partial end view of a region including one and another outer peripheral parts of a light-emitting element array in a light-emitting device of Example 4.

FIG. 23 is a schematic partial end view of a region including one and another outer peripheral parts of a light-emitting element array in a light-emitting device of Example 5.

FIG. 24 is a schematic partial end view of a light-emitting element of Example 6.

FIG. 25 is a schematic partial end view of a light-emitting element array of Example 6.

FIG. 26 is a schematic plan diagram illustrating a layout of a first portion and a second portion of a base part surface of the light-emitting element array of Example 6.

FIG. 27 is a schematic plan diagram illustrating a layout of a first light reflection layer and a first electrode in the light-emitting element array of Example 6.

FIG. 28 is a schematic plan diagram illustrating a layout of the first portion and the second portion of the base part surface of the light-emitting element array of Example 6.

FIG. 29 is a schematic plan diagram illustrating a layout of the first light reflection layer and the first electrode in the light-emitting element array of Example 6.

FIGS. 30A and 30B each are a schematic partial end view of a first compound semiconductor layer and the like for describing a method of manufacturing the light-emitting element array of Example 6.

FIGS. 31A and 31B, subsequent to FIG. 30B, each are a schematic partial end view of the first compound semiconductor layer and the like for describing the method of manufacturing the light-emitting element array of Example 6.

FIGS. 32A and 32B, subsequent to FIG. 31B, each are a schematic partial end view of the first compound semiconductor layer and the like for describing the method of manufacturing the light-emitting element array of Example 6.

FIG. 33 is a schematic partial cross-sectional view of a light-emitting element of a modification example of Example 7.

FIG. 34 is a schematic partial cross-sectional view of a light-emitting element of Example 8.

FIGS. 35A, 35B, and 35C each are a schematic partial end view of the first compound semiconductor layer and the like for describing a modification example of the method of manufacturing the light-emitting element array of Example 1.

FIGS. 36A, 36B, 36C, and 36D each are a diagram illustrating a state in which light intensity of a light-emitting element located in an outermost peripheral part is higher than light intensity of a light-emitting element located in another region when a plurality of light-emitting elements is simultaneously driven under the same driving condition in a light-emitting element array.

MODES FOR CARRYING OUT THE INVENTION

In the following, description is given of the present disclosure on the basis of Examples with reference to the drawings. However, the present disclosure is not limited to Examples, and various numerical values and materials in Examples are illustrative. It is to be noted that the description is given in the following order.

1. General Description of Light-emitting devices According to First Aspect and Second Aspect of Present Disclosure
2. Example 1 (Light-emitting Device According to First Aspect of Present Disclosure)
3. Example 2 (Modification of Example 1)
4. Example 3 (Another Modification of Example 1)
5. Example 4 (Still Another Modification of Example 1)
6. Example 5 (Light-emitting Device According to Second Aspect of Present Disclosure)
7. Example 6 (Modification of Examples 1 to 5)
8. Example 7 (Modification of Examples 1 to 6)
9. Example 8 (Modification of Examples 1 to 7)
10. Others

General Description of Light-emitting Devices According to First Aspect and Second Aspect of Present Disclosure In a light-emitting device according to a first aspect of the present disclosure, a mode may be adopted in which a plurality of light-emitting elements is simultaneously driven under the same driving condition, but this is not limitative.

A mode may be also adopted in which the plurality of light-emitting elements is driven individually or in groups under the same driving condition or different driving conditions.

In the light-emitting device according to the first aspect of the present disclosure including the preferred modes described above, a mode may be adopted in which at least an active layer and a second compound semiconductor layer are not provided in a region provided with a dummy concave mirror section, and more specifically, a mode may be adopted in which the active layer, the second compound semiconductor layer, and a second light reflection layer are not provided in the region. That is, the region provided with the dummy concave mirror section does not have a function as a light-emitting element.

Furthermore, in the light-emitting device according to the first aspect of the present disclosure including the various preferred modes described above, a configuration may be adopted in which $$H1 < H2$$

is satisfied, where H1 is a height of a first convex part provided in a base part surface, and H2 is a height of a second convex part provided in an extending part of the base part surface. Such a configuration is referred to as a "light-emitting device according to a (1-A)th aspect of the present disclosure" for the sake of convenience. In addition, in this case, a configuration may be adopted in which $$1.1 \le H2/H1$$

is further satisfied, and $$1.1 \le H2/H1 \le 500$$

is preferably satisfied.

In the following description, in some cases, a portion provided with the first convex part of the base part surface is referred to as a "first portion", and a portion surrounding the first convex part of the base part surface is referred to as a "second portion".

In the light-emitting device according to the first aspect of the present disclosure, in a case where the second portion is flat, the height H1 of the first convex part is a height from a virtual plane including the second portion (hereinafter referred to as a "reference virtual plane") to an apex part of the first convex part. In addition, in a case where the second portion has a concavo-convex shape, the height H1 of the first convex part is a height from a virtual plane (reference virtual plane) including a region of the second portion closest to a second surface of the first compound semiconductor layer (a region of a bottommost part of the second portion) to the apex part of the first convex part.

In addition, in the light-emitting devices according to the first and second aspects of the present disclosure, the height H2 of the second convex part indicates a distance from a perpendicular bisector of a line segment to an intersection of the second convex part with a perpendicular line passing through the perpendicular bisector when determining the intersection. The line segment connects a point (referred to as a "first point" for the sake of convenience) that is a rising point of the second convex part in the extending part of the base part surface and is closest to the light-emitting element array, and a point (referred to as a "second point" for the sake of convenience) that is farthest from the light-emitting element array.

Alternatively, in the light-emitting device according to the first aspect of the present disclosure including the various preferred modes described above, a configuration may be adopted in which a plurality of light-emitting elements is arranged in a two-dimensional matrix pattern in a first direction and a second direction different from the first direction, and $$H2\text{-}A > H2\text{-}C > H1$$

is satisfied, where end parts of the base part surface extending in parallel to the second direction are referred to as a first end part and a third end part, end parts of the base part surface extending in parallel to the first direction are referred to as a second end part and a fourth end part, H1 is the height of the first convex part provided in the base part surface, H2-A is a height of the second convex part provided in an extending part of the base part surface, and H2-C is a height of the second convex part provided in an extending part of the base part surface extending from the third end part. Such a configuration is referred to as a "light-emitting device according to a (1-B)th aspect of the present disclosure" for the sake of convenience. In addition, in this case, a configuration may be adopted in which values of H2-B and H2-D are further decreased from the first end part toward the third end part, where H2-B is a height of the second convex part provided in an extending part of the base part surface extending from the second end part, and H2-D is a height of the second convex part provided in an extending part of the base part surface extending from the fourth end part.

Alternatively, in the light-emitting device according to the first aspect of the present disclosure including the various preferred modes described above, a configuration may be adopted in which a plurality of light-emitting elements is arranged in a two-dimensional matrix pattern in a first direction and a second direction different from the first direction, and $$H2\text{-}A > H1 > H2\text{-}C$$

is satisfied, where end parts of the base part surface extending in parallel to the second direction are referred to as a first end part and a third end part, end parts of the base part surface extending in parallel to the first direction are referred to as a second end part and a fourth end part, H1 is the height of the first convex part provided in the base part surface, H2-A is a height of the second convex part provided in an extending part of the base part surface extending from the first end part, and H2-C is a height of the second convex part provided in an extending part of the base part surface extending from the third end part. Such a configuration is referred to as a "light-emitting device according to a (1-C)th aspect of the present disclosure" for the sake of convenience. In addition, in this case, a configuration may be adopted in which values of H2-B and H2-D are further decreased from the first end part toward the third end part, where H2-B is a height of the second convex part provided in an extending part of the base part surface extending from the second end part, and H2-D is a height of the second convex part provided in an extending part of the base part surface extending from the fourth end part.

Alternatively, in the light-emitting device according to the first aspect of the present disclosure including the various preferred modes described above, a configuration may be adopted in which $$H2 < H1$$

is satisfied, where H1 is the height of the first convex part provided in the base part surface and H2 is the height of the second convex part provided in the extending part of the base part surface. Such a configuration is referred to as a "light-emitting device according to a (1-D)th aspect of the present disclosure" for the sake of convenience. in addition, in this case, a configuration may be adopted in which $$H2/H1 \leq 0.9$$

is further satisfied, and $$0.02 \leq H2/H1 \leq 0.9$$

is preferably satisfied.

In the light-emitting device according to the second aspect of the present disclosure, a mode may be adopted in which in a dummy light-emitting element, a value of a radius of curvature of a center part of the second convex part provided in the extending part of the base part surface is less than a value of a resonator length. In addition, in the light-emitting device according to the second aspect of the present disclosure including such a preferred mode, a mode may be adopted in which a plurality of light-emitting elements and the dummy light-emitting element are simultaneously driven under the same driving condition. However, this is not limitative, and a mode may be adopted in which the plurality of light-emitting elements and the dummy light-emitting element are driven individually or in groups under the same driving condition or different driving conditions. In addition, the various preferred modes and configurations described above in the light-emitting device according to the first aspect of the present disclosure are applicable to the light-emitting device according to the second aspect of the present disclosure as appropriate. It is to be noted that actually, when light produced by an active layer is reflected by a light reflection layer, some of the light enters inside of the light reflection layer; however, in the present specification, the "resonator length" is defined as a distance between a surface of the first light reflection layer opposed to a stacked structure and a surface of the second light reflection layer opposed to the stacked structure.

Furthermore, in the light-emitting devices according to the first and second aspects of the present disclosure including the various preferred modes and configurations described above, a mode may be adopted in which in a portion (second portion) of the base part surface in which the first light reflection layer of the light-emitting element is not formed, a concave part is formed with respect to the second surface of the first compound semiconductor layer. It is to be noted that such a mode is referred to as a "light-emitting element of a first configuration" for the sake of convenience. In addition, in this case, a mode may be adopted in which the concave part is further formed from a portion of the base part surface in which the first light reflection layer of the light-emitting element located in an outermost peripheral part of the light-emitting element array is formed to a portion of an extending part of the base part surface extending from that portion, with respect to the second surface of the first compound semiconductor layer. Note that such a mode is not limitative, and a mode may be also adopted in which the portion (second portion) of the base part surface in which the first light reflection layer of the light-emitting element is not formed is flat, and in this case, a mode may be adopted in which a region from the portion of the base part surface in which the first light reflection layer of the light-emitting element located in the outermost peripheral part of the light-emitting element array is formed to the portion of the extending part of the base part surface extending from that portion is further flat.

In the light-emitting element of the first configuration, it is preferable that the base part surface be differentiable. That is, a mode may be adopted in which the base part surface is smooth. Here, "smooth" is an analytical term. For example, if a real variable function f(x) is differentiable in a<x<b and f'(x) is continuous, it can be said to be, in a keyword-like expression, continuously differentiable, or is also expressed as being smooth.

Here, when the base part surface is expressed by z=f(x, y), a differential value at the base part surface is obtainable by:

$$\partial z/\partial x=[\partial f(x,y)/\partial x]y, \text{ and}$$

$$\partial z/\partial y=[\partial f(x,y)/\partial y]x.$$

In the light-emitting devices according to the first and second aspects of the present disclosure, the first light reflection layer is formed in the first convex part of the base part surface; however, a portion in which the first light reflection layer is formed of the first convex part of the base part surface is the first portion as described above. A case may be adopted where the second portion extends from the first portion (first convex part) and an extending part of the first light reflection layer is formed in the second portion, or a case may be adopted where the extending part of the first light reflection layer is not formed in the second portion.

In the light-emitting element of the first configuration, a boundary between the first portion and the second portion is definable as:

(1) in a case where the first light reflection layer does not extend to the second portion, an outer peripheral part of the first light reflection layer; or (2) in a case where the first light reflection layer extends to the second portion, a portion in which an inflection point is present in the base part surface that lies astride the first portion and the second portion.

In the light-emitting element of the first configuration, a configuration may be adopted in which the second portion has a downwardly convex shape with respect to the second surface of the first compound semiconductor layer. The light-emitting element of the first configuration having such a configuration is referred to as a "light-emitting element of a (1-A)th configuration". In addition, in the light-emitting element of the (1-A)th configuration, a configuration may be adopted in which a center part of the first portion is located on a vertex of a square lattice or on a vertex of an equilateral triangular lattice. In the former case, a configuration may be adopted in which a center part of the second portion is located on a vertex of a square lattice. In the latter case, a configuration may be adopted in which the center part of the second portion is located on a vertex of an equilateral triangular lattice.

In the light-emitting element of the (1-A)th configuration, examples of shapes of [the first portion/the second portion in a range from a peripheral part to a center part] include the following cases:

(A) [an upwardly convex shape/a downwardly convex shape];

(B) [an upwardly convex shape/a downwardly convex shape continuing to a line segment];

(C) [an upwardly convex shape/an upwardly convex shape continuing to a downwardly convex shape];

(D) [an upwardly convex shape/an upwardly convex shape continuing to a downwardly convex shape and to a line segment];

(E) [an upwardly convex shape/a line segment continuing to a downwardly convex shape]; and (F) [an upwardly convex shape/a line segment continuing to a downwardly convex shape and to a line segment].

It is to be noted that in the light-emitting element, there are also cases where the base part surface terminates at the center part of the second portion.

Alternatively, a configuration may be adopted in which the second portion has a downwardly convex shape, and an upwardly convex shape extending from the downwardly convex shape, toward the center part of the second portion, with respect to the second surface of the first compound semiconductor layer. The light-emitting element of the first configuration having such a configuration is referred to as a "light-emitting element of a (1-B)th configuration". In addition, in the light-emitting element of the (1-B)th configuration, a configuration may be adopted in which $$L2nd>L1st$$

is satisfied, where L1st is a distance from the second surface of the first compound semiconductor layer to the center part of the first portion, and L2nd is a distance from the second surface of the first compound semiconductor layer to the center part of the second portion, or a configuration may be adopted in which $$R1>R2nd$$

is satisfied, where R1 is a radius of curvature of the center part of the first portion (i.e., a radius of curvature of the first light reflection layer), and R2nd is a radius of curvature of the center part of the second portion. It is to be noted that examples of a value of L2nd/L1st may include, but not limited to, 1<L2nd/L1st≤100; and examples of a value of R1/R2nd may include, but not limited to, 1<R1/R2nd≤100.

In the light-emitting element of the (1-B)th configuration including the preferred configurations described above, a configuration may be adopted in which the center part of the first portion is located on a vertex of a square lattice. In this case, a configuration may be adopted in which the center part of the second portion is located on a vertex of a square lattice. Alternatively, a configuration may be adopted in which the center part of the first portion is located on a vertex of an equilateral triangular lattice. In this case, a configuration may be adopted in which the center part of the second portion is located on a vertex of an equilateral triangular lattice.

In the light-emitting element of the (1-B)th configuration, examples of the shapes of [the first portion/the second portion in a range from a peripheral part to a center part] include the following cases:

(A) [an upwardly convex shape/a downwardly convex shape continuing to an upwardly convex shape];

(B) [an upwardly convex shape/an upwardly convex shape continuing to a downwardly convex shape, and to an upwardly convex shape]; and (C) [an upwardly convex shape/a line segment continuing to a downwardly convex shape, and to an upwardly convex shape].

Alternatively, a configuration may be adopted in which the second portion has an annular convex shape surrounding the first portion and a downwardly convex shape extending from the annular convex shape toward the first portion, with respect to the second surface of the first compound semiconductor layer. The light-emitting element of the first configuration having such a configuration is referred to as a "light-emitting element of a (1-C)th configuration".

In the light-emitting element of the (1-C)th configuration, a configuration may be adopted in which $$L2nd'>L1st$$

is satisfied, where L1st is a distance from the second surface of the first compound semiconductor layer to the center part of the first portion, and L2nd' is a distance from the second surface of the first compound semiconductor layer to an apex part of the annular convex shape of the second portion, or a configuration may be adopted in which $$R1>R2nd$$

is satisfied, where R1 is a radius of curvature of the center part of the first portion (i.e., a radius of curvature of the first light reflection layer), and R2nd is a radius of curvature of the apex part of the annular convex shape of the second portion. It is to be noted that examples of the value of L2nd'/L1st may include, but not limited to, $1<L2nd'/L1st\leq100$, and examples of the value of R1/R2nd' may include, but not limited to, $1<R1/R2nd'\leq100$.

In the light-emitting element of the (1-C)th configuration, examples of shapes of [the first portion/the second portion in a range from a peripheral part to a center part] include the following cases:

(A) [an upwardly convex shape/a downwardly convex shape continuing to an upwardly convex shape, and to a downwardly convex shape];

(B) [an upwardly convex shape/a downwardly convex shape continuing to an upwardly convex shape, downwardly convex shape, and to a line segment];

(C) [an upwardly convex shape/an upwardly convex shape continuing to a downwardly convex shape, an upwardly convex shape, and to a downwardly convex shape];

(D) [an upwardly convex shape/an upwardly convex shape continuing to a downwardly convex shape, an upwardly convex shape, a downwardly convex shape, and to a line segment];

(E) [an upwardly convex shape/a line segment continuing to a downwardly convex shape, an upwardly convex shape, and to a downwardly convex shape]; and (F) [an upwardly convex shape/a line segment continuing to a downwardly convex shape, an upwardly convex shape, a downwardly convex shape, and to a line segment]. It is to be noted that in the light-emitting element, there are also cases where the base part surface terminates at the center part of the second portion.

In the light-emitting element of the (1-B)th configuration or the light-emitting element of the (1-C)th configuration including the preferred configurations described above, a configuration may be adopted in which a bump is provided in a portion on side of the second surface of the second compound semiconductor layer opposed to a convex-shaped portion in the second portion. Alternatively, in the light-emitting element of the first configuration including the preferred configurations described above, a configuration may be adopted in which a bump is provided in a portion on side of the second surface of the second compound semi-conductor layer opposed to the center part of the first portion. Examples of the bump may include a gold (Au) bump, a solder bump, and an indium (In) bump. A method of providing the bump may be a known method. Specifically, the bump is provided on a second pad electrode (to be described later) provided on a second electrode, or on an extending part of the second pad electrode.

Alternatively, a brazing material may be used instead of the bump. Examples of the brazing material may include In (indium, melting point: 157° C.); an indium-gold-based low-melting-point alloy; a tin (Sn)-based high-temperature solder such as $Sn_{80}Ag_{20}$ (melting point: 220° C. to 370° C.)

or $Sn_{95}Cu_5$ (melting point: 227° C. to 370° C.); a lead (Pb)-based high-temperature solder such as $Pb_{97.5}Ag_{2.5}$ (melting point: 304° C.), $Pb_{94.5}Ag_{5.5}$ (melting point: 304° C. to 365° C.), or $Pb_{97.5}Ag_{1.5}Sn_{1.0}$ (melting point: 309° C.); a zinc (Zn)-based high-temperature solder such as $Zn_{95}Al_5$ (melting point: 380° C.); a tin-lead-based standard solder such as $Sn_5Pb_{95}$ (melting point: 300° C. to 314° C.) or $Sn_2Pb_{98}$ (melting point: 316° C. to 322° C.); or a brazing material such as $Au_{88}Ga_{12}$ (melting point: 381° C.) (all the subscripts represent atomic %).

Furthermore, in the light-emitting devices according to the first and second aspects of the present disclosure including the preferred modes and configurations described above, a mode may be adopted in which a first surface of the first compound semiconductor layer configures the base part surface. The light-emitting element having such a configuration is referred to as a "light-emitting element of a second configuration" for the sake of convenience. Alternatively, a configuration may be adopted in which a compound semiconductor substrate is provided between the first surface of the first compound semiconductor layer and the first light reflection layer, and the base part surface is configured by a surface of the compound semiconductor substrate. The light-emitting element having such a configuration is referred to as a "light-emitting element of a third configuration" for the sake of convenience. In this case, for example, a configuration may be adopted in which the compound semiconductor substrate includes a GaN substrate. As the GaN substrate, any of a polar substrate, a semipolar substrate, and a non-polar substrate may be used. A thickness of the compound semiconductor substrate may be, for example, $5\times10^{-5}$ m to $1\times10^{-4}$ m, but is not limited to such a value. Alternatively, a configuration may be adopted in which a base is provided between the first surface of the first compound semiconductor layer and the first light reflection layer. Alternatively, a configuration may be adopted in which the compound semiconductor substrate and the base are provided between the first surface of the first compound semiconductor layer and the first light reflection layer, and the base part surface is configured by a surface of the base. The light-emitting element having such a configuration is referred to as a "light-emitting element of a fourth configuration" for the sake of convenience. Examples of a material included in the base may include a transparent dielectric material such as $TiO_2$, $Ta_2O_5$, or $SiO_2$, a silicone-based resin, and an epoxy-based resin. It is to be noted that the light-emitting element of the second configuration and the light-emitting element of the first configuration may be combined as appropriate, the light-emitting element of the third configuration and the light-emitting element of the first configuration may be combined as appropriate, or the light-emitting element of the fourth configuration and the light-emitting element of the first configuration may be combined as appropriate. Alternatively, a configuration may be adopted in which a structure in which a second substrate having a first surface and a second surface opposed to the first surface and a first substrate having a first surface and a second surface opposed to the first surface are bonded together is provided between the first surface of the first compound semiconductor layer and the first light reflection layer, and the base part surface is configured by the first surface of the first substate. Here, the second surface of the first substrate and the first surface of the second substrate are bonded together, the first light reflection layer is formed on the first surface of the first substrate, and a stacked structure is formed on the second surface of the second substrate. The light-emitting element having such a configuration is referred to as a "light-emitting element of a fifth configuration" for the sake of convenience. Examples of the second substrate may include an InP substrate and a GaAs substrate, and examples of the first substrate may include a Si substrate, a SiC substrate, an AlN substrate, and a GaN substrate.

In the light-emitting elements included in the light-emitting devices according to the first and second aspects of the present disclosure including the preferred modes and configurations described above, a configuration may be adopted in which a figure drawn by the first portion (first convex part) when the base part surface is cut along a virtual plane including a stacking direction of the stacked structure is a part of a circle, a part of a parabola, a part of a sine curve, a part of an ellipse, or a part of a catenary curve. The figure may not strictly be a part of a circle, may not strictly be a part of a parabola, may not strictly be a part of a sine curve, may not strictly be a part of an ellipse, or may not strictly be a part of a catenary curve. That is, a case where the figure is roughly a part of a circle, a case where the figure is roughly a part of a parabola, a case where the figure is roughly a part of a sine curve, a case where the figure is roughly a part of an ellipse, and a case where the figure is roughly a part of a catenary curve are also encompassed by the case where "the figure is a part of a circle, a part of a parabola, a part of a sine curve, roughly a part of an ellipse, or roughly a part of a catenary curve." Portions of these curves may be replaced with line segments. That is, a configuration may be adopted in which a figure drawn by an apex part of the first portion (first convex part) is a part of a circle, a part of a parabola, a part of a sine curve, a part of an ellipse, or a part of a catenary curve, while a figure drawn by a bottom portion of the first portion is a line segment. It is possible to determine the figure drawn by the base part surface by measuring the shape of the base part surface with a measuring instrument, and analyzing thus-obtained data by a least squares method.

Furthermore, in the light-emitting devices according to the first and second aspects of the present disclosure including the preferred modes and configurations described above, it is desirable that a formation pitch of the light-emitting elements be greater than or equal to 3 μm and smaller than or equal to 50 μm, preferably greater than or equal to 5 μm and smaller than or equal to 30 μm, and more preferably greater than or equal to 8 μm and smaller than or equal to 25 km.

Furthermore, in the light-emitting devices according to the first and second aspects of the present disclosure including the preferred modes and configurations described above, it is desirable that a radius of curvature R1 of the center part of the first portion (first convex part) be greater than or equal to $1 \times 10^{-5}$ m, and preferably greater than or equal to $3 \times 10^{-5}$ m. Furthermore, the radius of curvature R1 of the center part of the first portion (first convex part) may be greater than or equal to $3 \times 10^{-4}$ m. Note that in any case, the value of R1 is a value greater than or equal to a value of a resonator length LOR. That is, R1≥LOR holds true. In addition, in the light-emitting elements included in the light-emitting devices according to the first and second aspects of the present disclosure including the preferred modes and configurations described above, it is preferable that $1 \times 10^{-5}$ m LOR be satisfied, where LOR is a resonator length.

In addition, in the light-emitting elements included in the light-emitting devices according to the first and second aspects of the present disclosure including the preferred modes and configurations described above, it is desirable that the radius of curvature R2nd of the center part of the second portion be greater than or equal to $1 \times 10^{-6}$ m, preferably greater than or equal to $3 \times 10^{-6}$ m, and more preferably greater than or equal to $5 \times 10^{-6}$ m, and it is desirable that the radius of curvature R2nd' of the apex part of the annular convex shape of the second portion be greater than or equal to $1 \times 10^{-6}$ m, preferably greater than or equal to $3 \times 10^{-6}$ m, and more preferably greater than or equal to $5 \times 10^{-6}$ m.

Furthermore, in the light-emitting device according to the first aspect of the present disclosure including the preferred modes and configurations described above, it is desirable that the radius of curvature R2 of the center part of the second convex part be greater than or equal to $1 \times 10^{-6}$ m, and preferably greater than or equal to $3 \times 10^{-6}$ m. Furthermore, the radius of curvature R2 may be greater than or equal to $5 \times 10^{-6}$ m.

In addition, in the light-emitting device according to the second aspect of the present disclosure including the preferred modes and configurations described above, it is desirable that a radius of curvature Rdummy of the center part of the second convex part be smaller than or equal to $3 \times 10^{-5}$ m, preferably smaller than or equal to $2 \times 10^{-5}$ m, more preferably greater than or equal to $1 \times 10^{-6}$ m and smaller than or equal to $1.4 \times 10^{-5}$ m. Note that in any case, the value of Rdummy is a value less than a value of a resonator length LOR-dummy of the dummy light-emitting element. That is, Rdummy<LOR-dummy holds true, and 0.05≤Rdummy/LOR-dummy≤0.99 preferably holds true. In addition, specifically, the resonator length LOR-dummy of the dummy light-emitting element preferably satisfies LOR-dummy≥$1.5 \times 10^{-5}$ m.

In the light-emitting elements included in the light-emitting devices according to the first and second aspects of the present disclosure including the preferred modes and configurations described above, a configuration may be adopted in which the stacked structure includes at least one kind of material selected from a group including a GaN-based compound semiconductor, an InP-based compound semiconductor, and a GaAs-based compound semiconductor. Specifically, the stacked structure may have any of the following configurations:

(a) a configuration including a GaN-based compound semiconductor;

(b) a configuration including an InP-based compound semiconductor;

(c) a configuration including a GaAs-based compound semiconductor;

(d) a configuration including a GaN-based compound semiconductor and an InP-based compound semiconductor;

(e) a configuration including a GaN-based compound semiconductor and a GaAs-based compound semiconductor;

(f) a configuration including an InP-based compound semiconductor and a GaAs-based compound semiconductor; and (g) a configuration including a GaN-based compound semiconductor, an InP-based compound semiconductor, and a GaAs-based compound semiconductor.

In the light-emitting elements included in the light-emitting devices according to the first and second aspects of the present disclosure including the preferred modes and configurations described above, a configuration may be adopted in which a value of a thermal conductivity of the stacked structure is higher than a value of a thermal conductivity of the first light reflection layer. The thermal conductivity of a dielectric material included in the first light reflection layer typically has a value of about 10 watts/(m·K) or less. Meanwhile, the thermal conductivity of the GaN-based compound semiconductor included in the stacked structure has a value of about 50 watts/(m·K) to about 100 watts/ (m·K).

In the light-emitting elements included in the light-emitting devices according to the first and second aspects of the present disclosure including the preferred modes and configurations described above, materials of various compound semiconductor layers (including the compound semiconductor substrate) located between the active layer and the first light reflection layer are preferably free from a modulation in a refractive index of 10% or more (free from a difference in refractive index of 10% or more with respect to an average refractive index of the stacked structure). This makes it possible to suppress the occurrence of disturbance of a light field in a resonator.

With the light-emitting elements included in the light-emitting devices according to the first and second aspects of the present disclosure including the preferred modes and configurations described above, it is possible to configure a surface emitting laser element (vertical resonator laser, VCSEL) that emits laser light through the first light reflection layer, or a surface emitting laser element that emits laser light through the second light reflection layer. In some cases, a light-emitting-element manufacturing substrate (to be described later) may be removed.

In the light-emitting elements included in the light-emitting devices according to the first and second aspects of the present disclosure, a configuration may be adopted in which the stacked structure specifically includes, for example, an AlInGaN-based compound semiconductor, as described above. Here, more specific examples of the AlInGaN-based compound semiconductor may include GaN, AlGaN, InGaN, and AlInGaN. Furthermore, boron (B) atoms, thallium (Tl) atoms, arsenic (As) atoms, phosphorus (P) atoms, or antimony (Sb) atoms may be included in these compound semiconductors, as desired. The active layer desirably has a quantum well structure. Specifically, the active layer may have a single quantum well structure (SQW structure), or may have a multi-quantum well structure (MQW structure). While the active layer having the quantum well structure has a structure in which at least one well layer and at least one barrier layer are stacked, examples of a combination of (a compound semiconductor included in the well layer, a compound semiconductor included in the barrier layer) may include $(In_yGa_{(1-y)}N, GaN)$, $(In_yGa_{(1-y)}N, In_zGa_{(1-z)}N)$ [where y>z], and $(In_yGa_{(1-y)}N, AlGaN)$. The first compound semiconductor layer may include a compound semiconductor of a first electrical conductivity type (e.g., n-type), and the second compound semiconductor layer may include a compound semiconductor of a second electrical conductivity type (e.g., p-type) different from the first electrical conductivity type. The first compound semiconductor layer and the second compound semiconductor layer are also referred to as a first cladding layer and a second cladding layer. The first compound semiconductor layer and the second compound semiconductor layer may each be a layer of a single structure, a layer of a multilayer structure, or a layer of a superlattice structure. Furthermore, the first compound semiconductor layer and the second compound semiconductor layer may each include a composition gradient layer or a concentration gradient layer.

Alternatively, examples of group III atoms included in the stacked structure may include gallium (Ga), indium (In), and aluminum (Al). Examples of group V atoms included in the stacked structure may include arsenic (As), phosphorus (P), antimony (Sb), and nitrogen (N). Specific examples thereof may include AlAs, GaAs, AlGaAs, AlP, GaP, GaInP, AlInP, AlGaInP, AlAsP, GaAsP, AlGaAsP, AlInAsP, GaInAsP, AlInAs, GaInAs, AlGaInAs, AlAsSb, GaAsSb, AlGaAsSb, AlN, GaN, InN, AlGaN, GaNAs, and GaInNAs. Examples of the compound semiconductor included in the active layer may include GaAs, AlGaAs, GaInAs, GaInAsP, GaInP, GaSb, GaAsSb, GaN, InN, GaInN, GaInNAs, and GaInNAsSb.

Examples of the quantum well structure may include a two-dimensional quantum well structure, a one-dimensional quantum well structure (a quantum wire), and a zero-dimensional quantum well structure (a quantum dot). Examples of a material included in a quantum well may include, but are not limited to: Si; Se; chalcopyrite-based compounds including CIGS $(CuInGaSe)$, CIS $(CuInSe_2)$, $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$; perovskite-based materials; group III-V compounds including GaAs, GaP, InP, AlGaAs, InGaP, AlGaInP, InGaAsP, GaN, InAs, InGaAs, GaInNAs, GaSb, and GaAsSb; CdSe, CdSeS, CdS, CdTe, $In_2Se_3$, $In_2S_3$, $Bi_2Se_3$, $Bi_2S_3$, ZnSe, ZnTe, ZnS, HgTe, HgS, PbSe, PbS, $TiO_2$, and the like.

The stacked structure is formed on a second surface of the light-emitting-element manufacturing substrate, on a second surface of the compound semiconductor substrate, or on the second surface of the second substrate. It is to be noted that the second surface of the light-emitting-element manufacturing substrate is opposed to the first surface of the first compound semiconductor layer, and a first surface of the light-emitting-element manufacturing substrate is opposed to the second surface of the light-emitting-element manufacturing substrate. In addition, the second surface of the compound semiconductor substrate is opposed to the first surface of the first compound semiconductor layer, and a first surface of the compound semiconductor substrate is opposed to the second surface of the compound semiconductor substrate. In addition, the second surface of the second substrate is opposed to the first surface of the first compound semiconductor layer, and a first surface of the second substrate is opposed to the second surface of the first substrate. Examples of the light-emitting-element manufacturing substrate or the first substrate may include a GaN substrate, a sapphire substrate, a GaAs substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrates, and these substrates with an underlying layer or a buffer layer formed on a surface (a principal surface) thereof, among which the GaN substrate is preferably used owing to its low deficiency density. In addition, examples of the compound semiconductor substrate or the second substrate may include a GaN substrate, InP substrate, and a GaAs substrate. While the GaN substrate is known to vary in characteristic thereof among a polar characteristic, a nonpolar characteristic, and a semipolar characteristic depending on a growth surface, any principal surface (second surface) of the GaN substrate is usable for formation of the compound semiconductor layer. In addition, regarding the principal surface of the GaN substrate, crystal orientation planes that are generally called by such names as A plane, B plane, C plane, R plane, M plane, N plane, and S plane or planes provided by making these planes offset in a specific direction, and the like are also usable, depending on the crystal structure (e.g., a cubic type, a hexagonal type, or the like). Examples of a method of forming various compound semiconductor layers included in the light-emitting element may include, but not limited to, an organometallic chemical vapor deposition method (MOCVD method, Metal Organic-Chemical Vapor Deposition method, MOVPE method, Metal Organic-Vapor Phase Epitaxy method), a molecular beam epitaxy method (MBE method), a hydride vapor phase growth method (HVPE method) in which a halogen contributes to transportation or reaction, an atomic layer deposition method (ALD method, Atomic Layer Deposition method), a migration-enhanced epitaxy method (MEE method, Migration-Enhanced Epitaxy method), a plasma-assisted physical vapor deposition method (PPD method), and the like.

GaAs and InP materials are the same in that they are of a zincblende structure. Principal planes of the compound semiconductor substrate and the second substrate including these materials may include planes provided by making these planes offset in a specific direction, in addition to planes including a (100) plane, a (111)AB plane, a (211)AB plane, a (311)AB plane. It is to be noted that "AB" means that offset directions are different by 90°. Whether a principal material of the plane belongs to the group III or the group V depends on the offset direction. By controlling the crystal plane orientation and film formation conditions, unevenness in composition and dot shape are controllable. As a film formation method, one such as an MBE method, an MOCVD method, an MEE method, or an ALD method is typically used, as with the GaN-based compound materials; however, these methods are not limitative.

Here, examples of an organogallium source gas in the MOCVD method may include trimethylgallium (TMG) gas and triethylgallium (TEG) gas, and examples of a nitrogen source gas may include ammonium gas and hydrazine gas. In forming a GaN-based compound semiconductor layer having an n-type electrical conductivity, for example, it is sufficient if silicon (Si) is added as an n-type impurity (n-type dopant). In forming a GaN-based compound semiconductor layer having a p-type electrical conductivity, for example, it is sufficient if magnesium (Mg) is added as a p-type impurity (p-type dopant). In a case where aluminum (Al) or indium (In) is included as constituent atoms of the GaN-based compound semiconductor layer, it is sufficient if trimethylaluminum (TMA) gas is used as an Al source, or it is sufficient if trimethylindium (TMI) gas is used as an In source. Furthermore, it is sufficient if monosilane gas ($SiH_4$ gas) is used as a Si source, and it is sufficient if biscyclopentadienylmagnesium gas, methylcyclopentadienylmagnesium, or biscyclopentadienylmagnesium ($Cp_2Mg$) is used as a Mg source. It is to be noted that examples of the n-type impurity (n-type dopant) other than Si may include Ge, Se, Sn, C, Te, S, O, Pd, and Po, and examples of the p-type impurity (p-type dopant) other than Mg may include Zn, Cd, Be, Ca, Ba, C, Hg, and Sr.

In a case where an InP-based compound semiconductor or an GaAs-based compound semiconductor is included in the stacked structure, in regard to a group III raw material, TMGa, TEGa, TMIn, TMAl, or the like i.e., an organometallic raw material, is typically used. Further, in regard to a group V raw material, arsine gas ($AsH_3$ gas), phosphine gas ($PH_3$ gas), ammonia ($NH_3$), or the like is used. It is to be noted that in regard to the group V raw material, an organometallic raw material is used in some cases, and examples thereof may include tertiary butyl arsine (TBAs), tertiary butyl phosphine (TBP), dimethylhydrazine (DMHy), trimethylantimony (TMSb), and the like. These materials decompose at low temperatures, and are therefore effective in low temperature growth. As an n-type dopant, monosilane ($SiH_4$) is used as a Si source, and hydrogen selenide ($H_2Se$) or the like is used as a Se source. In addition, dimethylzinc (DMZn), biscyclopentadienylmagnesium ($Cp_2Mg$), or the like is used as a p-type dopant. Candidates for the dopant materials are materials similar to those in the case with the GaN-based compound semiconductor.

It is sufficient if a support substrate for fixing the second light reflection layer thereon includes, for example, any of the various substrates listed as examples of the light-emitting-element manufacturing substrate, or the support substrate may include an insulating substrate including AlN or the like, a semiconductor substrate including Si, SiC, Ge or the like, a metallic substrate, or an alloy-based substrate. It is preferable to use an electrically-conductive substrate, or it is preferable to use a metallic substrate or an alloy-based substrate, from the viewpoints of mechanical property, elastic deformation or plastic deformation property, heat dissipation property, and the like. An example of the thickness of the support substrate may be 0.05 mm to 1 mm. As a method of fixing the second light reflection layer onto the support substrate, any of known methods including a solder bonding method, a normal temperature bonding method, a bonding method using an adhesive tape, a bonding method using wax bonding, a method using an adhesive, and the like is usable; however, from the viewpoint of securing electrical conductivity, it is desirable to employ the solder bonding method or the normal temperature bonding method. For example, in a case where a silicon semiconductor substrate, which is an electrically-conductive substrate, is used as the support substrate, it is desirable, for suppressing warping resulting from a difference in thermal expansion coefficient, to employ a bonding method that allows for bonding at a low temperature of 400° C. or below. In a case where a GaN substrate is used as the support substrate, the bonding temperature may be 400° C. or higher.

In manufacturing the light-emitting devices according to the first and second aspects of the present disclosure, the light-emitting-element manufacturing substrate may be left unremoved, or may be removed after forming the active layer, the second compound semiconductor layer, the second electrode, and the second light reflection layer sequentially on the first compound semiconductor layer. Specifically, after the active layer, the second compound semiconductor layer, the second electrode, and the second light reflection layer are formed sequentially on the first compound semiconductor layer and subsequently the second light reflection layer is fixed onto the support substrate, it is sufficient if the light-emitting-element manufacturing substrate is removed to thereby expose the first compound semiconductor layer (the first surface of the first compound semiconductor layer). Removal of the light-emitting-element manufacturing substrate may be performed by a wet etching method using an aqueous alkali solution such as an aqueous sodium hydroxide solution or an aqueous potassium hydroxide solution, an ammonium solution+an aqueous hydrogen peroxide solution, a sulfuric acid solution+an aqueous hydrogen peroxide solution, a hydrochloric acid solution+an aqueous hydrogen peroxide solution, a phosphoric acid solution+an aqueous hydrogen peroxide solution or the like, a chemical mechanical polishing method (CMP method), a mechanical polishing method, a dry etching method such as a reactive ion etching (RIE) method, a lift-off method using a laser, or the like. Alternatively, a combination of any of these methods may be used to perform removal of the light-emitting-element manufacturing substrate. In a case where the light-emitting-element manufacturing substrate is left unremoved, bonding the first substrate onto the light-emitting-element manufacturing substrate makes it possible to obtain a bonded structure, which includes the light-emitting-element manufacturing substrate, of the second substrate and the first substrate.

A mode may be adopted in which the first electrode electrically coupled to the first compound semiconductor layer is common among a plurality of light-emitting elements, and the second electrode electrically coupled to the second compound semiconductor layer is common among the plurality of light-emitting elements, or is provided individually in the plurality of light-emitting elements, but this is not limitative.

In a case where the light-emitting-element manufacturing substrate remains, it is sufficient if the first electrode is formed on the first surface of the light-emitting-element manufacturing substrate opposed to the second surface thereof, or on the first surface of the compound semiconductor substrate opposed to the second surface thereof. Further, in a case where the light-emitting-element manufacturing substrate does not remain, it is sufficient if the first electrode is formed on the first surface of the first compound semiconductor layer included in the stacked structure. It is to be noted that in this case, because the first light reflection layer is formed on the first surface of the first compound semiconductor layer, it is sufficient if the first electrode is formed in such a manner as to surround the first light reflection layer, for example. The first electrode desirably has a single-layer configuration or a multilayer configuration including, for example, at least one kind of metal (including alloy) selected from a group including gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn), and indium (In). Specific examples thereof may include Ti/Au, Ti/Al, Ti/Al/Au, Ti/Pt/Au, Ni/Au, Ni/Au/Pt, Ni/Pt, Pd/Pt, and Ag/Pd. It is to be noted that a layer preceding "/" more in the multilayer structure is located closer to the active layer. This similarly applies also to the description given below. The first electrode may be formed as a film by, for example, a PVD method such as a vacuum deposition method or a sputtering method.

In a case of forming the first electrode in such a manner as to surround the first light reflection layer, a configuration may be adopted in which the first light reflection layer and the first electrode are in contact with each other. Alternatively, a configuration may be adopted in which the first light reflection layer and the first electrode are spaced apart from each other. In some cases, a state where the first electrode is formed to extend to a position on an edge part of the first light reflection layer, or a state where the first light reflection layer is formed to extend to a position on an edge part of the first electrode may be provided, for example.

A configuration may be adopted in which the second electrode includes a transparent electrically-conductive material. Examples of the transparent electrically-conductive material included in the second electrode may include indium-based transparent electrically-conductive materials [specifically, for example, indium tin oxide (ITO, Indium Tin Oxide, inclusive of Sn-doped $In_2O_3$, crystalline ITO, and amorphous ITO), indium zinc oxide (IZO, Indium Zinc Oxide), indium gallium oxide (IGO), indium-doped gallium zinc oxide (IGZO, In—$GaZnO_4$), IFO (F-doped $In_2O_3$), ITiO (Ti-doped $In_2O_3$), InSn, and InSnZnO], tin-based transparent electrically-conductive materials [specifically, for example, tin oxide (SnOx), ATO (Sb-doped $SnO_2$), and FTO (F-doped $SnO_2$)], zinc-based transparent electrically-conductive materials [specifically, for example, zinc oxide (ZnO, inclusive of Al-doped ZnO (AZO) and B-doped ZnO), gallium-doped zinc oxide (GZO), and AlMgZnO (aluminum oxide- and magnesium oxide-doped zinc oxide)], NiO, $TiO_x$, and graphene. Alternatively, the second electrode may include a transparent electrically-conductive film including gallium oxide, titanium oxide, niobium oxide, antimony oxide, nickel oxide, or the like as a base layer, or a transparent electrically-conductive material such as a spinel-type oxide or an oxide having a $YbFe_2O_4$ structure. It is to be noted that although depending on a layout state of the second light reflection layer and the second electrode, the material of the second electrode is not limited to a transparent electrically-conductive material, and a metal such as palladium (Pd), platinum (Pt), nickel (Ni), gold (Au), cobalt (Co), or rhodium (Rh) may be used. It is sufficient if the second electrode includes at least one of these materials. The second electrode may be formed as a film by, for example, a PVD method such as a vacuum deposition method or a sputtering method. Alternatively, a low-resistance semiconductor layer is usable as a transparent electrode layer, and in this case, specifically, an n-type GaN-based compound semiconductor layer is usable. Furthermore, in a case where a layer adjacent to the n-type GaN-based compound semiconductor layer is of the p-type, joining both layers through a tunnel junction makes it possible to reduce an electrical resistance at an interface. With the second electrode including the transparent electrically-conductive material, it is possible to spread a current in a lateral direction (in-plane direction of the second compound semiconductor layer), and it is thus possible to supply the current efficiently to a current injection region (to be described later).

In order to establish electrical coupling to an external electrode or circuit (hereinafter, sometimes referred to as an "external circuit or the like"), a first pad electrode and a second pad electrode may be provided on the first electrode and the second electrode. The pad electrodes desirably have a single-layer configuration or a multilayer configuration including at least one kind of metal selected from a group including Ti (titanium), aluminum (Al), Pt (platinum), Au (gold), Ni (nickel), and Pd (palladium). Alternatively, the pad electrodes may have a multilayer configuration, such as a multilayer configuration of Ti/Pt/Au, a multilayer configuration of Ti/Au, a multilayer configuration of Ti/Pd/Au, a multilayer configuration of Ti/Pd/Au, a multilayer configuration of Ti/Ni/Au, or a multilayer configuration of Ti/Ni/Au/Cr/Au. In a case where the first electrode includes an Ag layer or Ag/Pd layers, it is preferable to form a cover metal layer including, for example, Ni/TiW/Pd/TiW/Ni on a surface of the first electrode and to form the pad electrode having, for example, a multilayer configuration of Ti/Ni/Au or a multilayer configuration of Ti/Ni/Au/Cr/Au on the cover metal layer.

A light reflection layer (distributed Bragg reflector layer, Distributed Bragg Reflector layer, DBR layer) included in each of the first light reflection layer and the second light reflection layer includes, for example, a semiconductor multilayer film or a dielectric multilayer film. Examples of the dielectric material may include oxides of Si, Mg, Al, Hf, Nb, Zr, Sc, Ta, Ga, Zn, Y, B, Ti, and the like, nitrides of these elements (e.g., $SiN_X$, $AlN_X$, $AlGaN_X$, $GaN_X$, $BN_X$, and the like), fluorides of these elements, and the like. Specific examples thereof may include $SiO_x$, $TiO_x$, $NbO_x$, $ZrO_x$, $TaO_x$, $ZnO_x$, $AlO_x$, $HfO_x$, $SiN_x$, $AlN_x$, and the like. In addition, it is possible to obtain the light reflection layer by alternately stacking two or more kinds of dielectric films including dielectric materials having different refractive indices, among these dielectric materials. For example, a multilayer film of $SiO_X/SiN_Y$, $SiO_X/TaO_X$, $SiO_X/NbO_Y$, $SiO_X/ZrO_Y$, $SiO_X/AlN_Y$, or the like is preferable. In order to obtain a desired light reflectance, it is sufficient if the material of each dielectric film, the film thickness, the number of films to be stacked, etc. are selected appropriately. The thickness of each dielectric film is adjustable appropriately by the material to be used or the like, and is determined by an oscillation wavelength (light emission wavelength) XO and a refractive index n at the oscillation wavelength λ0 of the material used. Specifically, the thickness is preferably an odd multiple of $\lambda 0/(4n)$. For example, in a case of configuring the light reflection layer from $SiO_X/NbO_Y$ in a light-emitting element having an oscillation wavelength λ0 of 410 nm, the thickness may be, for example, about 40 nm to about 70 nm. The number of the films to be stacked may be, for example, two or more, preferably about five to about twenty. The thickness of the light reflection layer as a whole may be, for example, about 0.6 µm to about 1.7 µm. In addition, a light reflectance of the light reflection layer is desirably 95% or more.

It is possible for the light reflection layer to be formed by a known method. Specific examples of the method may include: PVD methods including a vacuum deposition method, a sputtering method, a reactive sputtering method, an ECR plasma sputtering method, a magnetron sputtering method, an ion beam assisted deposition method, an ion plating method, and a laser ablation method; various CVD methods; coating methods including a spraying method, a spin coating method, and a dipping method; a method combining two or more of these methods; and a method combining any of these methods with one or more of total or partial pretreatment, irradiation with an inert gas (Ar, He, Xe or the like) or plasma, irradiation with oxygen gas, ozone gas, or plasma, an oxidation process (heat treatment), and an exposure process.

The light reflection layer is not limited to a particular size or shape, insofar as the light reflection layer covers a current injection region or an element region. Specific examples of a planar shape of the first light reflection layer may include, but not limited to, a circular shape, an elliptical shape, a rectangular shape, and a polygonal shape (triangular shape, tetragonal shape, hexagonal shape, etc.) including a regular polygonal shape. In addition, the planar shape of the first portion may be similar or approximate to the planar shape of the first light reflection layer. Specific examples of a shape of a boundary between the current injection region and a current non-injection inside region, a shape of a boundary between the current non-injection inside region and a current non-injection outside region, and a planar shape of an opening provided in the element region and a current confinement region may include a circular shape, an elliptical shape, a rectangular shape, and a polygonal shape (triangular shape, tetragonal shape, hexagonal shape, etc.) including a regular polygonal shape. The shape of the boundary between the current injection region and the current non-injection inside region, and the shape of the boundary between the current non-injection inside region and the current non-injection outside region are desirably similar shapes. Here, the "element region" refers to a region into which a confined current is injected, or a region in which light is confined due to a refractive index difference or the like, or a region which is within a region sandwiched between the first light reflection layer and the second light reflection layer and in which laser oscillation is generated, or a region which is within the region sandwiched between the first light reflection layer and the second light reflection layer and which actually contributes to laser oscillation.

Side surfaces and exposed surfaces of the stacked structure may be covered with a coating layer (insulating film).

Formation of the coating layer (insulating film) is performable using a known method. The refractive index of a material included in the coating layer (insulating film) is preferably lower than the refractive index of the material included in the stacked structure. Examples of the material included in the coating layer (insulating film) may include $SiO_X$-based materials including $SiO_2$, $SiN_X$-based materials, $SiO_YN_Z$-based materials, $TaO_X$, $ZrO_X$, $AlN_X$, $AlO_X$, and $GaO_X$. Alternatively, examples of the material included in the coating layer (insulating film) may include organic materials such as polyimide resin. Examples of a method of forming the coating layer (insulating film) may include PVD methods including a vacuum deposition method and a sputtering method, and CVD methods. Further, the coating layer (insulating film) may also be formed by a coating method.

Example 1

Example 1 relates to the light-emitting device according to the first aspect of the present disclosure. In addition, Example 1 relates to the light-emitting element of the first configuration, and specifically relates to the light-emitting element of the (1-A)th configuration and the light-emitting element of the second configuration. Furthermore, Example 1 relates to the light-emitting device according to the (1-A)th aspect of the present disclosure.

FIG. 1 illustrates a schematic partial end view of a region including one outer peripheral part of a light-emitting element array in a light-emitting device of Example 1. FIG. 2 illustrates a schematic partial end view of a region including another outer peripheral part of the light-emitting element array in the light-emitting device of Example 1. FIG. 3 illustrates a schematic partial end view of a middle part of the light-emitting element array in the light-emitting device of Example 1. FIG. 4 schematically illustrates a layout of a first light reflection layer and a dummy concave mirror section in the light-emitting device of Example 1. FIG. 5 schematically illustrates a layout of a first light reflection layer in a modification example of the light-emitting device of Example 1. FIG. 6 illustrates a schematic partial end view of a light-emitting element included in the light-emitting element array in the light-emitting device of Example 1. In addition, FIG. 7 (Modification Example-1) and FIG. 9 (Modification Example-2) each illustrate a schematic partial end view of a modification example of the light-emitting element of Example 1. FIG. 8 and FIG. 10 illustrate schematic partial end views of the middle parts of the light-emitting element arrays corresponding to FIG. 7 and FIG. 9.

It is to be noted that in FIG. 4, a first end part that is one end part of a base part surface extending in parallel to a second direction is denoted by reference numeral 90a, a third end part that is another end part of the base part surface extending in parallel to the second direction is denoted by reference numeral 90c, a second end part that is one end part of the base part surface extending in parallel to a first direction is denoted by reference numeral 90b, and a fourth end part that is another end part of the base part surface extending in parallel to the first direction is denoted by reference numeral 90d. Further, FIGS. 11A, 11B, 12, 13, 14A, 14B, 15A, 15B, 15C, 16A, 16B, 17, 18A, and 18B each illustrate a schematic partial end view of a first compound semiconductor layer and the like for describing a method of manufacturing the light-emitting element array of Example 1.

The light-emitting device of Example 1 includes:
a light-emitting element array 10 including a plurality of
light-emitting elements 11A arranged; and
a dummy concave mirror section 43 surrounding the
light-emitting element array 10,
the light-emitting elements 11A each including
a stacked structure 20 including a stack of
a first compound semiconductor layer 21 having a first
surface 21a and a second surface 21b opposed to the
first surface 21a,
an active layer (light-emitting layer) 23 facing the
second surface 21b of the first compound semicon-
ductor layer 21, and
a second compound semiconductor layer 22 having a
first surface 22a facing the active layer 23 and a
second surface 22b opposed to the first surface 22a,
a first light reflection layer 41 formed on a base part
surface 90 located on side of the first surface of the first
compound semiconductor layer 21, and
a second light reflection layer 42 formed on side of the
second surface of the second compound semiconductor
layer 22 and having a flat shape, in which
a first convex part 91A is formed in a portion of the base
part surface 90 in which the first reflection layer 41
functioning as a concave mirror is formed, with respect
to the second surface 21b of the first compound semi-
conductor layer 21, and
a second convex part 93A is formed in a portion of an
extending part 93 of the base part surface in which the
dummy concave mirror section 43 is formed, with
respect to the second surface 21b of the first compound
semiconductor layer 21.

In addition, the plurality of light-emitting elements 11A is
simultaneously driven under the same driving condition.
Specifically, for example, each of a first electrode 31 and a
second electrode 32 that are to be described later may be
common among the light-emitting elements 11A. Note that
this is not limitative, and the plurality of light-emitting
elements may be driven individually or in groups under the
same driving condition or different driving conditions.

In addition, at least the active layer 23 and the second
compound semiconductor layer 22 are not provided in a
region (the extending part 93 of the base part surface)
provided with the dummy concave mirror section 43. More
specifically, the active layer 23, the second compound
semiconductor layer 22, the second light reflection layer 42,
the first electrode 31, and the second electrode 32 are not
provided in the region. That is, the region (the extending part
93 of the base part surface) provided with the dummy
concave mirror section 43 does not have a function as the
light-emitting element 11A.

In addition, in the light-emitting device of Example 1,
H1<H2 is satisfied, where H1 is a height of the first convex
part 91A provided in the base part surface 90, with respect
to a reference virtual plane RP, and H2 is a height of the
second convex part 93A provided in the extending part 93 of
the base part surface, with respect to the reference virtual
plane RP. Specifically, 1.1≤H2/H1 is satisfied, and 1.1≤H2/
H1≤500 is preferably satisfied. More specifically, H1=0.6
µm, H2=2.3 µm, and H2/H1=3.8 hold true. In Example 1, a
first portion 91 and a second portion 92 each have a
concavo-convex shape; therefore, the height H1 of the first
convex part 91A is a height from the virtual plane (reference
virtual plane) RP including a region of the second portion
closest to the second surface 21b of the first compound
semiconductor layer 21 (a region of a bottommost part of the
second portion) to an apex part of the first convex part. In addition, the height H2 of the second convex part 93A is a
distance from a perpendicular bisector of a line segment that
connects a first point e and a second point f, to an intersec-
tion of the second convex part with a perpendicular line
passing through the perpendicular bisector when determin-
ing the intersection of the perpendicular line and the second
convex part 93A.

Furthermore, in the light-emitting device of Example 1, a
concave part 92A is formed in a portion (second portion 92)
of the base part surface 90 in which the first light reflection
layer 41 of the light-emitting element 11A is not formed,
with respect to the second surface 21b of the first compound
semiconductor layer 21. That is, the second portion 92 has
a downwardly convex shape with respect to the second
surface 21b of the first compound semiconductor layer 21.
The light-emitting device of Example 1 includes the light-
emitting element of the first configuration, or specifically,
the light-emitting element of the (1-A)th configuration. The
second portion 92 surrounds the first portion 91. In addition,
a concave part 94 is further formed from a portion of the
base part surface 90 in which the first light reflection layer
41 of a light-emitting element 11A' located in the outermost
peripheral part of the light-emitting element array 10 to a
portion of the extending part 93 of the base part surface
extending from that portion, with respect to the second
surface 21b of the first compound semiconductor layer 21.
In addition, the first surface 21a of the first compound
semiconductor layer 21 configures the base part surface 90
in such a manner.

In Examples 1 to 8, the first compound semiconductor
layer 21 is of a first electrical conductivity type (specifically,
n-type), and the second compound semiconductor layer 22
is of a second electrical conductivity type (specifically,
p-type) different from the first electrical conductivity type.
In addition, light-emitting elements of Examples 1 to 8 each
include a surface emitting laser element (vertical resonator
laser, VCSEL) that emits laser light.

Here, the base part surface 90 has a concavo-convex
shape, and is differentiable. That is, the base part surface 90
is analytically smooth.

In addition, as described above, the first portion 91 of the
base part surface 90 in which the first light reflection layer
41 is formed has an upwardly convex shape with respect to
the second surface 21b of the first compound semiconductor
layer 21, and the second portion 92 of the base part surface
90 has a downwardly convex shape with respect to the
second surface 21b of the first compound semiconductor
layer 21. A center part 91c of the first portion 91 of the base
part surface 90 is located on a vertex of a square lattice (see
FIG. 4), or on a vertex of an equilateral triangular lattice (see
FIG. 5). It is to be noted that in FIG. 4, 4×4 light-emitting
elements 11A and twenty dummy concave mirror sections
43 are illustrated; however, the number of light-emitting
elements 11A and the number of dummy concave mirror
sections 43 are not limited thereto. In the illustrated
example, the dummy concave mirror sections 43 are
arranged in one row to surround the light-emitting element
array 10; however, the dummy concave mirror sections 43
may be arranged in two or more rows.

The first light reflection layer 41 is formed in the first
portion 91 of the base part surface 90; however, an extending
part of the first light reflection layer 41 may be formed in the
second portion 92 of the base part surface 90, or the
extending part of the first light reflection layer 41 may not
be formed in the second portion 92. In Example 1, the
extending part of the first light reflection layer 41 is not
formed in the second portion 92 of the base part surface 90.

In the light-emitting element 11A of Example 1, a boundary 90bd between the first portion 91 and the second portion 92 is definable as:

(1) in a case where the first light reflection layer 41 does not extend to the second portion 92, an outer peripheral part of the first light reflection layer; or (2) in a case where the first light reflection layer 41 extends to the second portion 92, a portion in which an inflection point is present in the base part surface 90 that lies astride the first portion 91 and the second portion 92. Here, the light-emitting element 11A of Example 1 specifically corresponds to the case (1).

In addition, in the light-emitting element 11A of Example 1, examples of shapes of [the first portion 91/the second portion 92 in a range from a peripheral part to a center part] include the following cases:

(A) [an upwardly convex shape/a downwardly convex shape];

(B) [an upwardly convex shape/a downwardly convex shape continuing to a line segment];

(C) [an upwardly convex shape/an upwardly convex shape continuing to a downwardly convex shape];

(D) [an upwardly convex shape/an upwardly convex shape continuing to a downwardly convex shape and to a line segment];

(E) [an upwardly convex shape/a line segment continuing to a downwardly convex shape]; and (F) [an upwardly convex shape/a line segment continuing to a downwardly convex shape and to a line segment], and the light-emitting element 11A of Example 1 specifically corresponds to the case (A).

In the light-emitting element 11A of Example 1, the first surface 21a of the first compound semiconductor layer 21 configures the base part surface 90. A figure drawn by the first portion 91 of the base part surface 90 when the base part surface 90 is cut along a virtual plane including a stacking direction of the stacked structure 20 is differentiable, and more specifically, may be a part of a circle, a part of a parabola, a sine curve, a part of an ellipse, a part of a catenary curve, or a combination of these curves. Portions of these curves may be replaced with a line segment. A figure drawn by the second portion 92 is also differentiable, and more specifically, may also be a part of a circle, a part of a parabola, a part of a sine curve, a part of an ellipse, a part of a catenary curve, or a combination of any of these curves. Portions of these curves may be replaced with a line segment. That is, a configuration is adopted in which a figure drawn by an apex part of the first portion 91 of the base part surface 90 is a part of a circle, a part of a parabola, a part of a sine curve, a part of an ellipse, or a part of a catenary curve, and a figure drawn by a bottom portion of the first portion 91 of the base part surface 90 is a line segment. Furthermore, a configuration may be also adopted in which a figure drawn by a bottommost part of the second portion 92 of the base part surface 90 is a part of a circle, a part of a parabola, a part of a sine curve, a part of an ellipse, or a part of a catenary curve, and a figure drawn by a part above the bottommost part of the second portion 92 of the base part surface 90 is a line segment, or a configuration may be also adopted in which the figure drawn by the bottommost part of the second portion 92 of the base part surface 90 is a line segment, and the figure drawn by the part above the bottommost part of the second portion 92 of the base part surface 90 is a part of a circle, a part of a parabola, a part of a sine curve, a part of an ellipse, or a part of a catenary curve, and also a line segment. Furthermore, the boundary between the first portion 91 and the second portion 92 of the base part surface 90 is also differentiable.

A configuration may be adopted in which the stacked structure 20 includes at least one kind of material selected from a group including a GaN-based compound semiconductor, an InP-based compound semiconductor, and a GaAs-based compound semiconductor. In Example 1, specifically, the stacked structure 20 includes a GaN-based compound semiconductor.

The first compound semiconductor layer 21 includes an n-GaN layer, the active layer 23 includes a five-tiered quantum well structure in which $In_{0.04}Ga_{0.96}N$ layers (barrier layers) and $In_{0.16}Ga_{0.84}N$ layers (well layers) are stacked, and the second compound semiconductor layer 22 includes a p-GaN layer. The first electrode 31 including Ti/Pt/Au is electrically coupled to an external circuit or the like through a first pad electrode (not illustrated) including, for example, Ti/Pt/Au or V/Pt/Au. Meanwhile, the second electrode 32 is formed on the second compound semiconductor layer 22, and the second light reflection layer 42 is formed on the second electrode 32. The second light reflection layer 42 on the second electrode 32 has a flat shape. The second electrode 32 includes a transparent electrically-conductive material, specifically, ITO. On an edge part of the second electrode 32, a second pad electrode 33 including, for example, Pd/Ti/Pt/Au, Ti/Pd/Au, or Ti/Ni/Au for establishing electrical coupling to the external circuit or the like may be formed or coupled (see FIGS. 7 and 9). The first light reflection layer 41 and the second light reflection layer 42 include a stacked structure of a $Ta_2O_5$ layer and a $SiO_2$ layer, or a stacked structure of a SiN layer and a $SiO_2$ layer. Although the first light reflection layer 41 and the second light reflection layer 42 have such a multilayer structure, they are illustrated as a single layer for simplification of the drawings. Respective planar shapes of the first electrode 31, the first light reflection layer 41, the second light reflection layer 42, and an opening 34A provided in an insulating layer (current confinement layer) 34 are circular.

As illustrated in FIGS. 1, 2, 3, and 6, the second electrode 32 is common among the light-emitting elements 11A included in the light-emitting element array 10. The second electrode is coupled to an external circuit or the like through the first pad electrode (not illustrated). The first electrode 31 is also common among the light-emitting elements 11A included in the light-emitting element array 10, and is coupled to an external circuit or the like through the first pad electrode (not illustrated). In the light-emitting element 11A illustrated in FIGS. 1, 2, 3, and 6, light may be emitted to the outside through the first light reflection layer 41, or light may be emitted to the outside through the second light reflection layer 42.

Alternatively, as illustrated in FIGS. 7 and 8, the second electrode 32 is individually formed in the light-emitting elements 101 included in the light-emitting element array 10, and is coupled to an external circuit or the like through the second pad electrode 33. The first electrode 31 is common among the light-emitting elements 11A included in the light-emitting element array 10, and is coupled to an external circuit or the like through the first pad electrode (not illustrated). In the light-emitting element 11A illustrated in FIGS. 7 and 8, light may be emitted to the outside through the first light reflection layer 41, or light may be emitted to the outside through the second light reflection layer 42.

Alternatively, as illustrated in FIGS. 9 and 10, the second electrode 32 is individually formed in the light-emitting elements 11A included in the light-emitting element array 10. On the second pad electrode 33 formed on the second electrode 32, a bump 35 is formed and coupling to an external circuit or the like is established through the bump 35. The first electrode 31 is common among the light-emitting elements 11A included in the light-emitting element array 10, and is coupled to an external circuit or the like through the first pad electrode (not illustrated). The bump 35 is provided in a portion on side of the second surface of the second compound semiconductor layer 22 opposed to the center part 91c of the first portion 91 of the base part surface 90, and covers the second light reflection layer 42. Examples of the bump 35 may include a gold (Au) bump, a solder bump, and an indium (In) bump. A method of providing the bump 35 may be a known method. In the light-emitting element 11A illustrated in FIGS. 9 and 10, light is emitted to the outside through the first light reflection layer 41. It is to be noted that the bump 35 may be provided in the light-emitting element 11A illustrated in FIGS. 1, 2, 3, and 6. Examples of the shape of the bump 35 may include a cylindrical shape, an annular shape, and a hemispherical shape.

A value of a thermal conductivity of the stacked structure 20 is higher than a value of a thermal conductivity of the first light reflection layer 41. The thermal conductivity of the dielectric material included in the first light reflection layer 41 has a value of about 10 watts/(m·K) or less. Meanwhile, the thermal conductivity of the GaN-based compound semiconductor included in the stacked structure 20 has a value of about 50 watts/(m·K) to about 100 watts/(m·K). In addition, a surface roughness Ra of the base part surface 90 is 0.6 nm. Here, the surface roughness Ra is defined in JIS B-610: 2001 and specifically, is measurable on the basis of observations with an AFM or a section TEM.

In the light-emitting element array 10, it is desirable that a formation pitch of the light-emitting elements be greater than or equal to 3 μm and smaller than or equal to 50 μm, preferably greater than or equal to 5 μm and smaller than or equal to 30 μm, and more preferably greater than or equal to 8 μm and smaller than or equal to 25 μm. In addition, a radius of curvature R1 of the center part 91c of the first portion 91 of the base part surface 90 is desirably greater than or equal to $1 \times 10^{-5}$ m. A resonator length LOR preferably satisfies $1 \times 10^{-5}$ m≤LOR. In the light-emitting element array 10 of Example 1 illustrated in FIGS. 4 and 5, parameters of the light-emitting element 11A are as described in Table 1 below. It is to be noted that a diameter of the first light reflection layer 41 is denoted by D1, a radius of curvature of a center part 92c of the second portion 92 of the base part surface 90 is denoted by R2nd, a diameter of the second convex part 93A is denoted by D2, and a radius of curvature of the apex part of the second convex part 93A is denoted by R2. Further, specifications of the light-emitting element 11A of Example 1 illustrated in FIGS. 4 and 5 are described in Tables 2 and 3 below. It is to be noted that "Number of light-emitting elements" refers to the number of light-emitting elements included in a single light-emitting element array, and specifications of the dummy concave mirror section 43 are similar to specifications of the first light reflection layer 41. The same applies hereinafter.

TABLE 1

See FIGS. 3 and 5.

| | |
|---|---|
| Formation pitch | 20 μm |
| Radius of curvature R1 | 43 μm |
| Height H1 | 0.7 μm |

TABLE 1-continued

See FIGS. 3 and 5.

| | |
|---|---|
| Diameter D1 | 19 μm |
| Radius of curvature R2nd | 60 μm |
| Radius of curvature R2 | 14 μm |
| Height H2 | 2.6 μm |
| Diameter D2 | 19 μm |
| Number of light-emitting elements | 10 × 10 |

TABLE 2

See FIG. 4.

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length LOR | 25 μm |
| Oscillation wavelength (light emission wavelength) λ0 | 445 nm |

TABLE 3

SEE FIG. 5.

| | |
|---|---|
| Second light reflection layer 42 | $SiO_2/SiN$ (9 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length LOR | 25 μm |
| Oscillation wavelength (light emission wavelength) λ0 | 488 nm |

In the following, methods of manufacturing the light-emitting element, the light-emitting element array, and the light-emitting device of Example 1 are described with reference to FIGS. 11A, 11B, 12, 13, 14A, 14B, 15A, 15B, 15C, 16A, 16B, 17, 18A and 18B, which are schematic partial end views of the first compound semiconductor layer and the like.

First, after the stacked structure 20 is formed, the second light reflection layer 42 is formed on side of the second surface of the second compound semiconductor layer 22. [Step-100]

Specifically, on a second surface 12b of a compound semiconductor substrate 12 having a thickness of about 0.4 mm, formed is the stacked structure 20 including a GaN-based compound semiconductor and including a stack of the first compound semiconductor layer 21 having the first surface 21a and the second surface 21b opposed to the first surface 21a, the active layer (light emitting layer) 23 facing the second surface 21b of the first compound semiconductor layer 21, and the second compound semiconductor layer 22 having the first surface 22a facing the active layer 23 and the second surface 22b opposed to the first surface 22a. More specifically, it is possible to obtain the stacked structure 20 (see FIG. 11A) by forming the first compound semiconductor layer 21, the active layer 23, and the second compound semiconductor layer 22 sequentially on the second surface 12b of the compound semiconductor substrate 12 by an epitaxial growth method using a known MOCVD method.

[Step-110]

Subsequently, the insulating layer (current confinement layer) 34 having the opening 34A and including SiO₂ is formed on the second surface 22b of the second compound semiconductor layer 22 by a combination of a film formation method, such as a CVD method, a sputtering method, or a vacuum deposition method, and a wet etching method or a dry etching method (see FIG. 11B). A current confinement region (a current injection region 36A and a current non-injection region 36B) is defined by the insulating layer 34 having the opening 34A. That is, the current injection region 36A is defined by the opening 34A.

In order to obtain the current confinement region, an insulating layer (current confinement layer) including an insulating material (e.g., SiO$_X$, SiN$_X$, or AlO$_X$) may be formed between the second electrode 32 and the second compound semiconductor layer 22, or the second compound semiconductor layer 22 may be etched by an RIE method or the like to form a mesa structure. Alternatively, the current confinement region may be formed by partially oxidizing some layers of stacked second compound semiconductor layers 22 from a lateral direction, or a region with a reduced electrical conductivity may be formed by injecting impurities into the second compound semiconductor layer 22 by ion injection. Alternatively, any of them may be combined appropriately. It is to be noted that it is necessary for the second electrode 32 to be electrically coupled to a portion of the second compound semiconductor layer 22 through which a current flows due to current confinement.

[Step-120]

Thereafter, the second electrode 32 and the second light reflection layer 42 are formed on the second compound semiconductor layer 22. Specifically, the second electrode 32 is formed to extend from the second surface 22b of the second compound semiconductor layer 22 exposed at a bottom surface of the opening 34A (current injection region 36A) to a position on the insulating layer 34 by, for example, a lift-off method, and further, the second pad electrode 33 is formed by a combination of a film formation method such as a sputtering method or a vacuum deposition method and a patterning method such as a wet etching method or a dry etching method, as desired. Subsequently, the second light reflection layer 42 is formed to extend from a position on the second electrode 32 to a position on the second pad electrode 33 by a combination of a film formation method such as a sputtering method or a vacuum deposition method and a patterning method such as a wet etching method or a dry etching method. The second light reflection layer 42 on the second electrode 32 has a flat shape. In this way, it is possible to obtain a structure illustrated in FIG. 12. Thereafter, as desired, the bump 35 may be provided in a portion on side of the second surface of the second compound semiconductor layer 22 opposed to the center part 91c of the first portion 91 of the base part surface 90. Specifically, the bump 35 may be formed on the second pad electrode 33 (see FIGS. 9 and 10) formed on the second electrode 32 to cover the second light reflection layer 42. The second electrode 32 is coupled to an external circuit or the like through the bump 35.

[Step-130]

Subsequently, the second light reflection layer 42 is fixed to a support substrate 49 with a bonding layer 48 interposed therebetween (see FIG. 13). Specifically, the second light reflection layer 42 (or the bump 35) is fixed to the support substrate 49 including a sapphire substrate by using the bonding layer 48 including an adhesive.

[Step-140]

Subsequently, the compound semiconductor substrate 12 is thinned by a mechanical polishing method or a CMP method, and further, etching is performed to remove the compound semiconductor substrate 12.

[Step-150]

Thereafter, a first sacrificial layer 81 is formed on the first portion 91 of the base part surface 90 (specifically, the first surface 21a of the first compound semiconductor layer 21) on which the first light reflection layer 41 is to be formed, and thereafter, a surface of the first sacrificial layer is made into a convex shape. Specifically, the first sacrificial layer 81 illustrated in FIG. 14A is obtained by forming a first resist material layer on the first surface 21a of the first compound semiconductor layer 21 and patterning the first resist material layer to allow the first resist material layer to remain on the first portion 91, and thereafter, heat treatment is performed on the first sacrificial layer 81. It is thus possible to obtain a structure illustrated in FIG. 14B. Subsequently, a surface of a first sacrificial layer 81' is subjected to an ashing process (plasma irradiation process) to modify the surface of the first sacrificial layer 81'. This prevents the first sacrificial layer 81' from suffering damage or deformation when a second sacrificial layer 82 is formed in a next step.

[Step-160]

Subsequently, the second sacrificial layer 82 is formed on the second portion 92 of the base part surface 90 exposed between the first sacrificial layers 81' and on the first sacrificial layers 81' to make a surface of the second sacrificial layer 82 into a concavo-convex shape (see FIG. 15A). Specifically, the second sacrificial layer 82 including a second resist material layer having an appropriate thickness is formed over the entire surface. It is to be noted that in the example illustrated in FIG. 4, the second sacrificial layer 82 has an average film thickness of 2 μm, whereas in the example illustrated in FIG. 5, the second sacrificial layer 82 has an average film thickness of 5 μm. Subsequently, a surface of the second sacrificial layer 82 is subjected to an ashing process (plasma irradiation process) to modify the surface of the second sacrificial layer 82. This prevents the second sacrificial layer 82 from suffering damage or deformation when a third sacrificial layer 83 is formed in a next step.

In a case where it is necessary to further increase the radius of curvature R1 of the first portion 91 of the base part surface 90, it is sufficient if [Step-150] and [Step-160] are repeated.

[Step-170]

Subsequently, in a region where the second convex part 93A is to be formed, as illustrated in FIGS. 16A and 16B, the third sacrificial layer 83 including a third resist material layer is formed over the entire surface of the second sacrificial layer 82 formed on a first sacrificial layer 81", and thereafter, exposure to light and development are performed, and the third sacrificial layer 83 is then subjected to heat treatment, which makes it possible to obtain a structure illustrated in FIG. 17. Alternatively, the third sacrificial layer 83 including the third resist material layer is formed over the entire surface of the second sacrificial layer 82, and thereafter, the third sacrificial layer 83 is subjected to exposure to light and development with use of a halftone mask, which also makes it possible to obtain the structure illustrated in FIG. 17. Changing the size and shape of the first sacrificial layer 81" or changing the shape of the finally obtained third sacrificial layer 83 makes it possible to obtain the second convex part 93A having a desired size and shape. It is to be noted that in order to obtain a desired value of the radius of curvature R2 of the second convex part 93A, [Step-170] may be repeated as necessary.

The materials of the first sacrificial layer 81, the second sacrificial layer 82, and the third sacrificial layer 83 are not limited to resist materials, and it is sufficient if a material appropriate in relation to the first compound semiconductor layer 21, such as an oxide material (e.g., $SiO_2$, SiN, $TiO_2$ or the like), a semiconductor material (e.g., Si, GaN, InP, GaAs, or the like), or a metal material (e.g., Ni, Au, Pt, Sn, Ga, In, Al, or the like) is selected. In addition, by using a resist material having an appropriate viscosity as the resist material included in the first sacrificial layer 81, the second sacrificial layer 82, and the third sacrificial layer 83, and by appropriately setting and selecting the thickness of the first sacrificial layer 81, the thickness of the second sacrificial layer 82, the thickness of the third sacrificial layer 83, the diameters of the first sacrificial layer 81', the first sacrificial layer 81", the third sacrificial layer 83 having been subjected to heating, etc., it is possible to set the value of the radius of curvature R1 of the first convex part 91A, the concavo-convex shape of the base part surface 90 (e.g., the diameter D1 and the height H1), the radius of curvature R2 and shape (e.g., diameter and height) of the second convex part 93A to desired values and desired shapes.

[Step-180]

Thereafter, by etching back the third sacrificial layer 83, the second sacrificial layer 82, and the first sacrificial layer 81' and further etching back inwardly from the base part surface 90 (i.e., from the first surface 21a of the first compound semiconductor layer 21 into the first compound semiconductor layer 21), the first convex part 91A is formed in the first portion 91 of the base part surface 90, and at least a concave part (in Example 1, a concave part 92A) is formed in the second portion 92 of the base part surface 90, and the second convex part 93A is formed, with respect to the second surface 21b of the first compound semiconductor layer 21. In this way, it is possible to obtain a structure illustrated in FIG. 15B. The etching back may be performed by a dry etching method such as an RIE method, or by a wet etching method using hydrochloric acid, nitric acid, hydrofluoric acid, phosphoric acid, a mixture of any of these, or the like.

[Step-190]

Next, the first light reflection layer 41 is formed on the first portion 91 of the base part surface 90, and the dummy concave mirror section 43 is formed on the second convex part 93A. Specifically, the first light reflection layer 41 is formed over the entire surface of the base part surface 90 by a film formation method such as a sputtering method or a vacuum deposition method (see FIG. 15C), following which the first light reflection layer 41 is patterned. It is thus possible to obtain the first light reflection layer 41 on the first portion 91 of the base part surface 90 (see FIG. 18A), and to obtain the dummy concave mirror section 43 on the second convex part 93A. Thereafter, the first electrode 31 common among the light emitting elements is formed on the second portion 92 of the base part surface 90 (see FIG. 18B). In the above-described manner, it is possible to obtain the light-emitting element array 10, the light-emitting element 11A, or the light-emitting device of Example 1. By making the first electrode 31 protrude relative to the first light reflection layer 41, it is possible to protect the first light reflection layer 41.

[Step-200]

Thereafter, the support substrate 49 is removed and the light-emitting element arrays 10 are individually separated.

Then, it is sufficient if electrical coupling to an external electrode or circuit (circuit for driving the light-emitting element array) is established. Specifically, it is sufficient if the first compound semiconductor layer 21 is coupled to an external circuit or the like through the first electrode 31 and the unillustrated first pad electrode, and the second compound semiconductor layer 22 is coupled to an external circuit or the like through the second pad electrode 33 or the bump 35. Next, the light-emitting element array of Example 1 is completed by performing packaging or sealing.

In the light-emitting device of Example 1, for example, when the first compound semiconductor layer is subjected to an etching process to form the first convex part and the second convex part in the first compound semiconductor layer, an n-type compound semiconductor layer located in the outermost peripheral part is etched more easily than the light-emitting element located in the middle part. However, in the n-type compound semiconductor layer located in the outermost peripheral part, only the dummy concave mirror section not contributing to light emission is formed; therefore, the light-emitting element array does not cause an issue that the shape of the first light reflection layer differs between the light-emitting element located in the outermost peripheral part and the light-emitting element located in the middle part of the light-emitting element array. That is, it is possible to secure processing uniformity as the entire light-emitting element array, and it is possible to provide a light-emitting device with no luminance unevenness that includes a light-emitting element array including a light-emitting element group having a uniform beam diameter and uniform luminance.

In addition, typically, due to a manufacturing process, the shape on side of the first compound semiconductor layer of the light-emitting element located in the outermost peripheral part of the light-emitting element array is different from the shape on side of the first compound semiconductor layer of the light-emitting element located in another region, and solder wettability upon mounting differs in some cases. In the light-emitting device of Example 1, H2>H1 holds true; therefore, solder wettability is uniform. That is, when the light-emitting device is mounted on, for example, an unillustrated mounting substrate with the dummy concave mirror section interposed therebetween with use of solder (it is to be noted that in such a case, light from the light-emitting element is emitted to the outside through the second light reflection layer 42), the dummy concave mirror section is in contact with the mounting substrate, which generates a gap between the light-emitting element and the mounting substrate. As a result, the solder enters into the gap, which makes it possible to achieve uniformity of the solder between the light-emitting element and the mounting substrate, and to mount the light-emitting element on the mounting substrate with reliability. Thus, stress and heat to be applied during operation of the light-emitting device, and other environmental factors are uniformized, and characteristics (including reliability) of each light-emitting element are uniformized.

In addition, in the light-emitting element of Example 1, the base part surface has a concavo-convex shape and is differentiable. By virtue of this, in a case where an external force is applied to the light-emitting element due to some cause, an issue that would occur with the existing technology, such as an issue of stress concentrating on a rising portion of the first convex part, is avoidable with reliability, and therefore there is no possibility of damage to the first compound semiconductor layer and the like. In a case where the light-emitting element array, in particular, is coupled or bonded to an external circuit or the like by using a bump, it is necessary to apply a high load (e.g., about 50 MPa) to the light-emitting element array at the time of bonding. With the light-emitting element array of Example 1, there is no possibility of damage to the light-emitting element array even if such a high load is applied. Furthermore, because the base part surface has a concavo-convex shape, generation of stray light is suppressed, and it is therefore possible to prevent the occurrence of light crosstalk between the light-emitting elements.

In a case of arranging light-emitting elements at narrow pitches in a light-emitting element array, it is not possible for the pitch to exceed the footprint diameter of the first sacrificial layer. Therefore, in order to reduce the pitch of the light-emitting element array, it is necessary to reduce the footprint diameter. Incidentally, the radius of curvature R1 of the center part of the first portion of the base part surface has a positive correlation with the footprint diameter. That is, a decrease in footprint diameter with decreasing pitch results in a tendency of the radius of curvature R1 to become smaller. For example, at a footprint diameter of 24 µm, a radius of curvature R1 of about 30 µm has been reported. Further, a radiation angle of light emitted from the light-emitting element has a negative correlation with the footprint diameter. That is, a decrease in footprint diameter with decreasing pitch results in a tendency of the radius of curvature R1 to become smaller to enlarge a FFP (Far Field Pattern). A radius of curvature R1 of less than m may result in a radiation angle of several degrees or more. Depending on the application field of the light-emitting element array, there may be cases where a narrow radiation angle of 2 to 3 degrees or less is demanded of light emitted from the light-emitting element.

According to Example 1, the first portion is formed in the base part surface with use of the first sacrificial layer and the second sacrificial layer. This makes it possible to obtain the first light reflection layer that is free from distortion and has a large radius of curvature R1 even in a case where the light-emitting elements are arranged at narrow pitches. Accordingly, it is possible for light emitted from the light-emitting elements to be at a narrow radiation angle of 2 to 3 degrees or less, or a radiation angle as narrow as possible. This makes it possible to provide a light-emitting element with a narrow FFP, a light-emitting element with high orientability, and a light-emitting element with high beam quality. Furthermore, because a wide light emission region is obtainable, it is possible to achieve increased light output and improved light emission efficiency of the light-emitting element, and to achieve increased light output and improved efficiency of the light-emitting element.

Moreover, because it is possible to make the height (thickness) of the first portion lower (thinner), empty spaces (voids) are less likely to occur in the bump when the light-emitting element is coupled or bonded to an external circuit or the like by using the bump. This makes it possible to achieve improved thermal conductivity, and facilitates mounting.

Further, in the light-emitting element of Example 1, because the first light reflection layer serves as a concave mirror, it is possible to cause light that spreads through diffraction with the active layer as a start point and enters the first light reflection layer to be reflected toward the active layer and condensed onto the active layer with reliability. It is thus possible to avoid an increase in diffraction loss and to perform laser oscillation with reliability. Owing to having a long resonator, it is also possible to avoid an issue of thermal saturation. Moreover, because it is possible to make the resonator length longer, allowance in the manufacturing process of the light-emitting element is enhanced, resulting in that improved yield is achievable. It is to be noted that "diffraction loss" refers to a phenomenon in which laser light reciprocating in a resonator is gradually dissipated to the outside of the resonator, because light generally tends to spread due to a diffraction effect. In addition, it is possible to suppress stray light, and to suppress light crosstalk between the light emitting elements. Here, if light emitted from a certain light-emitting element comes into an adjacent light-emitting element and is absorbed by the active layer of the adjacent light-emitting element, or is coupled to a resonance mode, the light emitting operation of the adjacent light-emitting element is affected, and noise is generated. Such a phenomenon is called light crosstalk. Moreover, the apex part of the convex part (protruding part) is, for example, a spherical surface, and therefore exhibits the effect of confining light in a lateral direction with reliability.

Further, although a GaN substrate is used in the manufacturing process of the light-emitting element, no GaN-based compound semiconductor is formed by a method for lateral epitaxial growth, such as an ELO method. This makes it possible to use not only a polar GaN substrate but also a semipolar GaN substrate and a nonpolar GaN substrate, as the GaN substrate. While the use of the polar GaN substrate tends to lower the light emission efficiency due to a piezo-electric effect in the active layer, the use of the nonpolar GaN substrate or the semipolar GaN substrate makes it possible to solve or mitigate such an issue.

Example 2

Example 2 is a modification of Example 1, and relates to the light-emitting device of the (1-B)th aspect. FIG. 19 illustrates a schematic partial end view of a region including one outer peripheral part of a light-emitting element array in a light-emitting device of Example 2. FIG. 20 illustrates a schematic partial end view of a region including another outer peripheral part of the light-emitting element array in the light-emitting device of Example 2. In addition, FIG. 21 schematically illustrates a layout of a first light reflection layer and a dummy first light reflection layer in the light-emitting device of Example 2. It is to be noted that the layout of the first light reflection layer and the dummy concave mirror section in the light-emitting device of Example 2 may be similar to that illustrated in FIG. 5, and a schematic partial end view of a middle part of the light-emitting element array in the light-emitting device of Example 2 may be similar to that illustrated in FIG. 3.

In the light-emitting device of Example 2, a plurality of light-emitting elements 11A is arranged in a two-dimensional matrix pattern in the first direction and the second direction different from the first direction, and H2-A>H2-C>H1 is satisfied, where end parts of the base part surface 90 extending in parallel to the second direction are referred to as a first end part 90a and a third end part 90c, end parts of the base part surface 90 extending in parallel to the first direction are referred to as a second end part 90b and a fourth end part 90d, H1 is a height of a first convex part 91A1 provided in the base part surface 90, H2-A is a height of a second convex part 93AA provided in the extending part 93 of the base part surface extending from the first end part 90a, and H2-C is a height of a second convex part 93AC provided in the extending part 93 of the base part surface extending from the third end part 90c. In addition, in this case, values of H2-B and H2-D are decreased from the first end part 90a toward the third end part 90c, where H2-B is a height of a second convex part 93AB provided in the extending part 93 of the base part surface extending from the second end part 90*b*, and H2-D is a height of a second convex part 93AD provided in the extending part 93 of the base part surface extending from the fourth end part 90*d*.

Parameters of the light-emitting element 11A of Example 2 may be similar to those described in Table 2. In addition, specifications of the light-emitting element 11A and dummy concave mirror sections 43A and 43C of Example 2 illustrated in FIG. 21 are described in Table 4 below. It is to be noted that in the following table, "Diameter D2-A" and "Radius of curvature R2-A" refer to values of a diameter and a radius of curvature of the dummy concave mirror section 43A formed on the second convex part 93AA, and "Diameter D2-C" and "Radius of curvature R2-C" refer to values of a diameter and a radius of curvature of the dummy concave mirror section 43C formed on the second convex part 93AC.

TABLE 4

| See FIG. 21. | |
| --- | --- |
| Formation pitch | 20 μm |
| Radius of curvature R1 | 43 μm |
| Height H1 | 0.7 μm |
| Diameter D1 | 19 μm |
| Radius of curvature R2nd | 60 μm |
| Radius of curvature R2-A | 24 μm |
| Height H2-A | 4 μm |
| Diameter D2-A | 25 μm |
| Radius of curvature R2-C | 30 μm |
| Height H2-C | 3.5 μm |
| Diameter D2-C | 25 μm |
| Number of light-emitting elements | 10 × 10 |

For the light-emitting element in the light-emitting device of Example 2, for example, when the structure illustrated in FIG. 17 is obtained by forming the third sacrificial layer 83 on the entire surface of the second sacrificial layer 82, and thereafter subjecting the third sacrificial layer 83 to exposure to light and development in a step similar to [Step-170] of Example 1, it is sufficient if the thickness of the third sacrificial layer 83 for forming second convex parts 93AA, 93AB, 93AC, and 93AD is changed by controlling an amount of exposure of the third sacrificial layer 83 to light with use of a halftone mask. Alternatively, it is sufficient if the size and shape of the first sacrificial layer 81" is changed in accordance with the size and shape of the second convex part to be formed.

In the light-emitting device of Example 2, a light-emitting device that satisfies H2-A>H2-C>H1 is obtained; therefore, in addition to the effects described in Example 1, when the light-emitting device is mounted on, for example, an unillustrated mounting substrate with the dummy concave mirror section 43 interposed therebetween, the light-emitting device is in an inclined state with respect to the mounting substrate. As a result, the light-emitting device is able to emit light in a desired inclined direction with respect to the mounting substrate.

Specifically, a distance from a center part of the dummy concave mirror section 43A to a center part of the dummy concave mirror section 43C is 11×20 (μm)=220 m. In addition, a value ΔH of [(height H2-A)−(height H2-C)] is 0.5 μm. Accordingly, an inclination θ of the light-emitting device with respect to the mounting substrate is tan(θ)=ΔH/220, and θ=2.2 degrees holds true.

Example 3

Example 3 is also a modification of Example 1, and relates to a light-emitting device according to the (1-C)th aspect of the present disclosure. FIG. 22 illustrates a schematic partial end view of a region including another outer peripheral part of a light-emitting element array in a light-emitting device of Example 3. It is to be noted that a schematic partial end view of a region including one outer peripheral part is similar to that illustrated in FIG. 19. In addition, a layout of a first light reflection layer and a dummy concave mirror section in the light-emitting device of Example 3 may be similar to that illustrated in FIG. 21 or FIG. 5, and a schematic partial end view of a middle part of the light-emitting element array in the light-emitting device of Example 3 may be similar to that illustrated in FIG. 3.

In the light-emitting device of Example 3, a plurality of light-emitting elements 11A is arranged in a two-dimensional matrix pattern in the first direction and the second direction different from the first direction, and H2-A>H1>H2-C is satisfied, where end parts of the base part surface 90 extending in parallel to the second direction are referred to as the first end part 90*a* and the third end part 90*c*, end parts of the base part surface 90 extending in parallel to the first direction are referred to as the second end part 90*b* and the fourth end part 90*d*, H1 is the height of the first convex part 91A provided in the base part surface 90, H2-A is the height of the second convex part 93AA provided in the extending part 93 of the base part surface extending from the first end part 90*a*, and H2-C is the height of the second convex part 93AC provided in the extending part 93 of the base part surface extending from the third end part 90*c*. In addition, the values of H2-B and H2-D are further decreased from the first end part 90*a* toward the third end part 90*c*, where H2-B is a height of a second convex part provided in the extending part 93 of the base part surface extending from the second end part 90*b*, and H2-D is a height of a second convex part provided in the extending part 93 of the base part surface extending from the fourth end part 90*d*.

The light-emitting element 11A of Example 3 may be similar to that described in Table 2. In addition, specifications of the light-emitting element 11A and the dummy concave mirror sections 43A and 43C of Example 3 illustrated in FIG. 21 are described in Table 5 below.

TABLE 5

| See FIG. 21. | |
| --- | --- |
| Formation pitch | 20 μm |
| Radius of curvature R1 | 40 μm |
| Height H1 | 1 μm |
| Diameter D1 | 19 μm |
| Radius of curvature R2nd | 60 μm |
| Radius of curvature R2-A | 24 μm |
| Height H2-A | 4 μm |
| Diameter D2-A | 25 μm |
| Radius of curvature R2-C | 55 μm |
| Height H2-C | 0.7 μm |
| Diameter D2-C | 25 μm |
| Number of light-emitting elements | 10 × 10 |

For the light-emitting element in the light-emitting device of Example 3, for example, when the structure illustrated in FIG. 17 is obtained by forming the third sacrificial layer 83 on the entire surface of the second sacrificial layer 82, and thereafter subjecting the third sacrificial layer 83 to exposure to light and development in a step similar to [Step-170] of Example 1, it is sufficient if the thickness of the third sacrificial layer 83 for forming second convex parts 93AA, 93AB, 93AC, and 93AD is changed by controlling an amount of exposure of the third sacrificial layer 83 to light with use of a halftone mask. Alternatively, it is sufficient if the size and shape of the first sacrificial layer 81" is changed in accordance with the size and shape of the second convex part to be formed.

In the light-emitting device of Example 3, a light-emitting device that satisfies H2-A>H2-C>H1 is obtained. Changing the height H2-A of the second convex part 93AA and the height H2-C of the second convex part 93AC makes it possible to control the inclination θ of the light-emitting device with respect to the mounting substrate.

Example 4

Example 4 is also a modification of Example 1, and relates to a light-emitting device according to the (1-D)th aspect of the present disclosure. A schematic partial end view of a region including one and another outer peripheral parts of a light-emitting element array in a light-emitting device of Example 4 is similar to that illustrated in FIG. 22. It is to be noted that a layout of a first light reflection layer and a dummy concave mirror section in the light-emitting device of Example 3 may be similar to that illustrated in FIG. 21 or FIG. 5, and a schematic partial end view of a middle part of the light-emitting element array in the light-emitting device of Example 4 may be similar to that illustrated in FIG. 3.

In the light-emitting device of Example 4, H2<H1 is satisfied, where H1 is the height of the first convex part 91A provided in the base part surface 90 and H2 is the height of the second convex part 93A provided in the extending part 93 of the base part surface. In addition, $$H2/H1 \le 0.9$$

is further satisfied, and $$0.02 \le H2/H1 \le 0.9$$

is preferably satisfied. It is to be noted that in FIG. 22, H2 is represented as H2-C.

Parameters of the light-emitting element 11A of Example 4 may be similar to those described in Table 2. In addition, specifications of the light-emitting element 11A and the dummy concave mirror section 43 of Example 4 illustrated in FIG. 21 are described in Table 6 below.

TABLE 6

See FIG. 21.

| | |
|---|---|
| Formation pitch | 20 µm |
| Radius of curvature R1 | 43 µm |
| Height H1 | 0.7 µm |
| Diameter D1 | 19 µm |
| Radius of curvature R2nd | 60 µm |
| Radius of curvature R2 | 14 µm |
| Height H2 | 4 µm |
| Diameter D2 | 19 µm |
| Number of light-emitting elements | 25 × 25 |

For the light-emitting element in the light-emitting device of Example 4, for example, it is sufficient if the size and shape of the first sacrificial layer 81" is changed in accordance with the size and shape of the second convex part to be formed in a step similar to [Step-160] of Example 1. In addition, it is sufficient if steps similar to [step-160] and [step-170] of example 1 in which the third sacrificial layer 93 is formed on the entire surface of the second sacrificial layer 82 and thereafter the third sacrificial layer 83 is subjected to exposure to light and development are executed.

In the light-emitting device of Example 4, a light-emitting device that satisfies H2/H1 is obtained, which makes it possible to control the inclination θ of the light-emitting device with respect to the mounting substrate.

Example 5

Example 5 relates to a light-emitting device according to the second aspect of the present disclosure. FIG. 23 illustrates a schematic partial end view of a region including one and another outer peripheral parts of a light-emitting element array in a light-emitting device of Example 5. It is to be noted that a layout of a first light reflection layer and a dummy concave mirror section in the light-emitting device of Example 5 is similar to that schematically illustrated in FIG. 4 or FIG. 5, and a schematic partial end view of a middle part of the light-emitting element array in the light-emitting device of Example 5 may be similar to that illustrated in FIG. 3.

The light-emitting device of Example 5 includes:
a light-emitting element array 10 including a plurality of light-emitting elements 11A arranged; and
a dummy light-emitting element 13 surrounding the light-emitting element array 10,
the light-emitting elements 11A and the dummy light-emitting element 13 each including
a stacked structure 20 including a stack of
a first compound semiconductor layer 21 having a first surface 21a and a second surface 21b opposed to the first surface 21a,
an active layer (light-emitting layer) 23 facing the second surface 21b of the first compound semiconductor layer 21, and
a second compound semiconductor layer 22 having a first surface 22a facing the active layer 23 and a second surface 22b opposed to the first surface 22a.
In addition, the light-emitting elements 11A each further include
a first light reflection layer 41 formed on a base part surface 90 located on side of the first surface 21a of the first compound semiconductor layer 21, and
a second light reflection layer 42 formed on side of the second surface 21b of the second compound semiconductor layer 22 and having a flat shape, in which
a first convex part 91A is formed in a portion of the base part surface 90 in which the first reflection layer 41 functioning as a concave mirror is formed, with respect to the second surface 21b of the first compound semiconductor layer 21.
In addition, the dummy light-emitting element 13 further includes
a dummy first light reflection layer 41' including a dummy concave mirror section 43' formed on the extending part 93 of the base part surface located on side of the first surface 21a of the first compound semiconductor layer 21, and
the second light reflection layer 42 formed on side of the second surface 21b of the second compound semiconductor layer 22 and having a flat shape, in which
the second convex part 93A is formed in a portion of the extending part 93 of the base part surface in which the dummy first light reflection layer 41' is formed, with respect to the second surface 21b of the first compound semiconductor layer 21.
In addition, the dummy light-emitting element 13 does not emit light even though a current flows through the stacked structure 20. That is, the dummy light-emitting element 13 has a structure similar to that of the light-emitting element 11A, but does not have a function as a light-emitting element.

In addition, in the dummy light-emitting element 13, a value of a radius of curvature Rdummy of a center part of the second convex part 93A provided in the extending part 93 of the base part surface is less than a value of a resonator length LOR-dummy. That is, Rdummy<LOR-dummy holds true. Accordingly, the dummy light-emitting element 13 does not emit light even though a current flows through the stacked structure 20. That is, in the dummy light-emitting element 13, confinement becomes excessive to generate diffraction loss. This causes the dummy light-emitting element 13 not to emit light. Furthermore, the plurality of light-emitting elements 11A and the dummy light-emitting element 13 are driven simultaneously under the same driving condition. However, this is not limitative, and a mode may be adopted in which the plurality of light-emitting elements 11A and the dummy light-emitting element 13 are driven individually or in groups under the same driving condition or different driving conditions. In addition, a mode may be adopted in which the plurality of light-emitting elements included in the light-emitting element array is driven individually or in groups under the same driving condition or different driving conditions. Here, it is desirable that the radius of curvature Rdummy of the center part of the second convex part 93 be smaller than or equal to $3 \times 10^{-5}$ m, preferably smaller than or equal to $2 \times 10^{-5}$ m, more preferably greater than or equal to $1 \times 10^{-6}$ m and smaller than or equal to $1.4 \times 10^{-5}$ m. Specifically, Rdummy=14 m holds true.

In addition, LOR-dummy=25 m holds true. Rdummy<LOR-dummy is satisfied.

Parameters of the light-emitting element 11A and the dummy light-emitting element 13 of Example 5 are as described in Table 7 below. In addition, specifications of the light-emitting element 11A and the dummy light-emitting element 13 of Example 5 illustrated in FIG. 4 are described in Table 7 below. In the illustrated example, the dummy light-emitting elements 13 are arranged in one row to surround the light-emitting element array 10; however, the dummy light-emitting elements 13 may be arranged in two or more rows. It is to be noted that a subscript "dummy" means specifications of the dummy light-emitting element.

TABLE 7

| See FIG. 4. | |
| --- | --- |
| Formation pitch | 20 μm |
| Radius of curvature R1 | 50 μm |
| Height H1 | 1 μm |
| Diameter D1 | 18 μm |
| Radius of curvature Rdummy | 10 μm |
| Height Hdummy | 4 μm |
| Diameter Ddummy | 18 μm |
| Number of light-emitting elements | 25 × 25 |
| [Light-emitting element and dummy light-emitting element] | |
| Second light reflection layer 42 | SiO₂/Ta₂O₅ (11.5 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | SiO₂/Ta₂O₅ (14 pairs) |
| [Light-emitting element] | |
| Resonator length LOR | 25 μm |
| Oscillation wavelength (light emission wavelength) λ0 | 445 nm |
| [Dummy light-emitting element] | |
| Resonator length LOR-dummy | 28 μm |

It is possible to manufacture the light-emitting device of Example 5 by a method substantially similar to the method of manufacturing the light-emitting device described in Example 1, and detailed description thereof is therefore omitted. Changing the size and shape of the first sacrificial layer 81" or changing the shape of the finally obtained third sacrificial layer 83 makes it possible to obtain the second convex part 93A having a desired size and shape.

Incidentally, as described above, in a light-emitting element array in which a plurality of light-emitting elements each including a surface emitting laser element is arranged in a two-dimensional matrix pattern, when the plurality of light-emitting elements is driven simultaneously under the same driving condition, in some cases, light intensity of the light-emitting elements located in the outermost peripheral part is higher than light intensity of the light-emitting elements located in another region. This state is illustrated in FIGS. 36A, 36B, 36C, and 36D. FIG. 36A illustrates a state in which a current does not flow through the light-emitting element array. FIG. 36B illustrates a state in which a current I0 flows through the light-emitting element array. FIG. 36C illustrates a state in which a current 5×I0 flows through the light-emitting element array. FIG. 36D illustrates a state in which a current 10×I0 flows through the light-emitting element array. Further, in a case where such a phenomenon occurs, uniformity of light intensity as the entire light-emitting element array deteriorates. It is considered that such a phenomenon causes that even though the plurality of light-emitting elements is driven simultaneously under the same condition, current density of a current flowing through the light-emitting element located in the outermost peripheral part of the light-emitting element array is higher than current density of a current flowing through the light-emitting element located in another region, resulting in that electric field intensity of the light-emitting element located in the outmost peripheral part of the light-emitting element array becomes higher than electric field intensity of the light-emitting element located in the other region, which causes a photon recycling effect. In the photon recycling effect, light generated upon recombining electrons and holes by voltage application activates acceptors and generates holes, and holes are increased to decrease resistance in a region where the holes are increased; therefore, current density is increased, and light is further generated in a region where current density is increased, which activates acceptors, and further generates holes. Repeating such a cycle is called the photon recycling effect.

In the light-emitting device of Example 5, the value of the radius of curvature Rdummy of the center part of the second convex part in the dummy light-emitting element is set to less than the value of the resonator LOR-dummy in the dummy light-emitting element, which causes the dummy light-emitting element not to emit light even though a current flows through the dummy light-emitting element. As a result, in the light-emitting element array, when the plurality of light-emitting elements is driven simultaneously under the same condition, it is possible to suppress occurrence of such a phenomenon that light intensity of the light-emitting element located in the outermost peripheral part becomes higher than light intensity of the light-emitting element in another region, which makes it possible to obtain uniform light emission in the light-emitting device.

Furthermore, a layout state of the light-emitting elements (including the dummy light-emitting element) present around a light-emitting element 11A' located in the outer peripheral part of the light-emitting element array 10 and a layout state of the light-emitting elements present around the light-emitting element 11A located in the middle part of the light-emitting element array 10 are almost the same. Accordingly, application of stress, application of heat, and the like are substantially the same in the light-emitting element 11A' located in the outermost peripheral part of the light-emitting element array 10 and the light-emitting element 11A located in the middle part of the light-emitting element array 10, which makes it possible to obtain more uniform light emission in the light-emitting device.

Except for the above points, it is possible for the configuration or structure of the light-emitting device of Example 5 to be substantially similar to that of the light-emitting device of Example 1, and detailed description thereof is therefore omitted. In addition, any of the configurations and structures of the light-emitting devices described in Examples 2 to 4 is applicable to the light-emitting device of Example 5, and it is possible for the light-emitting device of Example 5 to achieve the effects of the light-emitting devices described in Examples 1 to 4 in addition to the effects described above.

Example 6

Example 6 is a modification of Examples 1 to 5, and relates to a light-emitting device of the (1-B)th configuration. FIG. 24 illustrates a schematic partial end view of a light-emitting element 11B of Example 6. FIG. 25 illustrates a schematic partial end view of the light-emitting element array of Example 6. In addition, FIGS. 26 and 28 each illustrate a schematic plan diagram of a layout of a first portion and a second portion of a base part surface of the light-emitting element array of Example 6. FIGS. 27 and 29 each illustrate a schematic plan diagram of a layout of a first light reflection layer and a first electrode in the light-emitting element array of Example 6. Furthermore, FIGS. 30A, 30B, 31A, 31B, 32A, and 32B each illustrate a schematic partial end view of a first compound semiconductor layer and the like for describing a method of manufacturing the light-emitting element array of Example 6.

In the light-emitting element 11B of Example 6, the second portion 92 of the base part surface 90 has a downwardly convex shape, and an upwardly convex shape extending from the downwardly convex shape, toward the center part of the second portion 92, with respect to the second surface 21b of the first compound semiconductor layer 21. In addition, $$L2nd > L1st$$

is satisfied, where L1st is a distance from the second surface 21b of the first compound semiconductor layer 21 to the center part 91c of the first portion 91 of the base part surface 90, and L2nd is a distance from the second surface 21b of the first compound semiconductor layer 21 to the center part 92c of the second portion 92 of the base part surface 90. Alternatively, $$R1 > R2nd$$

is satisfied, where R1 is a radius of curvature of the center part 91c of the first portion 91 of the base part surface 90 (i.e., a radius of curvature of the first light reflection layer 41), and R2nd is a radius of curvature of the center part 92c of the second portion 92 of the base part surface 90. It is to be noted that examples of a value of L2nd/L1st may include, but not limited to, 1<L2nd/L1st≤100; and examples of a value of R1/R2nd may include, but not limited to, 1<R1/R2nd≤100.

Specifically, for example, $$L2nd/L1st = 1.05, \text{ and}$$

$$R1/R2nd = 10$$

hold true.

In the light-emitting element 11B of Example 6, the center part 91c of the first portion 91 of the base part surface 90 is located on a vertex of a square lattice (see FIG. 26), and in this case, the center part 92c (represented by a circular shape in FIG. 26) of the second portion 92 of the base part surface 90 is located on a vertex of a square lattice. Alternatively, the center part 91c of the first portion 91 of the base part surface 90 is located on a vertex of an equilateral triangular lattice (see FIG. 28), and in this case, the center part 92c (represented by a circular shape in FIG. 28) of the second portion 92 of the base part surface 90 is located on a vertex of an equilateral triangular lattice. Furthermore, the second portion 92 of the base part surface 90 has a downwardly convex shape toward the center part of the second region 92. Such a region is denoted by reference numeral 92b in FIGS. 26 and 28.

In the light emitting element 11B of Example 6, examples of the shapes of [the first portion 91/the second portion 92 in a range from a peripheral part to a center part] include the following cases:

(A) [an upwardly convex shape/a downwardly convex shape continuing to an upwardly convex shape];

(B) [an upwardly convex shape/an upwardly convex shape continuing to a downwardly convex shape, and to an upwardly convex shape]; and (C) [an upwardly convex shape/a line segment continuing to a downwardly convex shape, and to an upwardly convex shape], and the light-emitting element 11B of Example 6 specifically corresponds to the case (A).

In the light emitting element 11B of Example 6, the bump 35 is provided in a portion on side of the second surface of the second compound semiconductor layer 22 opposed to a convex-shaped portion in the second portion 92 of the base part surface 90. However, the bump 35 is not necessarily provided.

As illustrated in FIG. 24, the second electrode 32 is common among the light-emitting elements 11B included in the light-emitting element array 10, or as illustrated in FIG. 25, the second electrode 32 is individually formed in the light-emitting elements 11A included in the light-emitting element array 10, and is electrically coupled to an external circuit or the like through the bump 35. The first electrode 31 is common among the light-emitting elements 11B included in the light-emitting element array 10, and is coupled to an external circuit or the like through the first pad electrode (not illustrated). The bump 35 is formed in a portion on side of the second surface of the second compound semiconductor layer 22 opposed to a convex-shaped portion 92c in the second portion 92 of the base part surface 90. In the light-emitting element 11B illustrated in FIG. 24, light may be emitted to the outside through the first light reflection layer 41 or may be emitted to the outside through the second light reflection layer 42. Examples of the shape of the bump 35 may include a cylindrical shape, an annular shape, and a hemispherical shape.

In addition, it is desirable that the radius of curvature R2nd of the center part 92c of the second portion 92 of the base part surface 90 be greater than or equal to $1 \times 10^{-6}$ m, preferably greater than or equal to $3 \times 10^{-6}$ m, and more preferably greater than or equal to $5 \times 10^{-6}$ m, and specifically, the radius of curvature R2nd=3 μm.

In the light-emitting element array of Example 6 illustrated in FIGS. 26 and 27, and FIGS. 28 and 29, parameters of the light-emitting element 11B are as described in Table 8 below. In addition, specifications of the light-emitting element 11B of Example 6 illustrated in FIGS. 26 and 27, and FIGS. 28 and 29 are described in Table 9 and Table 10 below.

TABLE 8

|  | See FIGS. 26 and 27 | See FIGS. 28 and 29 |
|---|---|---|
| Formation pitch | 25 μm | 25 μm |
| Radius of curvature R1 | 150 μm | 150 μm |
| Height H1 | 1 μm | 1 μm |
| Diameter D1 | 20 μm | 20 μm |
| Radius of curvature R2nd | 10 μm | 10 μm |
| Radius of curvature R2 | 150 μm | 150 μm |
| Height H2 | 4 μm | 4 μm |
| Diameter D2 | 20 μm | 20 μm |
| Number of light-emitting elements | 10 × 10 | 10 × 10 |

TABLE 9

| See FIGS. 26 and 27. | |
|---|---|
| Second light reflection layer 42 | $SiO_2$/$Ta_2O_5$ (11.5 pairs) |
| Second electrode 32 | ITO (thickness: 30 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2$/$Ta_2O_5$ (14 pairs) |
| Resonator length LOR | 25 μm |
| Oscillation wavelength (light emission wavelength) λ0 | 445 nm |

TABLE 10

| See FIGS. 28 and 29. | |
|---|---|
| Second light reflection layer 42 | $SiO_2$/$Ta_2O_5$ (11.5 pairs) |
| Second electrode 32 | ITO (thickness: 30 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2$/$Ta_2O_5$ (14 pairs) |
| Resonator length LOR | 25 μm |
| Oscillation wavelength (light emission wavelength) λ0 | 445 nm |

FIGS. 30A, 30B, 31A, 31B, 32A, and 32B each illustrate a schematic partial end view of the first compound semiconductor layer and the like for describing a method of manufacturing the light-emitting element array of Example 6. It is possible for the method of manufacturing the light emitting element array of Example 6 to be substantially similar to the method of manufacturing the light emitting element array of Example 1, and detailed description thereof is therefore omitted. It is to be noted that reference numeral 84 in FIG. 30A and reference numeral 84' in FIGS. 30B and 31A represent portions of the first sacrificial layer for forming the center part 92c of the second portion 92. It is to be noted that as the size (diameter) of the first sacrificial layer decreases, the height of the first sacrificial layer having been subjected to heat treatment increases.

Even in the light-emitting element array of Example 6, it is necessary, in the case of coupling or bonding to an external circuit or the like by using the bump 35, to apply a high load (e.g., about 50 MPa) to the light-emitting element array at the time of bonding. In the light-emitting element array of Example 6, the bump 35 and the convex-shaped portion 92c in the second portion 92 of the base part surface 90 are arranged in alignment in a vertical direction. It is therefore possible to prevent, with reliability, the light-emitting element array from being damaged even if such a high load is applied.

Example 7

Example 7 is a modification of Examples 1 to 6. In Examples 1 to 6, the stacked structure 20 includes a GaN-based compound semiconductor. In contrast, in Example 7, the stacked structure 20 includes an InP-based compound semiconductor or a GaAs-based compound semiconductor. It is to be noted that in this case, for example, it is sufficient if an InP substrate or a GaAs substrate is used as the compound semiconductor substrate, but this is not limitative.

Parameters of a light-emitting element in a light emitting element array of Example 7 having a configuration or structure similar to that illustrated in FIGS. 4 and 5 (except that the stacked structure 20 includes an InP-based compound semiconductor), and specifications of the light-emitting element are as described in Table 11 below.

TABLE 11

| See FIG. 4. | |
|---|---|
| Formation pitch | 20 μm |
| Radius of curvature R1 | 43 μm |
| Height H1 | 0.7 μm |
| Diameter D1 | 19 μm |
| Radius of curvature R2nd | 60 μm |
| Radius of curvature R2 | 14 μm |
| Height H2 | 4 μm |
| Diameter D2 | 19 μm |
| Number of light-emitting elements | 25 × 25 |
| [Light-emitting element] | |
| Second light reflection layer 42 | $SiO_2$/$Ta_2O_5$ (11.5 pairs) |
| Second electrode 32 | ITO (thickness: 22 nm) |
| Second compound semiconductor layer 22 | p-InP |
| Active layer 23 | InGaAs (multi-quantum well structure), AlInGaAsP (multi-quantum well structure), or InAs quantum dot |
| First compound semiconductor layer 21 | n-InP |
| First light reflection layer 41 | $SiO_2$/$Ta_2O_5$ (14 pairs) |
| Resonator length LOR | 25 μm |
| Oscillation wavelength (light emission wavelength) λ0 | 1.6 μm |

Further, parameters of the light-emitting element in the light-emitting element array of Example 7 having a configuration or structure similar to that illustrated in FIGS. 4 and 5 (except that the stacked structure 20 includes a GaAs-based compound semiconductor) and specifications of the light-emitting element are as described in Table 12 below.

TABLE 12

| See FIG. 4. | |
|---|---|
| Formation pitch | 20 μm |
| Radius of curvature R1 | 43 μm |
| Height H1 | 0.7 μm |
| Diameter D1 | 19 μm |
| Radius of curvature R2nd | 60 μm |

TABLE 12-continued

| See FIG. 4. | |
| --- | --- |
| Radius of curvature R2 | 14 μm |
| Height H2 | 4 μm |
| Diameter D2 | 19 μm |
| Number of light-emitting elements | 25 × 25 |
| [Light-emitting element] | |
| Second light reflection layer 42 | $SiO_2/Ta_2O_5$ (11.5 pairs) |
| Second electrode 32 | ITO (thickness: 22 nm) |
| Second compound semiconductor layer 22 | p-GaAs |
| Active layer 23 | InGaAs (multi-quantum well structure), GaInNAs (multi-quantum well structure), or InAs quantum dot |
| First compound semiconductor layer 21 | n-GaAs |
| First light reflection layer 41 | $SiO_2/Ta_2O_5$ (14 pairs) |
| Resonator length LOR | 25 μm |
| Oscillation wavelength (light emission wavelength) λ0 | 0.94 μm |

Parameters of the light-emitting element in the light-emitting element array of Example 7 having a configuration or structure similar to that illustrated in FIGS. 26 and 27 (except that the stacked structure 20 includes an InP-based compound semiconductor) and specifications of the light-emitting element are as described in Table 13 below.

TABLE 13

| See FIGS. 26 and 27. | |
| --- | --- |
| Formation pitch | 20 μm |
| Radius of curvature R1 | 43 μm |
| Height H1 | 0.7 μm |
| Diameter D1 | 19 μm |
| Radius of curvature R2nd | 60 μm |
| Radius of curvature R2 | 14 μm |
| Height H2 | 4 μm |
| Diameter D2 | 19 μm |
| Number of light-emitting elements | 25 × 25 |
| [Light-emitting element] | |
| Second light reflection layer 42 | $SiO_2/Ta_2O_5$ (11.5 pairs) |
| Second electrode 32 | ITO (thickness: 30 nm) |
| Second compound semiconductor layer 22 | p-Inp |
| Active layer 23 | InGaAs (multi-quantum well structure), AlInGaAsP (multi-quantum well structure), or InAs quantum dot |
| First compound semiconductor layer 21 | n-InP |
| First light reflection layer 41 | $SiO_2/Ta_2O_5$ (14 pairs) |
| Resonator length LOR | 25 μm |
| Oscillation wavelength (light emission wavelength) λ0 | 1.6 μm |

Parameters of the light-emitting element in the light-emitting element array of Example 7 having a configuration or structure similar to that illustrated in FIGS. 26 and 27 (except that the stacked structure 20 includes a GaAs-based compound semiconductor) and specifications of the light-emitting element are as described in Table 14 below.

TABLE 14

| See FIGS. 26 and 27. | |
| --- | --- |
| Formation pitch | 20 μm |
| Radius of curvature R1 | 43 μm |
| Height H1 | 0.7 μm |
| Diameter D1 | 19 μm |
| Radius of curvature R2nd | 60 μm |
| Radius of curvature R2 | 14 μm |
| Height H2 | 4 μm |

TABLE 14-continued

| See FIGS. 26 and 27. | |
| --- | --- |
| Diameter D2 | 19 μm |
| Number of light-emitting elements | 30 × 30 |
| [Light-emitting element] | |
| Second light reflection layer 42 | $SiO_2/Ta_2O_5$ (11.5 pairs) |
| Second electrode 32 | ITO (thickness: 30 nm) |
| Second compound semiconductor layer 22 | p-GaAs |
| Active layer 23 | InGaAs (multi-quantum well structure), GaInNAs (multi-quantum well structure), or InAs quantum dot |
| First compound semiconductor layer 21 | n-GaAs |
| First light reflection layer 41 | $SiO_2/Ta_2O_5$ (14 pairs) |
| Resonator length LOR | 25 μm |
| Oscillation wavelength (light emission wavelength) λ0 | 0.94 μm |

FIG. 33 illustrates a schematic partial cross-sectional view of a modification example of the light-emitting element of Example 7 (the light-emitting element of the fifth configuration). In the modification example of the light-emitting element of Example 7, a structure in which a second substrate 52 having a first surface 52a and a second surface 52b opposed to the first surface 52a, and a first substrate 51 having a first surface 51a and a second surface 51b opposed to the first surface 51a are bonded together is provided between the first surface 21a of the first compound semiconductor layer 21 and the first light reflection layer 41. In addition, the base part surface 90 is formed in the first surface 51a of the first substrate 51. The second surface 51b of the first substrate 51 and the first surface 52a of the second substrate 52 are bonded together. The first light reflection layer 41 is formed on the first surface 51a of the first substrate 51. The stacked structure 20 is formed on the second surface 52b of the second substrate 52. Examples f the second substrate 52 may include an InP substrate and a GaAs substrate, and examples of the first substrate 51 may include a Si substrate, a SiC substrate, an AlN substrate, and a GaN substrate. The stacked structure 20 includes, for example, an InP-based compound semiconductor or a GaAs-based compound semiconductor.

In manufacturing of the modification example of a light-emitting element 10E of Example 7, the compound semiconductor substrate 12 is thinned and subjected to mirror finishing in a step similar to [Step-140] of Example 1. The compound semiconductor substrate 12 corresponds to the second substrate 52. Next, the first substrate 51 and the second substrate 52 are bonded with use of a bonding method such as surface activated bonding, dehydration condensation bonding, or thermal diffusion bonding. Next, steps similar to [Step-150] to [Step-180] of Example 1 are executed on the first surface 51a of the first substrate 51, which makes it possible to form a concavo-convex part (the first portion 91 and the second portion 92) in the first surface 51a of the first substrate 51 serving as the base part surface 90. Thereafter, it is sufficient if steps similar to [Step-190] and [Step-200] of Example 1 are executed.

Example 8

Example 8 is a modification of Examples 1 to 7. A light-emitting element of Example 8 includes, more specifically, a surface emitting laser element (vertical resonator laser, VCSEL) that emits laser light from a top surface of the first compound semiconductor layer 21 through the first light reflection layer 41.

In the light-emitting element of Example 8, as illustrated in a schematic partial cross-sectional view in FIG. 34, the second light reflection layer 42 is fixed, by a solder bonding method, onto the support substrate 49 including a silicon semiconductor substrate with the bonding layer 48 interposed therebetween. The bonding layer 48 includes a gold (Au) layer or a solder layer including tin (Sn).

Although the present disclosure has been described above on the basis of preferred Examples, the present disclosure is not limited to these Examples. The configurations and structures of the light emitting devices described in Examples are illustrative, and may be modified as appropriate. The methods of manufacturing the light emitting devices may also be modified as appropriate. In some cases, by appropriately selecting the bonding layer and the support substrate, it is possible to provide a surface emitting laser element that emits light from the top surface of the second compound semiconductor layer through the second light reflection layer. In some cases, a through hole reaching the first compound semiconductor layer may be formed in a region of each of the second compound semiconductor layer and the active layer that does not affect light emission, and a first electrode insulated from the second compound semiconductor layer and the active layer may be formed in the through hole. The first light reflection layer may extend to the second portion of the base part surface. That is, the first light reflection layer on the base part surface may include a so-called solid film. In addition, in this case, it is sufficient if a through hole is formed in the first light reflection layer extending to the second portion of the base part surface, and the first electrode coupled to the first compound semiconductor layer is formed in the through hole.

The base part surface may be configured by surfaces of the second sacrificial layer and the third sacrificial layer. In addition, in this case, it is sufficient if the first light reflection layer is formed on the second sacrificial layer above the first sacrificial layer or on a portion of the second sacrificial layer above the first sacrificial layer, and it is sufficient if the dummy concave mirror section is formed on the third sacrificial layer or on a portion of the third sacrificial layer.

In addition, [Step-160] and [Step-170] described in Example 1 may be modified as follows.

That is, in steps similar to [Step-160] and [Step-170], after the first sacrificial layer 81 is formed on the first surface 21a of the first compound semiconductor layer 21, the surface of the first sacrificial layer 81 is made into a convex shape (see FIGS. 14A and 14B). Thereafter, by etching back the first sacrificial layer 81' and further etching back the first compound semiconductor layer 21 inwardly from the first surface 21a, a convex part 91' is formed with respect to the second surface 21b of the first compound semiconductor layer 21. In this way, it is possible to obtain a structure illustrated in FIG. 35A. Thereafter, after the second sacrificial layer 82 is formed over the entire surface (see FIG. 35B), the second sacrificial layer 82 is etched back and further, the first compound semiconductor layer 21 is etched back inwardly, whereby the first convex part 91A is formed in the first portion 91 of the base part surface 90 and at least a concave part 92A is formed in the second portion 92 of the base part surface 90 (see FIG. 35C), with respect to the second surface 21b of the first compound semiconductor layer 21. In addition, the second convex part 93A is formed in the extending part 93 of the base part surface.

Alternatively, for example, it is possible to form the first sacrificial layer 81', the second sacrificial layer 82, and the third sacrificial layer 83 by a nanoimprint method. That is, a mold having a surface complementary to the base part surface 90 and the extending part 93 of the base part surface is prepared; and a sacrificial layer is formed on the base part surface on which the first light reflection layer and the dummy concave mirror section are to be formed, and the extending part of the base part surface, a shape of the surface of the mold complementary to the base part surface is transferred onto the sacrificial layer to form a concavo-convex part in the sacrificial layer. Thereafter, the sacrificial layer is etched back, and further etched back inwardly from the base part surface, which makes it possible to form a first convex part in the first portion of the base part surface, form at least a concave part in the second portion of the base part surface, and form the second convex part in the extending part of the base part surface, with respect to the second surface of the first compound semiconductor layer. Alternatively, it is also possible to form the first sacrificial layer 81', the second sacrificial layer 82, and the third sacrificial layer 83 with use of a 3D printer.

A mode may be adopted in which a wavelength conversion material layer (color conversion material layer) is provided in a light emitting region of the light-emitting element. In addition, in this case, a mode may be adopted in which white light is emitted through the wavelength conversion material layer (color conversion material layer). Specifically, in a case where light produced by the active layer is to be outputted to the outside through the first light reflection layer, it is sufficient if the wavelength conversion material layer (color conversion material layer) is formed on light output side of the first light reflection layer, or in a case where the light produced by the active layer is to be outputted to the outside through the second light reflection layer, it is sufficient if the wavelength conversion material layer (color conversion material layer) is formed on light output side of the second light reflection layer.

In a case where blue light is to be emitted from a light-emitting layer, adopting any of the following modes makes it possible for white light to be outputted through the wavelength conversion material layer.

[A] By using a wavelength conversion material layer that converts blue light emitted from the light-emitting layer into yellow light, white light with which blue and yellow are mixed is obtained as light outputted from the wavelength conversion material layer.

[B] By using a wavelength conversion material layer that converts blue light emitted from the light-emitting layer into orange light, white light with which blue and orange are mixed is obtained as light outputted from the wavelength conversion material layer.

[C] By using a wavelength conversion material layer that converts blue light emitted from the light-emitting layer into green light and a wavelength conversion material layer that converts the blue light into red light, white light with which blue, green, and red are mixed is obtained as light outputted from the wavelength conversion material layer.

Alternatively, in a case where ultraviolet rays are to be emitted from the light-emitting layer, adopting any of the following modes makes it possible for white light to be outputted through the wavelength conversion material layer.

[D] By using a wavelength conversion material layer that converts ultraviolet light emitted from the light-emitting layer into blue light and a wavelength conversion material layer that converts the ultraviolet light into yellow light, white light with which blue and yellow are mixed is obtained as light outputted from the wavelength conversion material layer.

[E] By using a wavelength conversion material layer that converts ultraviolet light emitted from the light-emitting layer into blue light and a wavelength conversion material layer that converts the ultraviolet light into orange light, white light with which blue and orange are mixed is obtained as light outputted from the wavelength conversion material layer.

[F] By using a wavelength conversion material layer that converts ultraviolet light emitted from the light-emitting layer into blue light, a wavelength conversion material layer that converts the ultraviolet light into green light, and a wavelength conversion material layer that converts the ultraviolet light into red light, white light with which blue, green, and red are mixed is obtained as light outputted from the wavelength conversion material layer.

Here, specific examples of a wavelength conversion material that is excited by blue light and outputs red light may include a red light-emitting phosphor particle, more specifically, (ME:Eu)S [where "ME" represents at least one kind of atom selected from a group including Ca, Sr, and Ba, and the same applies hereinafter], $(M:Sm)_x(Si,Al)_{12}(O,N)_{16}$ [where "M" represents at least one kind of atom selected from a group including Li, Mg, and Ca, and the same applies hereinafter], $ME_2Si_5N_8$:Eu, (Ca:Eu)SiN$_2$, and (Ca:Eu)AlSiN$_3$. Further, specific examples of a wavelength conversion material that is excited by blue light and outputs green light may include a green light-emitting phosphor particle, more specifically, $(ME:Eu)Ga_2S_4$, $(M:RE)_x(Si,Al)_{12}(O,N)_{16}$ [where "RE" represents Tb and Yb], $(M:Tb)_x(Si,Al)_{12}(O,N)_{16}$, $(M:Yb)_x(Si,Al)_{12}(O,N)_{16}$, and $Si_{6-Z}Al_ZO_ZN_{8-Z}$:Eu. Further, specific examples of a wavelength conversion material that is excited by blue light and outputs yellow light may include a yellow light-emitting phosphor particle, more specifically, a YAG (yttrium-aluminum-garnet)-based phosphor particle. It is to be noted that a single kind of wavelength conversion material may be used, or two or more kinds of wavelength conversion materials may be used as a mixture. Furthermore, by using two or more kinds of wavelength conversion materials as a mixture, it is possible to achieve a configuration in which emission light of a color other than yellow, green, and red is to be outputted from a wavelength conversion material mixture product. Specifically, for example, a configuration in which a cyan color is to be outputted may be adopted, and in this case, it is sufficient if the green light-emitting phosphor particle (e.g., LaPO$_4$:Ce,Tb, $BaMgAl_{10}O_{17}$:Eu,Mn, $Zn_2SiO_4$:Mn, $MgAl_1O_{19}$:Ce,Tb, $Y_2SiO_5$:Ce,Tb, or $MgAl_{11}O_{19}$:CE,Tb,Mn) and the blue light-emitting phosphor particle (e.g., $BaMgAl_{10}O_{17}$:Eu, $BaMg_2Al_{16}O_{27}$:Eu, $Sr_2P_2O_7$:Eu, $Sr_5(PO_4)_3$Cl:Eu, $(Sr,Ca,Ba,Mg)_5(PO_4)_3$Cl:Eu, CaWO$_4$, or CaWO$_4$:Pb) are used as a mixture.

Further, specific examples of a wavelength conversion material that is excited by ultraviolet rays and outputs red light may include a red light-emitting phosphor particle, more specifically, $Y_2O_3$:Eu, YVO$_4$:Eu, $Y(P,V)O_4$:Eu, 3.5MgO·0.5MgF$_2$·Ge2:Mn, CaSiO$_3$:Pb,Mn, $Mg_6AO_{11}$:Mn, $(Sr,Mg)_3(PO_4)_3$:Sn, $La_2O_2S$:Eu, and $Y_2O_2S$:Eu. In addition, specific examples of a wavelength conversion material that is excited by ultraviolet rays and outputs green light may include a green light emitting phosphor particle, more specifically, LaPO$_4$:Ce,Tb, $BaMgAl_{10}O_{17}$:Eu,Mn, $Zn_2SiO_4$:Mn, $MgAl_{11}O_{19}$:Ce,Tb, $Y_2SiO_5$:Ce,Tb, $MgAl_{11}O_{19}$:CE,Tb,Mn, and $Si_{6-Z}Al_ZO_ZN_{8-Z}$:Eu. Further, specific examples of a wavelength conversion material that is excited by ultraviolet rays and outputs blue light may include a blue light-emitting phosphor particle, more specifically, $BaMgAl_{10}O_{17}$:Eu, $BaMg_2Al_{16}O_{27}$:Eu, $Sr_2P_2O_7$:Eu, $Sr_5(PO_4)_3$Cl:Eu, $(Sr,Ca,Ba,Mg)_5(PO_4)_3$Cl:Eu, CaWO$_4$, and CaWO$_4$:Pb. Further, specific examples of a wavelength conversion material that is excited by ultraviolet rays and outputs yellow light may include a yellow light-emitting phosphor particle, more specifically, a YAG-based phosphor particle. It is to be noted that a single kind of wavelength conversion material may be used, or two or more kinds of wavelength conversion materials may be used as a mixture. Further, by using two or more kinds of wavelength conversion materials as a mixture, it is possible to achieve a configuration in which emission light of a color other than yellow, green, and red is to be outputted from a wavelength conversion material mixture product. Specifically, a configuration in which a cyan color is to be outputted may be adopted, and in this case, it is sufficient if the green light-emitting phosphor particle and the blue light-emitting phosphor particle described above are used as a mixture.

However, the wavelength conversion material (color conversion material) is not limited to the phosphor particles. Other examples of the wavelength conversion material may include a light-emitting particle of an indirect transition-type silicon-based material having a quantum well structure, such as a two-dimensional quantum well structure, a one-dimensional quantum well structure (quantum wire), or a zero-dimensional quantum well structure (quantum dot), in which a carrier wave function is localized in order to cause carriers to be efficiently converted into light as in a direct transition-type material, thus utilizing a quantum effect. It has also been known that rare earth atoms added to a semiconductor material sharply emit light by means of an intra-shell transition, and a light-emitting particle to which such a technique is applied is also usable.

As described above, examples of the wavelength conversion material may include a quantum dot. As the size (diameter) of the quantum dot becomes smaller, the band gap energy becomes higher, and the wavelength of light emitted from the quantum dot becomes shorter. That is, as the size of the quantum dot is smaller, light having a shorter wavelength (light on blue light side) is emitted, and as the size of the quantum dot is larger, light having a longer wavelength (light on red light side) is emitted. Therefore, fixing the material of a quantum dot and adjusting the size of the quantum dot makes it possible to obtain a quantum dot that emits or absorbs light having a desired wavelength (performing color conversion into a desired color). Specifically, the quantum dot preferably has a core-shell structure. Examples of the material of the quantum dot may include, but are not limited to: Si; Se; chalcopyrite-based compounds including CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$; perovskite-based materials; group III-V compounds including GaAs, GaP, InP, InAs, InGaAs, AlGaAs, InGaP, AlGaInP, InGaAsP, and GaN; CdSe, CdSeS, CdS, CdTe, In$_2$Se$_3$, In$_2$S$_3$, Bi$_2$Se$_3$, Bi$_2$S$_3$, ZnSe, ZnTe, ZnS, HgTe, HgS, PbSe, PbS, TiO$_2$, and the like.

It is to be noted that the present disclosure may also have the following configurations.

[A01]<<Light-Emitting Device: First Mode>>

A light-emitting device including:

a light-emitting element array including a plurality of light-emitting elements arranged; and a dummy concave mirror section surrounding the light-emitting element array, the light-emitting element each including a stacked structure including a stack of a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, a first light reflection layer formed on a base part surface located on side of the first surface of the first compound semiconductor layer, and a second light reflection layer formed on side of the second surface of the second compound semiconductor layer and having a flat shape, in which a first convex part is formed in a portion of the base part surface in which the first light reflection layer functioning as a concave mirror is formed, with respect to the second surface of the first compound semiconductor layer, and a second convex part is formed in a portion of an extending part of the base part surface in which the dummy concave mirror section is formed, with respect to the second surface of the first compound semiconductor layer.

[A02]

The light-emitting device according to [A01], in which the plurality of light-emitting elements is driven simultaneously under a same driving condition.

[A03]

The light-emitting device according to [A01] or [A02], in which at least the active layer and the second compound semiconductor layer are not provided in a region provided with the dummy concave mirror section.

[A04]

The light-emitting device according to any one of [A01] to [A03], in which H1<H2 is satisfied, where H1 is a height of the first convex part provided in the base part surface, and H2 is a height of the second convex part provided in the extending part of the base part surface.

[A05]

The light-emitting device according to [A04], in which 1.1≤H2/H1 is satisfied.

[A06]

The light-emitting device according to any one of [A01] to [A03], in which the plurality of light-emitting elements is arranged in a two-dimensional matrix pattern in a first direction and a second direction different from the first direction, and H2-A>H2-C>H1 is satisfied, where end parts of the base part surface extending in parallel to the second direction are referred to as a first end part and a third end part, end parts of the base part surface extending in parallel to the first direction are referred to as a second end part and a fourth end part, H1 is a height of the first convex part provided in the base part surface, H2-A is a height of the second convex part provided in an extending part of the base part surface extending from the first end part, and H2-C is a height of the second convex part provided in an extending part of the base part surface extending from the third end part.

[A07]

The light-emitting device according to [A06], in which values of H2-B and H2-D are decreased from the first end part toward the third end part, where H2-B is a height of the second convex part provided in an extending part of the base part surface extending from the second end part, and H2-D is a height of the second convex part provided in an extending part of the base part surface extending from the fourth end part.

[A08]

The light-emitting device according to any one of [A01] to [A03], in which the plurality of light-emitting elements is arranged in a two-dimensional matrix pattern in a first direction and a second direction different from the first direction, and H2-A>H1>H2-C is satisfied, where end parts of the base part surface extending in parallel to the second direction are referred to as a first end part and a third end part, end parts of the base part surface extending in parallel to the first direction are referred to as a second end part and a fourth end part, H1 is a height of the first convex part provided in the base part surface, H2-A is a height of the second convex part provided in an extending part of the base part surface extending from the first end part, and H2-C is a height of the second convex part provided in an extending part of the base part surface extending from the third end part.

[A09]

The light-emitting device according to [A08], in which values of H2-B and H2-D are decreased from the first end part toward the third end part, where H2-B is a height of the second convex part provided in an extending part of the base part surface extending from the second end part, and H2-D is a height of the second convex part provided in an extending part of the base part surface extending from the fourth end part.

[A10]

The light-emitting device according to any one of [A01] to [A03], in which H2<H1 is satisfied, where H1 is a height of the first convex part provided in the base part surface and H2 is a height of the second convex part provided in the extending part of the base part surface.

[A11]

The light-emitting device according to [A10], in which H2/H1≤0.9 is satisfied.

[A12]

The light-emitting device according to any one of [A01] to [A11], in which a center part of the first convex part provided in the base part surface is located on a vertex of a square lattice.

[A13]

The light-emitting device according to any one of [A01] to [A11], in which a center part of the first convex part provided in the base part surface is located on a vertex of an equilateral triangular lattice.

[A14]

The light-emitting device according to any one of [A01] to [A13], in which a concave part is formed in a portion of the base part surface in which the first light reflection layer of the light-emitting element is not formed, with respect to the second surface of the first compound semiconductor layer.

[A15]

The light-emitting device according to [A14], in which a concave part is formed from a portion of the p base part surface in which the first light reflection layer of the light-emitting element located in an outermost peripheral part of the light-emitting element array is formed to a portion of an extending part of the base part surface extending from that portion, with respect to the second surface of the first compound semiconductor layer.

[A16]

The light-emitting device according to any one of [A01] to [A13], in which the first convex part is surrounded by a second portion of the base part surface, and the second portion has a downwardly convex shape, and an upwardly convex shape extending from the downwardly convex shape, toward a center part of the second portion, with respect to the second surface of the first compound semiconductor layer.

[A17]

The light-emitting device according to [A16], in which $L2nd > L1st$ is satisfied, where List is a distance from the second surface of the first compound semiconductor layer to a center part of the first convex part provided in the base part surface, and L2nd is a distance from the second surface of the first compound semiconductor layer to the center part of the second portion of the base part surface.

[A18]

The light-emitting device according to [A16] or [A17], in which $R1 > R2nd$ is satisfied, where R1 is a radius of curvature of a center part of the first convex part provided in the base part surface (i.e., a radius of curvature of the first light reflection layer), and R2nd is a radius of curvature of the center part of the second portion of the base part surface.

[A19]

The light-emitting device according to any one of [A16] to [A18], in which a radius of curvature R2nd of the center part of the second portion of the base part surface is greater than or equal to $1 \times 10^{-6}$ m, preferably greater than or equal to $3 \times 10^{-6}$ m, and more preferably greater than or equal to $5 \times 10^{-6}$ m.

[A20]

The light-emitting device according to any one of [A16] to [A19], in which a bump is provided in a portion on side of the second surface of the second compound semiconductor layer opposed to a convex-shaped portion in the second portion of the base part surface.

[A21]

The light-emitting device according to any one of [A01] to [A15], in which a bump is provided in a portion on the side of the second surface of the second compound semiconductor layer opposed to a center part of the first convex part provided in the base part surface.

[A22]

The light-emitting device according to any one of [A14] to [A21], in which the base part surface is smooth.

[A23]

The light-emitting device according to any one of [A01] to [A22], in which a formation pitch of the light-emitting elements is greater than or equal to 3 μm and smaller than or equal to 50 μm, preferably greater than or equal to 5 μm and smaller than or equal to 30 μm, and more preferably greater than or equal to 8 μm and smaller than or equal to 25 μm.

[A24]

The light-emitting device according to any one of [A01] to [A23], in which a radius of curvature R1 of a center part of the first convex part provided in the base part surface (i.e., a radius of curvature of the first light reflection layer) is greater than or equal to $1 \times 10^{-5}$ m, and preferably greater than or equal to $3 \times 10^{-5}$ m.

[A25]

The light-emitting device according to any one of [A01] to [A24], in which the stacked structure includes at least one kind of material selected from a group including a GaN-based compound semiconductor, an InP-based compound semiconductor, and a GaAs-based compound semiconductor.

[A26]

The light-emitting device according to any one of [A01] to [A25], in which $1 \times 10^{-5}$ m LOR is satisfied, where LOR is a resonator length of the light-emitting element.

[A27]

The light-emitting device according to any one of [A01] to [A26], in which a figure drawn by the first convex part provided in the base part surface when the base part surface is cut along a virtual plane including a stacking direction of the stacked structure is a part of a circle or a part of a parabola.

[A28] <<Light-Emitting Device of Second Configuration>>

The light-emitting device according to any one of [A01] to [A27], in which the first surface of the first compound semiconductor layer configures the base part surface.

[A29] <<Light-Emitting Device of Third Configuration>>

The light-emitting device according to any one of [A01] to [A27], in which a compound semiconductor substrate is provided between the first surface of the first compound semiconductor layer and the first light reflection layer, and the base part surface is configured by a surface of the compound semiconductor substrate.

[A30] <<Light-Emitting Device of Fourth Configuration>>

The light-emitting device according to any one of [A01] to [A27], in which a base is provided between the first surface of the first compound semiconductor layer and the first light reflection layer, or a compound semiconductor substrate and the base are provided between the first surface of the first compound semiconductor layer and the first light reflection layer, and the base part surface is configured by a surface of the base.

[A31]

The light-emitting device according to [A30], in which a material included in the base includes at least one kind of material selected from a group including transparent dielectric materials such as $TiO_2$, $Ta_2O_5$, and $SiO_2$, a silicone-based resin, and an epoxy-based resin.

[A32]

The light-emitting device according to any one of [A01] to [A31], in which a value of a thermal conductivity of the stacked structure is higher than a value of a thermal conductivity of the first light reflection layer.

[A33] <<Light-emitting Element of Fifth Configuration>>

A semiconductor laser element according to any one of [A01] to [A27], in which a structure in which a second substrate having a first surface and a second surface opposed to the first surface and a first substrate having a first surface and a second surface opposed to the first surface are bonded together is provided between the first surface of the first compound semiconductor layer and the first light reflection layer, and the base part surface is configured by the first surface of the first substrate.

[A34]

The semiconductor laser element according to [A33], in which the second surface of the first substrate and the first surface of the second substrate are bonded together, the first light reflection layer is formed on the first surface of the first substrate, and the stacked structure is formed on the second surface of the second substrate.

[A35]

The semiconductor laser element according to [A33] or [A34], in which the first substrate includes a Si substrate, a SiC substrate, an AlN substrate, or a GaN substrate, and the second substrate includes an InP substrate or a GaAs substrate

[B01] <<Light-Emitting Device: Second Mode>>

A light-emitting device including:

a light-emitting element array including a plurality of light-emitting elements arranged; and a dummy light-emitting element surrounding the light-emitting element array, the light-emitting elements and the dummy light-emitting element each including a stacked structure including a stack of a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, the light-emitting elements each further including a first light reflection layer formed on a base part surface located on side of the first surface of the first compound semiconductor layer, and a second light reflection layer formed on side of the second surface of the second compound semiconductor layer and having a flat shape, a first convex part being formed in a portion of the base part surface in which the first light reflection layer functioning as a concave mirror is formed, with respect to the second surface of the first compound semiconductor layer, the dummy light-emitting element further including a dummy first light reflection layer including a dummy concave mirror section formed on an extending part of the base part surface located on side of the first surface of the first compound semiconductor layer, and a second light reflection layer formed on side of the second surface of the second compound semiconductor layer and having a flat shape, a second convex part being formed in a portion of the extending part of the base part surface in which the dummy first light reflection layer is formed, with respect to the second surface of the first compound semiconductor layer, and the dummy light-emitting element not emitting light even though a current flows through the stacked structure.

[B02]

The light-emitting device according to [B01], in which in the dummy light-emitting element, a value of a radius of curvature of a center part of the second convex part provided in the extending part of the base part surface is less than a value of a resonator length.

[B03]

The light-emitting device according to [B01] or [B02], in which the plurality of light-emitting elements and the dummy light-emitting element are driven simultaneously under a same driving condition.

[C01] <<Method of Manufacturing Light-Emitting Element Array: First Mode>>

A method of manufacturing a light-emitting element array including a plurality of light-emitting elements, the light-emitting elements each including a stacked structure including a stack of a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, a first light reflection layer formed on a base part surface located on side of the first surface of the first compound semiconductor layer, and a second light reflection layer formed on side of the second surface of the second compound semiconductor layer and having a flat shape, the base part surface having a concavo-convex shape and being differentiable, the method including steps of:

forming, after forming the stacked structure, the second light reflection layer on side of the second surface of the second compound semiconductor layer; subsequently, forming a first sacrificial layer on a region of the base part surface on which the first light reflection layer is to be formed, and thereafter, making a surface of the first sacrificial layer into a convex shape; thereafter, forming a second sacrificial layer on a second portion of the base part surface exposed between the first sacrificial layer and the first sacrificial layer and on the first sacrificial layers to make a surface of the second sacrificial layer into a concavo-convex shape; subsequently, etching back the second sacrificial layer and the first sacrificial layers and further etching back inwardly from the base part surface, and thereby forming a convex part in the base part surface and forming at least a concave part in a portion surrounding the convex part of the base part surface, with respect to the second surface of the first compound semiconductor layer; and thereafter forming the first light reflection layer on a first convex part provided in the base part surface.

[C02] <<Method of Manufacturing Light-Emitting Element Array: Second Mode>>

A method of manufacturing a light-emitting element array including a plurality of light-emitting elements, the light-emitting elements each including a stacked structure including a stack of a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, a first light reflection layer formed on a base part surface located on side of the first surface of the first compound semiconductor layer, and a second light reflection layer formed on side of the second surface of the second compound semiconductor layer and having a flat shape, the base part surface having a concavo-convex shape and being differentiable, the method including steps of:

forming, after forming the stacked structure, the second light reflection layer on side of the second surface of the second compound semiconductor layer; subsequently,

forming a first sacrificial layer on a region of the base part surface on which the first light reflection layer is to be formed, and thereafter, making a surface of the first sacrificial layer into a convex shape; thereafter, etching back the first sacrificial layer and further etching back inwardly from the base part surface, and thereby forming a convex part in the base part surface, with respect to the second surface of the first compound semiconductor layer; subsequently forming a second sacrificial layer on the base part surface, and thereafter etching back the second sacrificial layer and further etching back inwardly from the base part surface, and thereby forming a convex part in the base part surface and forming at least a concave part in a portion surrounding the convex part of the base part surface, with respect to the second surface of the first compound semiconductor layer; and thereafter forming the first light reflection layer on a first convex part provided in the base part surface.

[C03] <<Method of Manufacturing Light-Emitting Element Array: Nanoimprint Method>>

A method of manufacturing a light-emitting element array including a plurality of light-emitting elements, the light-emitting elements each including a stacked structure including a stack of a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, a first light reflection layer formed on a base part surface located on side of the first surface of the first compound semiconductor layer, and a second light reflection layer formed on side of the second surface of the second compound semiconductor layer and having a flat shape, the base part surface having a concavo-convex shape and being differentiable, the method including steps of:

preparing a mold having a surface complementary to the base part surface;

forming, after forming the stacked structure, the second light reflection layer on side of the second surface of the second compound semiconductor layer; subsequently, transferring, after forming a sacrificial layer on the base part surface on which the first light reflection layer is to be formed, a shape of the surface of the mold complementary to the base part surface onto the sacrificial layer to form a concavo-convex part in the sacrificial layer; thereafter, etching back the sacrificial layer and further etching back inwardly from the base part surface, and thereby forming a convex part in the base part surface and forming at least a concave part in a portion surrounding the convex part of the base part surface, with respect to the second surface of the first compound semiconductor layer; and thereafter forming the first light reflection layer on a first convex part provided in the base part surface.

This application claims the benefit of Japanese Priority Patent Application JP2020-109749 filed with Japan Patent Office on Jun. 25, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-emitting device, comprising:

a light-emitting element array including a plurality of light-emitting elements;

a dummy concave mirror section that surrounds the light-emitting element array, wherein each light-emitting element of the plurality of light-emitting elements includes:

a stacked structure including a stack of a first compound semiconductor layer, an active layer, and a second compound semiconductor layer, wherein the first compound semiconductor layer has a first surface and a second surface, the second surface is opposed to the first surface, the active layer faces the second surface of the first compound semiconductor layer, and the second compound semiconductor layer has a first surface that faces the active layer, and a second surface opposed to the first surface of the second compound semiconductor layer, a first light reflection layer on a base part surface, wherein the base part surface is on a side of the first surface of the first compound semiconductor layer, and a second light reflection layer on a side of the second surface of the second compound semiconductor layer, wherein the second light reflection layer has a flat shape;

a first convex part in a first portion of the base part surface with respect to the second surface of the first compound semiconductor layer, wherein the first light reflection layer, which functions as a concave mirror, is in the first portion of the base part surface;

a second convex part in a portion of a first extending part of the base part surface with respect to the second surface of the first compound semiconductor layer, wherein the dummy concave mirror section is in the portion of the first extending part of the base part surface; and a first concave part in a second portion of the base part surface with respect to the second surface of the first compound semiconductor layer, wherein the second portion of the base part surface excludes the first light reflection layer.

2. The light-emitting device according to claim 1, wherein the plurality of light-emitting elements is configured to be driven simultaneously under a same driving condition.

3. The light-emitting device according to claim 1, wherein the dummy concave mirror section is in a region that excludes the active layer and the second compound semiconductor layer.

4. The light-emitting device according to claim 1, wherein H1<H2 is satisfied, where H1 is a height of the first convex part that is in the first portion of the base part surface, and H2 is a height of the second convex part that is in the portion of the first extending part of the base part surface.

5. The light-emitting device according to claim 4, wherein 1.1≤H2/H1 is satisfied.

6. The light-emitting device according to claim 1, wherein the plurality of light-emitting elements is in a two-dimensional matrix pattern in a first direction and a second direction, the second direction is different from the first direction,
the base part surface includes:

a first end part and a third end part that extend in parallel to the second direction, and a second end part and a fourth end part that extend in parallel to the first direction, H2-A >H2-C >H1 is satisfied, where H1 is a height of the first convex part that is in the first portion of the base part surface, H2-A is a height of the second convex part that is in a second extending part of the base part surface, and H2-C is a height of the second convex part that is in a third extending part of the base part surface, the second extending part extends from the first end part, and the third extending part extends from the third end part.

7. The light-emitting device according to claim 6, wherein values of H2-B and H2-D decrease from the first end part toward the third end part, where H2-B is a height of the second convex part that is in a fourth extending part of the base part surface, and H2-D is a height of the second convex part that is in a fifth extending part of the base part surface, the fourth extending part extends from the second end part, and the fifth extending part extends from the fourth end part.

8. The light-emitting device according to claim 1, wherein the plurality of light-emitting elements is in a two-dimensional matrix pattern in a first direction and a second direction, the second direction is different from the first direction,
the base part surface includes:

a first end part and a third end part that extend in parallel to the second direction, and a second end part and a fourth end part that extend in parallel to the first direction, H2-A >H1>H2-C is satisfied, where H1 is a height of the first convex part that is in the first portion of the base part surface, H2-A is a height of the second convex part that is in a second extending part of the base part surface, and H2-C is a height of the second convex part that is in a third extending part of the base part surface, the second extending part extends from the first end part, and the third extending part extends from the third end part.

9. The light-emitting device according to claim 8, wherein values of H2-B and H2-D decrease from the first end part toward the third end part, where H2-B is a height of the second convex part that is in a fourth extending part of the base part surface, and H2-D is a height of the second convex part that is in a fifth extending part of the base part surface, the fourth extending part extends from the second end part, and the fifth extending part extends from the fourth end part.

10. The light-emitting device according to claim 1, wherein H2<H1 is satisfied, where H1 is a height of the first convex part that is in the first portion of the base part surface, and H2 is a height of the second convex part that is in the portion of the first extending part of the base part surface.

11. The light-emitting device according to claim 10, wherein H2/H1≤0.9 is satisfied.

12. The light-emitting device according to claim 1, further comprising a second concave part, wherein the first light reflection layer, which is in an outermost peripheral part of the light-emitting element array, is in a third portion of the base part surface, formation of the second concave part is from the third portion of the base part surface to the portion of the first extending part of the base part surface with respect to the second surface of the first compound semiconductor layer, and the first extending part extends from the third portion.

13. A light-emitting device, comprising:

a light-emitting element array including a plurality of light-emitting elements; and a dummy light-emitting element that surrounds the light-emitting element array, wherein the dummy light-emitting element and each light-emitting element of the plurality of light-emitting elements include a stacked structure including a stack of a first compound semiconductor layer, an active layer, and a second compound semiconductor layer, the first compound semiconductor layer has a first surface and a second surface, the second surface is opposed to the first surface, the active layer faces the second surface of the first compound semiconductor layer, the second compound semiconductor layer has a first surface that faces the active layer, and a second surface opposed to the first surface of the second compound semiconductor layer, each light-emitting element of the plurality of light-emitting elements further includes:

a first light reflection layer on a base part surface, wherein the base part surface is on a side of the first surface of the first compound semiconductor layer, and the first light reflection layer, which functions as a concave mirror, is in a portion of the base part surface, a second light reflection layer on a side of the second surface of the second compound semiconductor layer, wherein the second light reflection layer has a flat shape, and a first convex part in the portion of the base part surface with respect to the second surface of the first compound semiconductor layer, the dummy light-emitting element further includes:

a dummy first light reflection layer, including a dummy concave mirror section, on an extending part of the base part surface, wherein the extending part of the base part surface is on the side of the first surface of the first compound semiconductor layer, and the dummy first light reflection layer is in a portion of the extending part, the second light reflection layer, and a second convex part in the portion of the extending part of the base part surface with respect to the second surface of the first compound semiconductor layer, the dummy light-emitting element excludes a function of emission of light even though a current flows through the stacked structure, and in the dummy light-emitting element, a value of a radius of curvature of a center part of the second convex part is less than a value of a resonator length of the dummy light-emitting element.

14. The light-emitting device according to claim 13, wherein the plurality of light-emitting elements and the dummy light-emitting element are driven simultaneously under a same driving condition.

15. A light-emitting device, comprising:

a light-emitting element array that includes a plurality of light-emitting elements;

a dummy concave mirror section that surrounds the light-emitting element array, wherein each light-emitting element of the plurality of light-emitting elements includes:

a stacked structure including a stack of a first compound semiconductor layer, an active layer, and a second compound semiconductor layer, wherein the first compound semiconductor layer has a first surface and a second surface, the second surface is opposed to the first surface, the active layer faces the second surface of the first compound semiconductor layer, and the second compound semiconductor layer has a first surface that faces the active layer, and a second surface opposed to the first surface of the second compound semiconductor layer;

a first light reflection layer on a base part surface, wherein the base part surface is on a side of the first surface of the first compound semiconductor layer; and a second light reflection layer on a side of the second surface of the second compound semiconductor layer, wherein the second light reflection layer has a flat shape;

a first convex part in a portion of the base part surface with respect to the second surface of the first compound semiconductor layer, wherein the first light reflection layer, which functions as a concave mirror, is in the portion of the base part surface; and a second convex part in a portion of an extending part of the base part surface with respect to the second surface of the first compound semiconductor layer, wherein the dummy concave mirror section is in the portion of the extending part of the base part surface, and H1<H2 is satisfied, where H1 is a height of the first convex part, and H2 is a height of the second convex part.

\* \* \* \* \*